(12) United States Patent
Ono et al.

(10) Patent No.: US 6,455,880 B1
(45) Date of Patent: Sep. 24, 2002

(54) MICROWAVE SEMICONDUCTOR DEVICE HAVING COPLANAR WAVEGUIDE AND MICRO-STRIP LINE

(75) Inventors: Naoko Ono; Yuji Iseki; Keiichi Yamaguchi; Junko Onomura; Eiji Takagi, all of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/434,475

(22) Filed: Nov. 5, 1999

(30) Foreign Application Priority Data

Nov. 6, 1998 (JP) .......................................... 10-316586
Dec. 7, 1998 (JP) .......................................... 10-347433

(51) Int. Cl.$^7$ ...................... H01L 27/06; H01L 29/778; H01L 29/812
(52) U.S. Cl. ....................................... 257/275; 257/280
(58) Field of Search .......................................... 257/275

(56) References Cited

U.S. PATENT DOCUMENTS 5,898,200 A * 4/1999 Sugiyama et al. .......... 257/330

OTHER PUBLICATIONS

Naoko Ono, et al., "60–GHz–Band Monolithic HEMT Amplifiers Using BCB Thin Film Layers on GaAs Substrates", IEICE Trans. Electron, vol. E82–C, No. 7, Jul. 1999, pp. 1073–1079.

Naoko Ono, et al., "60–GHz–Band Monolithic HEMT Amplifiers Using BCB Thin Film Layers on GaAs Substrates", ASAI–Pacific Microwave Conference, vol. 2, Dec. 8–11, 1998, pp. 567–570.

Naoko Ono, et al., "V–band Monolithic HEMT Amplifiers Using BCB Thin Film Layers on GaAs Substrates", The Institute of Electronics, Information and Communication Engineers, Technical Report of IEICE, ED98–212, MW98–175, ICD98–279, Jan. 1999, pp. 99–104.

* cited by examiner

Primary Examiner—Gene M. Munson
(74) Attorney, Agent, or Firm—Oblon, Spivak, McClelland, Maier & Neustadt, P.C.

(57) ABSTRACT

A high frequency semiconductor device has a semiconductor substrate such as the semi-insulating GaAs; a first metal layer disposed above the semiconductor substrate; a first dielectric thin film disposed on the first metal layer; and a second metal layer having a second metal strip disposed on the first dielectric thin film. Here, the first metal layer has a first metal strip, first and second ground metal plates sandwiching the first metal strip. And the first dielectric thin film is not disposed uniformly on the surface of the first ground metal plate so that the dielectric structure on the first metal strip differs from the dielectric structure under the second metal strip. The CPW is constituted by the first metal strip, the first and second ground metal plates, and the TFMSL is constituted by the second metal strip and the first ground metal plate. By employing the structure such that there is no dielectric thin film on the CPW portion, or that the thickness of the dielectric thin film on the CPW portion is configured to be less than the thickness of the dielectric thin film associated with the TFMSL portion, the effective dielectric constant $\in_{eff}$ of the CPW portion is made lower than that of the conventional CPW, which employs a uniform and homogenous dielectric structure so that the CPW portion has the same thickness of the TFMSL portion. As the result, the adjustable range of the characteristic impedance $Z_0$ of the high frequency transmission line, merged in the high frequency semiconductor integrated circuit, increases. Then the high-performance integrated circuits such as MMICs having the low transmission loss, the low crosstalk can be achieved.

19 Claims, 39 Drawing Sheets

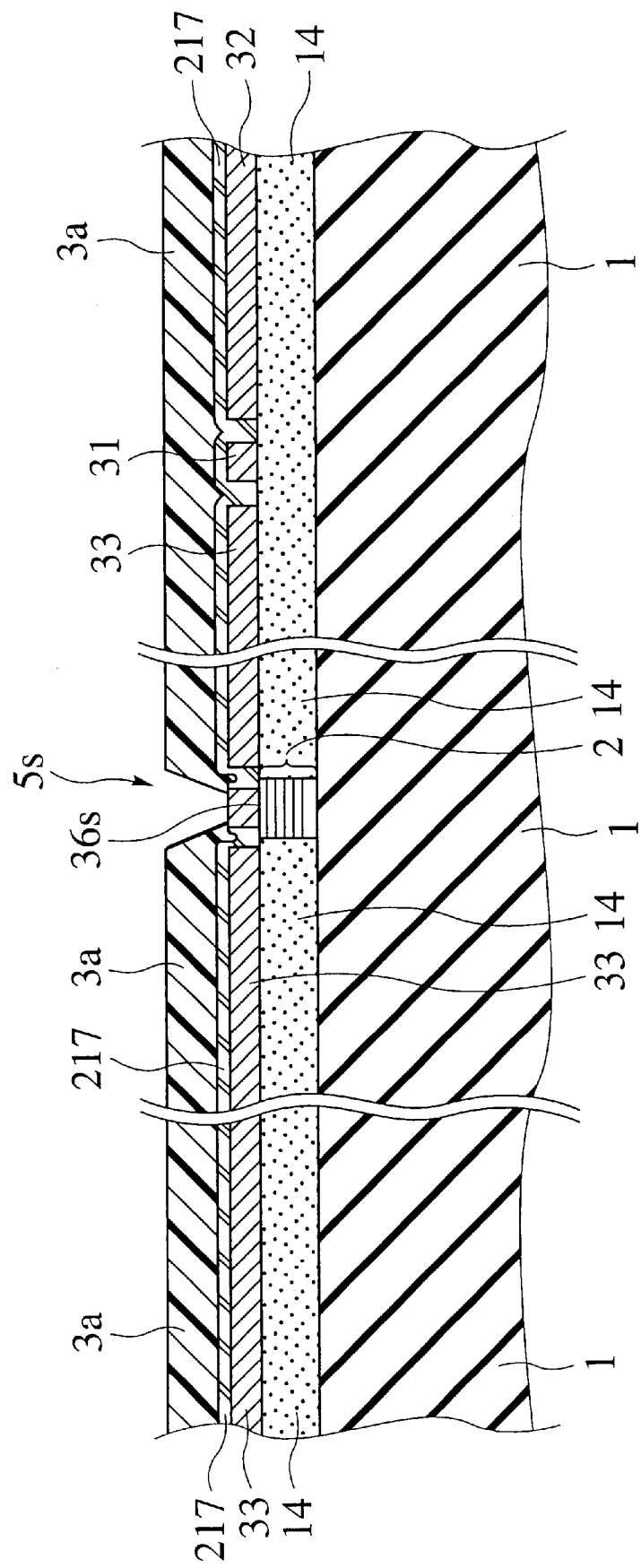

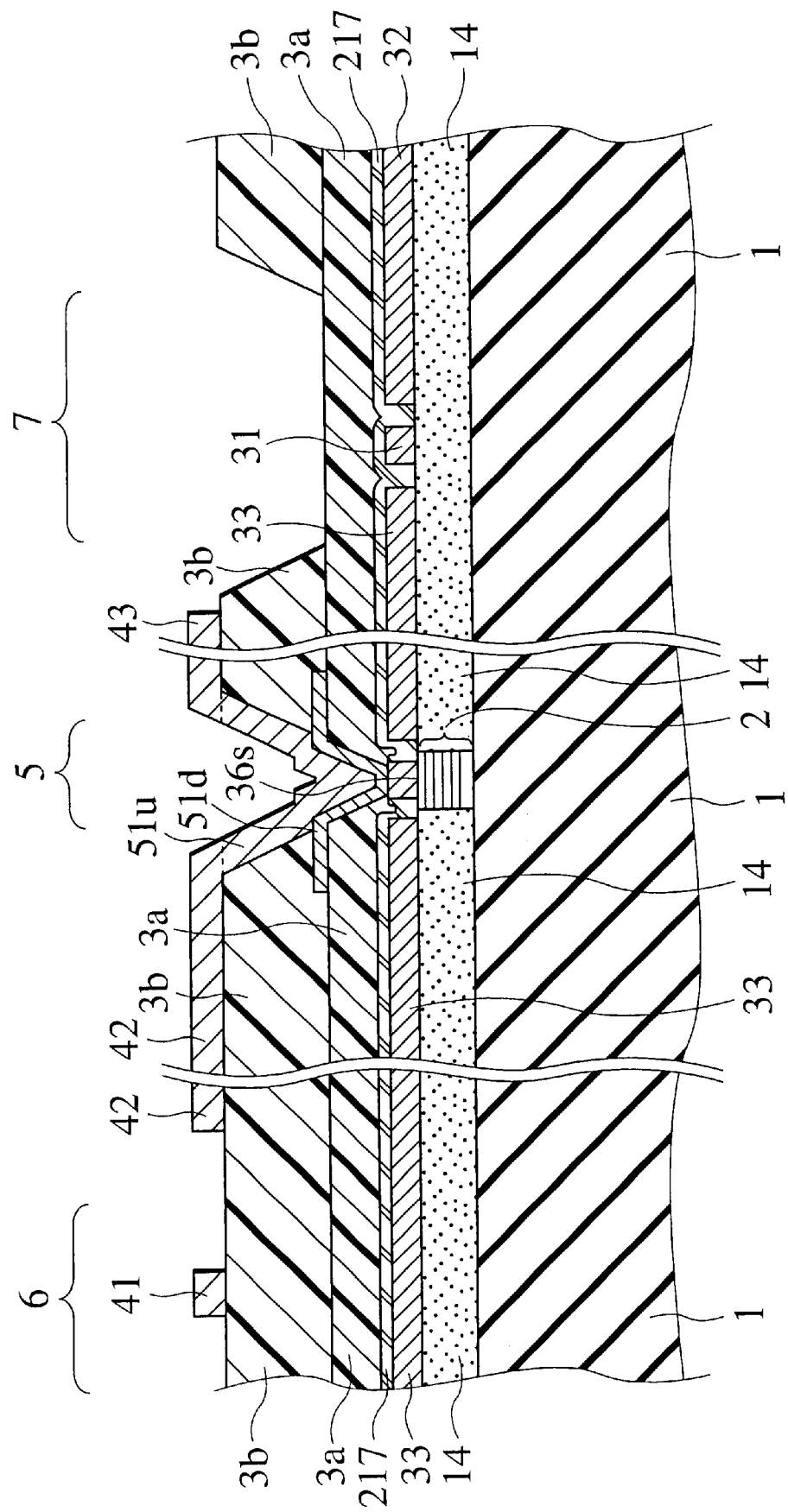

MICROWAVE SEMICONDUCTOR DEVICE HAVING COPLANAR WAVEGUIDE AND MICRO-STRIP LINE

BACKGROUND OF THE INVENTION

1. Field of the Invention

The invention is related to a semiconductor device having a dielectric thin film for a high frequency transmission line on the surface of a semiconductor substrate. And especially, the invention pertains to the high frequency semiconductor devices operating in microwave or millimeter wave bands, and to high frequency semiconductor integrated circuits such as Microwave Monolithic Integrated Circuits (MMICs).

2. Description of the Related Art

By the rapid increase of demands for the recent information communication fields, it becomes urgent to increase the communication channel number. Therefore, the practical communication systems using the microwave or millimeter waves, which have not been so widely used up to now, are required to be exploited rapidly. RF part of the high frequency communication instrument is generally composed of an oscillator, a synthesizer, a modulator, a power amplifier, a low-noise amplifier, a demodulator and an antenna, etc. In the radio communication instrument, the excellent electrical characteristics and the miniaturized package size are desired. For integrating the necessary circuits in one semiconductor chip, the configuration of the MMIC is desirable, when the miniaturization of the chip size of the high frequency semiconductor integrated circuit is considered. With the development of the semiconductor integrated circuit technology, the degree of the one chip integration of the MMIC is rapidly advancing. That is to say, the number of circuits merged in a single semiconductor chip is increasing so as to increase the integration density. Therefore, integration density is increasing from the simple conventional semiconductor chip mounting discrete semiconductor active elements to a higher density semiconductor chip, which merges functional blocks fulfilling predetermined circuit functions, respectively. In addition, as the integration density rises, the complicated and sophisticated configurations, by which multiple functional blocks are mounted on an identical semiconductor chip, are also being developed.

In the MMIC, semiconductor active elements, such as high electron mobility transistors (HEMTs), heterojunction bipolar transistors (HBTs), or Schottky gate FETs (MESFETs), and passive elements such as capacitors, inductors and high frequency transmission lines, etc. are merged in a single semiconductor chip. The known and typical types of the high frequency transmission line used, in general, for the MMIC operating at microwave or millimeter wave bands are the Micro Strip line (hereinafter abbreviated as "MSL") and the Coplanar Waveguide (hereinafter abbreviated as "the CPW").

FIG. 1 is a sectional view showing example of wiring metal of the high frequency semiconductor device, which is cited as a base, or an illustrative example of the present invention. The metal patterns 61,62,63 are disposed on the top surface of a semiconductor substrate 1. Employing the narrow central metal strip 63 and a couple of wide ground metal plates 62 sandwiching the central metal strip 63, the CPW 7 is constructed. In FIG. 1, the broken lines between the central metal strip 63 and the ground metal plates 62 typically show the electric fields E. The instantaneous direction of the electric fields E changes with time according to the operation frequency. And, the MSL 13 are constructed with the bottom ground metal plate 12 disposed on the bottom surface of the semiconductor substrate 1 and the narrow metal strip 61 disposed on the top surface of the semiconductor substrate 1. The broken lines between the bottom ground metal plate 12 and the metal strip 61 are the electric fields E. By the methodology arranging the CPW 7 and the MSL 13 structures on an identical plane level on the semiconductor substrate 1 as shown in FIG. 1, the occupation area for wirings of the semiconductor device must inevitably become wide.

Therefore, the structure for the high frequency semiconductor device employing the dielectric thin film 3 as shown in FIG. 2 was proposed for further miniaturization of the device size. In FIG. 2, the first metal layer (64, 65) is disposed on the top surface of semiconductor substrate 1, and the dielectric thin film 3 covers the top surface of the first metal layer (64, 65). The second metal layer (61a, 61b) are disposed over this the dielectric thin film 3. In FIG. 2, two thin film microstrip lines (hereinafter abbreviated as "the TFMSLs") 6 are constructed between the second metal layer 61a and the first metal layer 64, and between the second metal layer 61b and the first metal layers 64. In addition, employing a couple of wide metal plates 64 sandwiching the central narrow metal strip 65, all are disposed under the dielectric thin film 3 as the first metal layer, the CPW 7 is constructed. In FIG. 2, broken lines respectively show the electric fields E between the second metal layer 61a and the first metal layer 64, between the second metal layer 61b and the first metal layer 64, and between the first metal layer (64, 65). Hence, the miniaturization of the chip size is being attempted by sandwiching the dielectric thin film 3 with the first metal layer (64, 65) and the second metal layer (61a, 61b) so as to reduce the wiring area for the high frequency transmission lines.

As described above, in the high frequency semiconductor device having the dielectric thin film, as shown in FIG. 2, the CPW, the TFMSL structures are preferable for the high frequency transmission lines. However, "the effective dielectric constant $\in_{\mathit{eff}}$" of the CPW structure shown in FIG. 2 must become larger than that shown in FIG. 1, on which there is no covering dielectric layer on the CPW structure. Namely, the effective dielectric constant $\in_{\mathit{eff}}$ of the CPW 7 constructed with the first metal layer (64, 65) and the second metal layer 61a, 61b must increase, since the dielectric thin film 3 having the same thickness as the dielectric layer of the TFMSL structure is stacked on the CPW 7. "The effective dielectric constant $\in_{\mathit{eff}}$" is an virtual dielectric constant of a homogeneous dielectric material, which determines the CPW high frequency transmission characteristics, assuming that the CPW is surrounded by spatially infinite dielectric material. Or, the effective dielectric constant $\in_{\mathit{eff}}$ may be defined as the dielectric constant of the homogeneous dielectric material disposed within the range to which effective electromagnetic fields from the CPW structure can affect. For example, the effective dielectric constant $\in_{\mathit{eff}}$ of the CPW 7 shown in FIG. 1 is determined both by the dielectric constant $\in_0$ of the air and the dielectric constant $\in_s$ of semiconductor substrate 1, through which the electric fields E penetrating. In the meantime, the effective dielectric constant $\in_{\mathit{eff}}$ of the CPW 7 shown in FIG. 2 is determined both by the dielectric constant $\in_i$ of the dielectric thin film 3 and the dielectric constant $\in_s$ of semiconductor substrate 1. However, the dielectric constant $\in_i$ of the dielectric thin film 3 is larger than dielectric constant $\in_0$ of the air. Therefore, the effective dielectric constant $\in_{\mathit{eff}}$ of the CPW 7 shown in FIG. 2 becomes larger than the corresponding effective dielectric constant $\in_{\mathit{eff}}$ of the CPW 7 shown in FIG.

1. And, the characteristic impedance $Z_0$ of the CPW 7 shown in FIG. 2 decreases significantly, because it is proportional to the reciprocal of the square root of the effective dielectric constant $\in_{eff}$, so that the characteristic impedance $Z_0$ of the CPW 7 shown in FIG. 2 becomes lower than structure shown in FIG. 1. And, by the increase of the effective dielectric constant $\in_{eff}$, the crosstalk between adjacent CPWs increases in the structure shown in FIG. 2. Therefore, according to the background art shown in FIG. 2, there was a problem which inevitably deteriorates the high frequency performance of the high frequency amplifier, if the high frequency amplifier is constituted with the CPW structure shown in FIG. 2.

And, in the high frequency semiconductor device operating in microwaves bands or millimeter wave bands, such as the MMIC, the disadvantage of the narrowed fabrication tolerance increases when the operation wavelength becomes shorter and shorter. Therefore, there is a large necessity of adjustments in the post-manufacturing stage, in which the electrical characteristics such as the high frequency transmission characteristics and the high frequency impedance must be adjusted.

The structures of the stubs for adjusting the electrical characteristics of the MSL 13 on the MMIC, according to the background art of the present invention, are shown in FIGS. 3A and 3B. FIG. 3B is a sectional view along I—I direction of FIG. 3A. The MSL 13 are constituted by a bottom ground metal 12 formed on a bottom surface of semiconductor substrate 1 such as gallium arsenide (GaAs) and an metal strip 44 formed on a top surface of semiconductor substrate 1. Metal islands 66 are arranged in the matrix form in both sides of and in the vicinity of the metal strip 44 formed on the top surface of semiconductor substrate 1. By connecting the metal strip 44 and the nearest metal island 66 by a bonding wire 48, etc., so as to construct the stub, or by connecting, in addition, between the metal islands 66 successively by bonding wires 48, etc., the adjustment of the electrical characteristic of the MSL 13 shown in FIGS. 3A and 3B can be accomplished.

In the meantime, there is a problem that we must find out an empty space for arranging the adjustment patterns, in the case of the electrical characteristic adjustment of the CPW structure merged in the MMIC, according to the background art of the present invention. This is the inevitable and structural result, since a couple of wide ground metal plates of 150 μm width or about 300 μm width, at both sides of the central metal strip must be disposed. This becomes the serious disadvantage, when further miniaturization is considered, for the high frequency semiconductor devices or the MMIC.

SUMMARY OF THE INVENTION

The present invention was made considering the above circumstance.

An object of the present invention is to provide a high frequency semiconductor device having a new structure that can reduce the effective dielectric constant e eff associated with a high frequency transmission line constituting a high frequency semiconductor device.

Another object of the present invention is to provide a high frequency semiconductor device having a new structure, which can extend the adjustable range of characteristic impedance $Z_0$ of a high frequency transmission line.

A further object of the present invention is to provide a high frequency semiconductor device having a new structure, which can reduce the high frequency loss effectively, and further can reduce the crosstalk.

An additional object of the present invention is to provide a high frequency semiconductor device, which can efficiently and respectively arrange two kinds of high frequency transmission line of different structures in a limited planar space, and can decrease the occupation area necessary for the wirings as a whole.

An additional object of the present invention is to provide a high-performance and high frequency semiconductor device with the wiring structure so as to reduce effectively the open circuit failures at uneven surface portion and/or a step portion.

An additional object of the present invention is to provide a high frequency semiconductor device with a high frequency transmission line in which adjustments of electrical characteristics at the high frequency band are easy.

An additional object of the present invention is to provide a semiconductor integrated circuit having a new structure which can reduce the effective dielectric constant $\in_{eff}$ of a high frequency transmission line, more and more.

An additional object of the present invention is to provide a semiconductor integrated circuit, which can extend the adjustable range of characteristic impedance $Z_0$ of a high frequency transmission line.

An additional object of the present invention is to provide a semiconductor integrated circuit having low transmission loss and can reduce the crosstalk between high frequency transmission lines disposed on a same chip.

An additional object of the present invention is to provide a semiconductor integrated circuit, by which the miniaturization of chip area is easy, disposing efficiently two kinds of high frequency transmission line of the different structures in the limited planar space so as to decrease the occupation area necessary for the wirings.

An additional object of the present invention is to provide a high-performance semiconductor integrated circuit, in which the open circuit failure at an uneven surface portion and/or a step portion is reduced.

An additional object of the present invention is to provide a semiconductor integrated circuit having high frequency transmission lines, in which the adjustment of electrical characteristics, or the high frequency impedance, the transmission characteristics or the high frequency gain are easy.

In order to achieve these objects of the present invention, the first feature of the present invention inheres in a high frequency semiconductor device comprising a substrate, a first metal layer disposed above the substrate, a first dielectric thin film disposed at least on the first metal layer; and a second metal layer comprising a second metal strip, disposed on the first dielectric thin film. Here, the first metal layer comprises a first metal strip, first and second ground metal plates sandwiching the first metal strip, each being isolated from the first metal strip. And first dielectric thin film is disposed at least on a part of the first ground metal plate. In addition, the dielectric structure on the first metal strip differs from the dielectric structure under the second metal strip.

In the present invention, "dielectric structure" means the thickness and/or the dielectric constant of the dielectric thin film. For example, it is possible to differentiate the dielectric structure on the first metal strip from the dielectric structure under the second metal strip by totally removing the first dielectric thin film on the first metal strip. And, it is possible to make the dielectric structure on the first metal strip different from the dielectric structure under the second metal strip, by the structure that a thin extension part of the first dielectric thin film is disposed on the first metal strip. The extension part of the first dielectric thin film has the thickness thinner than the thickness between the second metal strip and the first ground metal plate.

Still, it should be minded, in the high frequency semiconductor device according to the first feature of the present invention, a modified structure stacking a second dielectric thin film on the second metal strip can also be included. Furthermore, another modified structures stacking a third, a fourth . . . , dielectric thin films on the second dielectric thin film are also possible according to the first feature of the present invention.

For example, for the case that the CPW structure is constituted by the first metal strip, the first and second ground metal plates, if the thickness of dielectric thin film formed on the first metal strip is made thinner than thickness of the part under the second metal strip, including up to zero thickness so as to differentiate the dielectric structure between them, the effective dielectric constant $\in_{eff}$ around the CPW can be reduced. That is, the effective dielectric constant $\in_{eff}$ of the CPW portion is made lower than that of the conventional CPW as shown in FIG. 2. As already stated, the conventional CPW employs a uniform and homogenous dielectric structure so that the CPW portion 7 has the same thickness of the TFMSL portion 6. By this dielectric structure architecture, it is possible to reduce the transmission loss, while extending the adjustable range of the characteristic impedance $Z_0$. And further the crosstalk between adjacent CPWs is reduced. And, it is possible to constitute the TFMSL structure by the second metal strip and the first ground metal plate on a same semiconductor substrate. Namely, it is possible to dispose both the TFMSL and the CPW structures on the same semiconductor substrate efficiently utilizing a limited planar space. Therefore, the occupation area necessary for the wirings for the high frequency transmission lines, as a whole, can be decreased.

In the high frequency semiconductor device according to the first feature of the present invention, an open stub and a short stub for adjusting the high frequency impedance of the high frequency transmission line can be constituted using a metal island and the first ground metal plate, if the second metal strip is made to be the metal island. The first dielectric thin film for constituting open stub and short stub can be disposed in the empty space of the first ground metal plate in which the width is wide. Therefore, it is advantageous that the area efficiency is good, because the adjustment of electrical characteristics such as impedance and transmission characteristics of the CPW becomes possible without specially preparing the occupation area of the open and short stubs.

The second feature of the present invention lies in a semiconductor integrated circuit comprising a substrate, first and second ground metal plates, a semiconductor active element, input and output metal strips connected to the semiconductor active element, first and second dielectric thin films, and the first and second stub wirings. Here, the first and second ground metal plates are disposed above the substrate, spatially isolated from and facing to each other. The semiconductor active element is sandwiched between the first and second ground metal plates, and has first, second and third electrodes. The input metal strip is connected to the third electrode, and is sandwiched between the first and second ground metal plates. The output metal strip is connected to the second electrode, and is sandwiched between the first and second ground metal plates. The first dielectric thin film is disposed at least on a part of the first ground metal plate, and the second dielectric thin film is disposed at least on a part of the second ground metal plate. The first stub wiring is disposed on the first dielectric thin film, and is connected to the input metal strip. The second stub wiring is disposed on the second dielectric thin film, and is connected to the output metal strip. In addition, the dielectric structures on the input and output metal strips differ from the dielectric structures under the first and second stub wirings, respectively.

As already stated in the first feature of the present invention, the "dielectric structure" means the thickness and/or the dielectric constant of the dielectric thin film. For example, it is possible to differentiate the dielectric structure on the input and output metal strips from the dielectric structure under the first and second stub wirings by totally removing the first dielectric thin film on the input and output metal strips. And, it is possible to make the dielectric structure on the input and output metal strips different from the dielectric structures under the first and second stub wirings, by the structure that a thin connection part of the first and second dielectric thin films is disposed on the first metal strip. The connection part of the first and second dielectric thin films has the thickness thinner than the thickness of a part just under the first and second stub wirings.

In the semiconductor integrated circuit according to the second feature of the present invention, it is possible to use various high frequency semiconductor elements such as a HEMT, a bipolar transistor (BJT) including a HBT, a MESFET and a static induction transistor (SIT) for the "semiconductor active element". And, "the first electrode" of the semiconductor active element means one of emitter, collector and base electrodes for BJT, and one of source, drain and gate electrodes for HEMT, MESFET, SIT. "The second electrode" means the another one of the emitter, collector and base electrodes for BJT, and another one of the source, drain and gate electrodes for HEMT, MESFET, SIT. That is to say, the second electrode can be the emitter region, if the first electrode is the collector region, and the second electrode can be the drain region, if the first electrode is the source region. Of course the "third electrode" of semiconductor active element means the remaining one of emitter, collector and base electrodes of BJT and the remaining one of source, drain and gate electrodes of HEMT, MESFET, SIT other than first and second electrodes.

For example, a combination of the input metal strip, the first and second ground metal plates can constitute a first CPW, and another combination of the output metal strip, the first and second ground metal plates can constitute a second CPW. Further it may be possible to constitute a first TFMSL with the first stub wiring and the first ground metal plate. Similarly, the second stub wiring and the second ground metal plate can constitute a second TFMSL. Then, by making the thickness of dielectric thin film on the first and second CPW portions thinner than thickness of dielectric thin film of the first and second TFMSL portions, the respective dielectric structures are configured to be different from each other, and it is possible to reduce the effective dielectric constant $\in_{eff}$ of the first and second CPW portions. That is, the effective dielectric constant $\in_{eff}$ of the CPW portions are made lower than that of the conventional CPW as shown in FIG. 2. As the result, it is possible to extend the adjustable range of the characteristic impedance $Z_0$ of the first and second CPW portions. Further, they can have low transmission losses. And the performance of low crosstalk between the CPW portions is achieved. And it is possible to realize a high-performance semiconductor integrated circuit. And, it is also possible to dispose both the first and second TFMSLs and the first and second CPWs in a limited planar space on a same semiconductor chip. Therefore, the necessary occupation area, as a whole, for the wirings of the semiconductor integrated circuit can be decreased.

The third feature of the present invention lies in a semiconductor integrated circuit having a substrate, the first and second ground metal plates, a semiconductor active element, an input metal strip, an output metal strip, a dielectric thin film, a first stub wiring, and a second stub wiring. Here, the first and second ground metal plates are disposed above the substrate, spatially isolated from and facing to each other. The semiconductor active element is sandwiched between the first and second ground metal plates, and has first, second and third electrodes. The input metal strip is connected to the third electrode, and is sandwiched between the first and second ground metal plates. The output metal strip is connected to the second electrode, and is sandwiched between the first and second ground metal plates. The dielectric thin film is unevenly disposed on the first ground metal plate, the input metal strip, the output metal strip and the second ground metal plate. And the dielectric thin film has a thin layer formed on the input and output metal strips so as to form a concave above the input and output metal strips. The thin layer has the thickness thinner than the thickness of a part just under the first and second stub wirings. Then the dielectric structures on the input and the output metal strips are configured such that they differ from those under the first and second stub wirings. The first stub wiring is disposed on the dielectric thin film, and is connected to the input metal strip. And the second stub wiring is disposed on the dielectric thin film, and is connected to the output metal strip.

In the semiconductor integrated circuit according to the third feature of the present invention, various high frequency semiconductor elements such as a HEMT, a BJT, a MESFET and a SIT can serve as the "semiconductor active element". Similar to the second feature of the present invention, a combination of the input metal strip, the first and second ground metal plates can constitute a first CPW, and another combination of the output metal strip, the first and second ground metal plates can constitute a second CPW. Further it may be possible to constitute a first TFMSL with the first stub wiring and the first ground metal plate. Similarly, the second stub wiring and the second ground metal plate can constitute a second TFMSL. Then, it is possible to reduce the effective dielectric constant $\in_{eff}$ of the first and second CPW portions. As the result, it is possible to extend the adjustable range of the characteristic impedance $Z_0$ of the first and second CPW portions. Further, they can have low transmission losses, and the performance of low crosstalk between the CPW portions is achieved. And it is possible to realize the high-performance semiconductor integrated circuit, disposing both the first and second TFMSLs and the first and second CPWs in a limited planar space on a same semiconductor chip. Therefore, the necessary occupation area, as a whole, for the wirings of the semiconductor integrated circuit can be decreased.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWINGS

FIGS. 6A to 6E are process sectional views explaining another sequence of manufacturing processes for the high frequency semiconductor device according to the first embodiment of the present invention.

DETAILED DESCRIPTION OF THE PREFERRED EMBODIMENTS

Figure 1:
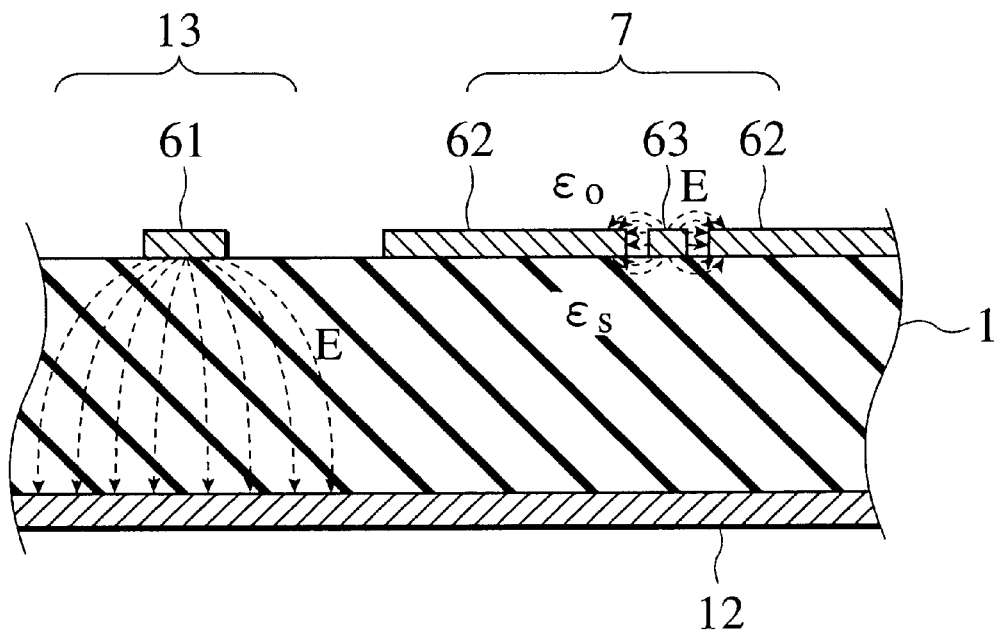
FIG. 1 is a sectional view showing an example of wiring metal of the high frequency semiconductor device as a base, or an illustrative example of the present invention.

Various embodiments of the present invention will be described with reference to the accompanying drawings. It is to be noted that the same or similar reference numerals is applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses is arbitrarily drawn for facilitating the reading of the drawings.

In the following descriptions, numerous specific details are set fourth such as specific signal values, etc. to provide a through understanding of the present invention. However, it will be obvious to those skilled in the art that the present invention may be practiced without such specific details. In other instances, well-known circuits have been shown in block diagram form in order not to obscure the present invention in unnecessary detail.

(First Embodiment)

Figure 4A:
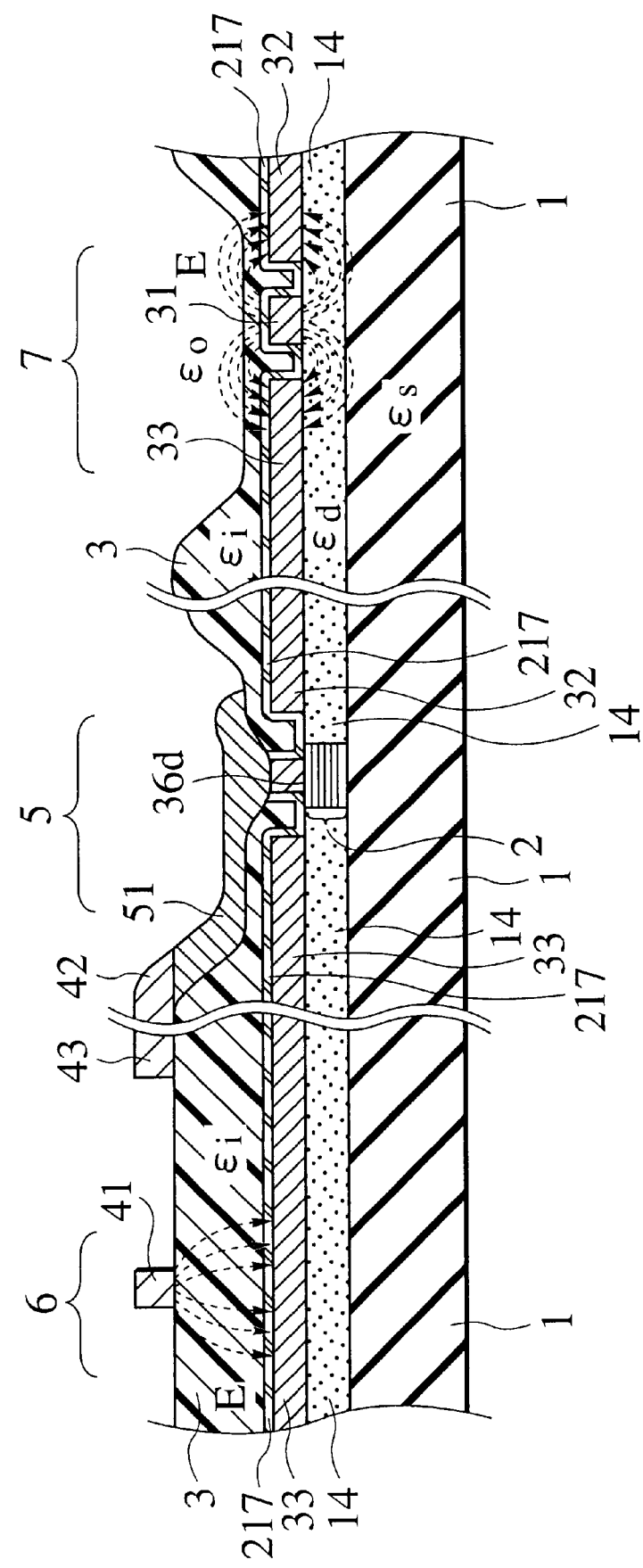
FIG. 4A is a sectional view showing a part of the structure of a high frequency semiconductor device according to a first embodiment of the present invention.

A high frequency semiconductor device according to a first embodiment of the present invention shown in FIG. 4A comprises a substrate (semiconductor substrate) 1; a first metal layer (31, 32, 33, 36d) disposed above the semiconductor substrate 1, a first dielectric thin film 3 disposed in a prescribed non-uniform way on the first metal layer (31, 32, 33, 36d); and a second metal layer comprising a second metal strip 41, disposed on the first dielectric thin film 3. Here, the first metal layer comprises a first metal strip 31, a first ground metal plate 33 and a second ground metal plate 32 sandwiching the first metal strip 31, each being isolated from the first metal strip 31. And the first dielectric thin film 3 is disposed at least on a part of the first ground metal plate 33 so that the dielectric structure on the first metal strip 31 differs from the dielectric structure of the first dielectric thin film 3 under the second metal strip 41.

In FIG. 4A, for convenience's sake, different three sectional views are shown adjacently. The sectional views of central and right sides of FIG. 4A are views in parallel but at different positions. The sectional view of left side of FIG. 4A is a view along the direction perpendicular to the sectional views of central and right sides. In the high frequency semiconductor devices to be described in the following first and second embodiments, the first dielectric thin film 3 is merely called "the dielectric thin film 3". In the present invention, the term of "the first dielectric thin film 3" is employed to allow a structure, for example, as scheduled to be shown in the third embodiment, in which a multilevel structure of dielectric thin films is inherently contained. However, it is redundant to use the term in the first and second embodiments, since the second dielectric thin film does not exist.

In FIG. 4A, a CPW 7 is constituted by the first metal strip 31, the first ground metal plate 33 and the second ground metal plate 32, and a TFMSL 6 is constituted by the second metal strip 41, the dielectric thin film 3 and the first ground metal plate 33. In FIG. 4A broken lines between the first metal strip 31 and the first ground metal plate 33 or the second ground metal plate show the electric fields E. Also the broken lines between the second metal strip 41 and the first ground metal plate 33 show the electric fields E. The instantaneous direction of the electric fields E changes with time according to the operation frequency. However, in FIG. 4A, the electric fields E between the first metal strip 36d and the first ground metal plate 33 or between the first metal strip 36d and the second ground metal plate 32 are omitted to avoid the cluttering up the drawing. In the high frequency semiconductor device according to the first embodiment of the present invention, a HEMT, serving as the semiconductor active element of the preset invention, is disposed on a part of semiconductor substrate 1. An epitaxial growth layer 2, consisting of a multi-level stacked structure disposed on the semiconductor substrate 1, embodies the HEMT. An element isolation region 14 surrounds the periphery of the epitaxial growth layer 2. As the element isolation region 14, insulating films or a high resistivity semiconductor (GaAs) region formed by proton (H+) bombardment, etc. are usable. As the insulating films for element isolation region 14, silicon nitride film ($Si_3N_4$ film) or silicon oxide film ($SiO_2$ film), polyimide, BCB (benzo-cyclo-butene monomers), amorphous fluorocarbon resin, etc. are usable. On the element isolation region 14, the first metal layer (31, 32, 33, 36d) consisting of the first metal strip 31, the first ground metal plate 33, the second ground metal plate 32 and metal strip 36d is disposed. Metal strip 36d is the island formed between the wide first ground metal plate 33 and the second ground metal plate 32. The metal strip 36d is connected to the epitaxial growth layer 2 on semiconductor substrate 1. The most upper layer of epitaxial growth layer 2 is a semiconductor region (an ohmic contact region) of high impurity concentration, so that the metal strip 36d can contact to the ohmic contact region with lower contact resistance. On the first metal layer (31, 32, 33, 36d), a passivation film 217 is deposited, and the dielectric thin film 3 is deposited on the passivation film 217. Then, the second metal layer (41, 42, 43), or the second metal strip 41 and other wirings 42, 43 are arranged on the dielectric thin film 3. As a material for the dielectric thin film 3, polyimide, BCB, amorphous fluorocarbon resin, etc. are usable. And, silicon nitride film ($Si_3N_4$ film) or silicon oxide film ($SiO_2$ film), etc. may be used as the passivation film 217. In the thin portion of the dielectric thin film 3, a via hole 5 is formed to expose the surface of the metal strip 36d. Then, a sidewall metal 51 runs along the taper portion, changing thickness to the thin portion from the thick portion of dielectric layer 3, so that the wiring 42 can connect to the metal strip 36d.

In the high frequency semiconductor device according to the first embodiment, the TFMSL 6 composed of the second metal strip 41 and the first ground metal plate 33 is disposed at a part of semiconductor substrate 1, as shown in FIG. 4A, and the CPW 7 using the first metal strip 31, the first ground metal plate 33 and the second ground metal plate 32 is disposed in the region different from the position where the TFMSL 6 is disposed. Hence, the occupation area necessary for the wirings, as a whole, can be decreased in the high frequency semiconductor device according to the first embodiment, because both the TFMSL 6 and the CPW 7 can efficiently occupy the limited planar space.

Figure 2:
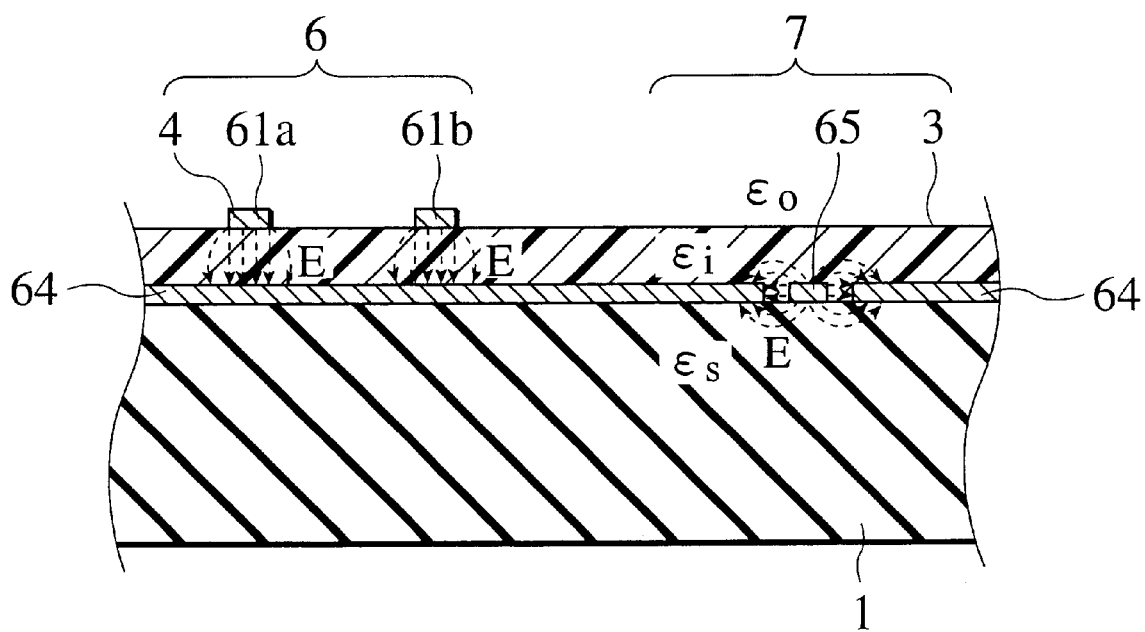
FIG. 2 is a sectional view showing another example of wiring metal of the high frequency semiconductor device as another base of the present invention.
Figure 3A:
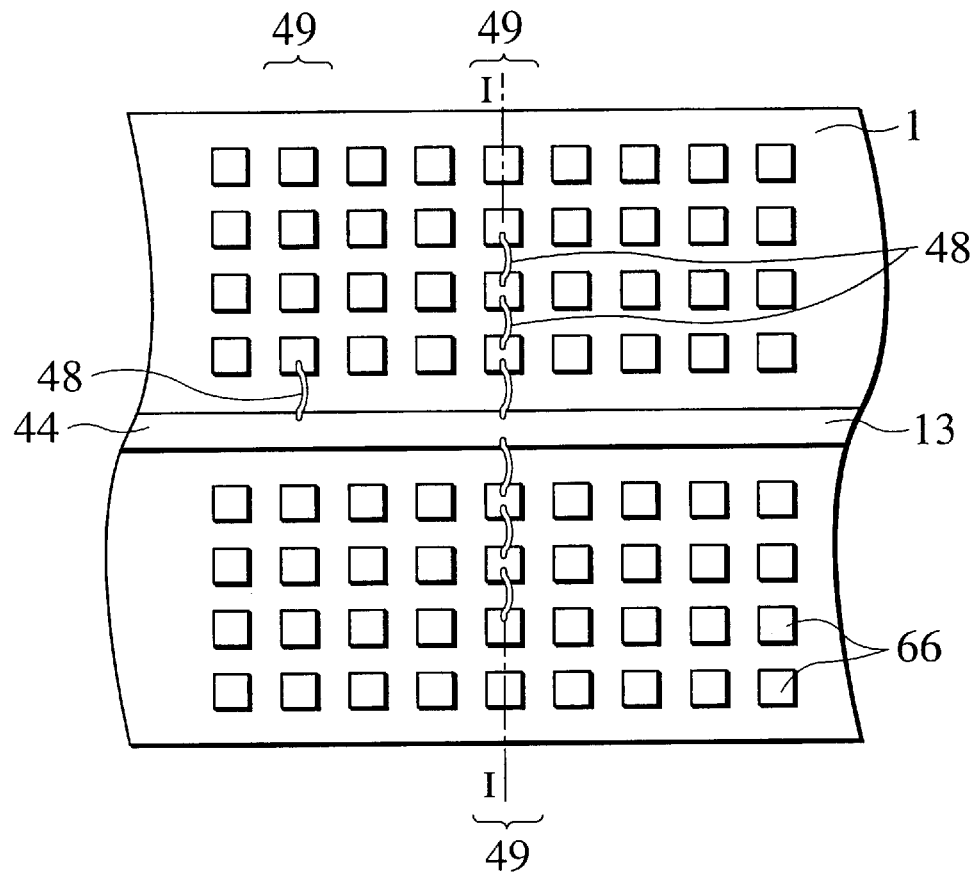
FIG. 3A is a plan view showing a structure of the stub for the electrical characteristic adjustment of the high frequency transmission line for the MMIC according to the background art of the present invention.
Figure 3B:
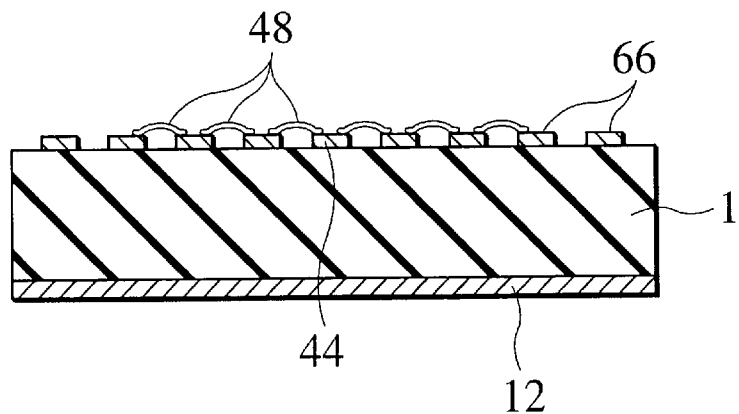
FIG. 3B is a sectional view along I—I direction of FIG. 3A.

Then, by making thinner the thickness of the dielectric thin film 3 on the CPW 7 than that associated with the TFMSL 6 so as to make the dielectric structure on the CPW 7 different from the dielectric structure of the TFMSL portions 6, it is possible to reduce the effective dielectric constant $\in_{eff}$ of the CPW 7, while the occupation area necessary for the wirings is minimized. That is, the effective dielectric constant $\in_{eff}$ of the CPW 7 is made lower than that of the conventional CPW 7 as shown in FIG. 2. As already stated, the conventional CPW 7 employs a uniform and homogenous dielectric structure so that the CPW portion 7 has the same thickness of the TFMSL portion 6. Therefore, it is possible to extend the adjustable range of the characteristic impedance $Z_0$ of the CPW 7. And, it is possible that according to the high frequency semiconductor device of the first embodiment, it has a low transmission loss, and that it can reduce the crosstalk. This can improve the performance of the high frequency semiconductor integrated circuit, since the wiring structure shown in FIG. 4A is used for the high frequency transmission lines operating in microwave and millimeter wave bands. And, it is possible to avoid or to suppress the open circuit failure of sidewall metal of 51 formed in the via hole, because the taper geometry is existing in the transition region from the thick to thin part of the dielectric thin film 3.

Figure 4B:
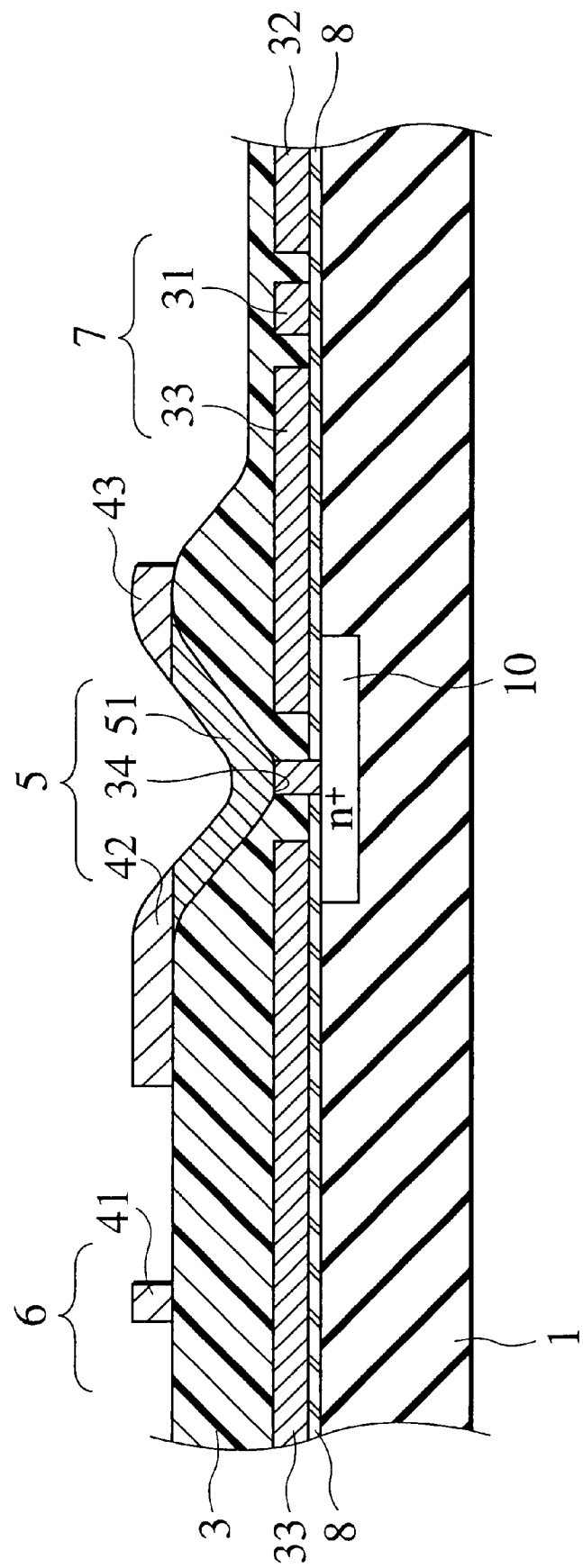
FIG. 4B is a sectional view showing a part of the structure of the high frequency semiconductor device according to a modification of the first embodiment of the present invention.

FIG. 4B is a sectional view showing a part of the structure of the high frequency semiconductor device according to a modification of the first embodiment. As well as FIG. 4A high frequency semiconductor device comprises a substrate (semiconductor substrate) 1; a first metal layer (31, 31, 34) disposed above the semiconductor substrate 1, a dielectric thin film 3 disposed at least on the first metal layer (31, 31, 34); and a second metal layer comprising a second metal strip 41, disposed on the dielectric thin film 3. Here, the first metal layer comprises a first metal strip 31, a first ground metal plate 33 and a second ground metal plate 32 sandwiching the first metal strip 31, each being isolated from the first metal strip. And dielectric thin film 3 is disposed at least on a part of the first ground metal plate 33. In addition, the dielectric structure on the first metal strip 31 differs from the dielectric structure under the second metal strip 41. However, in FIG. 4B, a semiconductor region (ohmic contact region) 10 of high impurity concentration is formed at and in a part of the surface of semiconductor substrate 1. For example, the semiconductor region 10 may be implemented by an n+ diffusion region formed at and in a p type epitaxial growth layer grown on a p type GaAs substrate, or a semi-insulating GaAs substrate. Silicon nitride film ($Si_3N_4$ film) or silicon oxide film ($SiO_2$ film) as a field insulating film 8 (or an inter-layer insulation film), etc. is disposed on the semiconductor region 10 and semiconductor substrate 1. Over the field insulating film (or the inter-layer insulation film) 8, the first metal layer (31, 32, 33, 34) consisting of the first metal strip 31, the first ground metal plate 33, the second ground metal plate 32 and insular electrode 34 is disposed. The insular electrode 34 is disposed in an opening (a window portion) of the first ground metal plate 33. That is to say, actually, in FIG. 4B, two first ground metal plates 33 are shown on a sectional view, and it is an integrated metallic thin film continues at back and front sides of the paper. Though the illustration is omitted, a passivation film can be stacked on the first metal layer (31, 32, 33, 34). The dielectric thin film 3 is stacked on the first metal layer (31, 32, 33, 34). Then, the second metal layer (41, 42, 43), comprising the second metal strip 41 and other wirings 42, 43 is arranged on this the dielectric thin film 3.

In the dielectric thin film 3, the concave constituting via hole 5 is disposed. On the upper side of metal strip 31, as shown in the right side of FIG. 4B, is disposed a valley extending perpendicular to the plane of the paper. In the meantime, on the insular electrode 34, as shown in the center of FIG. 4B, shifted from the direction of the valley, the concave constituting via hole 5 is disposed. The concave 5 is a separated concave from the valley on the metal strip 31. Then, the metal patterns 42,43 are connected to the insular electrode 34 with a sidewall metal 51 in the via hole 5.

And the CPW 7 using the first metal strip 31, the first ground metal plate 33 and the second ground metal plate 32 is disposed in the region different from the position where the TFMSL 6 is disposed, occupying a part of region on semiconductor substrate 1, consisting of the second metal strip 41 and the first ground metal plate 33. The illustration of the electric fields E between the first metal strip 31 and the first ground metal plate 33 (or the second ground metal plate 32), and between the second metal strip 41 and the first ground metal plate 33 are omitted respectively to avoid the cluttering up the drawing. In FIG. 4B, the occupation area necessary for the wirings, can be decreased, because both the TFMSL 6 and the CPW 7 efficiently occupy the limited planar space, similar to the structure as shown in FIG. 4A. While the occupation area necessary for the wiring is decreased, the thickness of the dielectric thin film 3 on the CPW 7 is made thinner than that of the TFMSL 6 so as to be different in the dielectric structure, then it is possible to reduce the effective dielectric constant $\in_{eff}$ of the CPW 7. That is, the effective dielectric constant $\in_{eff}$ of the CPW 7 is made lower than that of the conventional CPW 7 as shown in FIG. 2. Therefore, it is possible to extend the adjustable range of the characteristic impedance $Z_0$ of the CPW 7, to have a low transmission loss, and to reduce the crosstalk.

This structure can improve the performance of the high frequency semiconductor integrated circuit, if the wiring structure shown in FIG. 4B is employed as the structure for a high frequency semiconductor integrated circuit operating at the microwave and millimeter wave bands. And, similar to the structure shown in FIG. 4A, the taper geometry from the thick to thin part of the dielectric thin film 3 can reduce the open circuit failure of the sidewall metal 51 in the via hole 5.

Figure 4C:
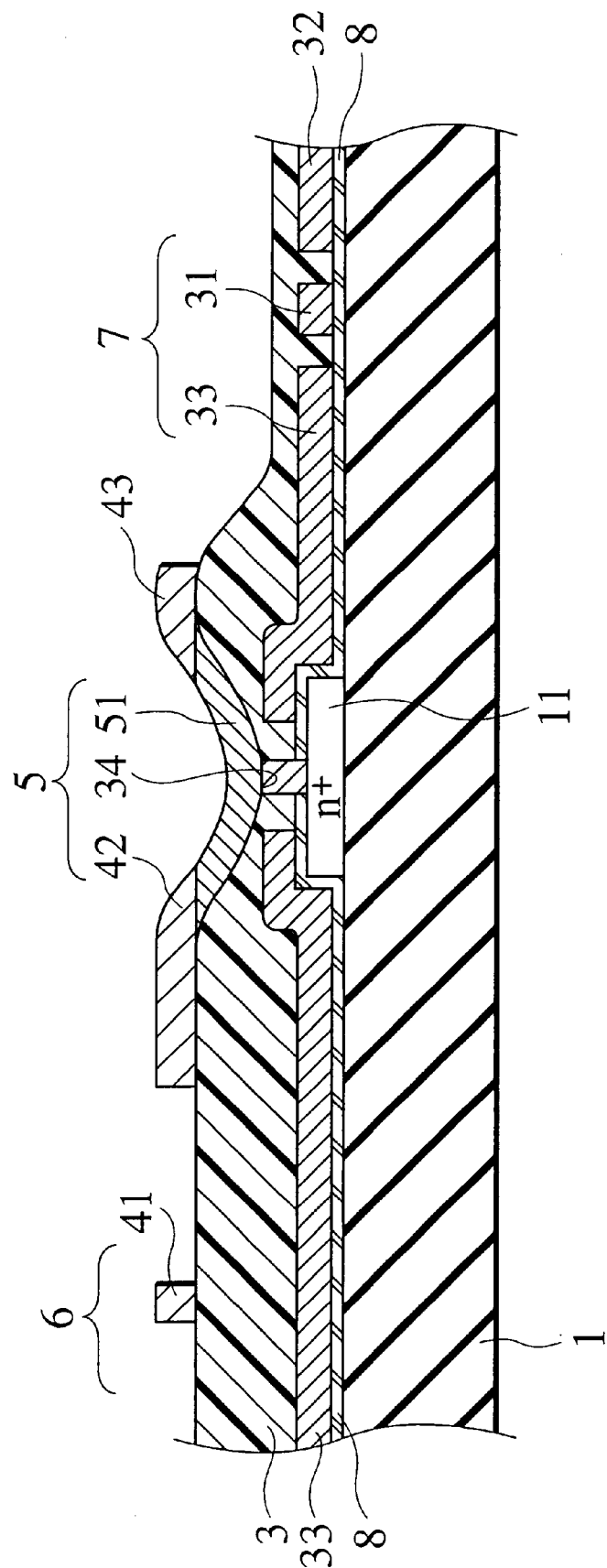
FIG. 4C is a sectional view showing a part of the structure of the high frequency semiconductor device according to another modification of the first embodiment of the present invention.

FIG. 4C is a sectional view showing a part of the structure of the high frequency semiconductor device according to another modification of the first embodiment. In FIG. 4C, a semiconductor region (an ohmic contact region) 11 of high impurity concentration is constituted as a convex portion at a part of the semiconductor substrate 1. Then, a field insulating film (or an inter-layer insulation film) 8 is disposed on the semiconductor region 11 and semiconductor substrate 1. Other structure is similar to the structure shown in FIG. 4B, and the overlapped description or the redundant description may be omitted in this another modification of the first embodiment. Then, the occupation area necessary for the wirings, can be decreased, because this another modification efficiently disposes both the TFMSL 6 and the CPW 7 in a limited planar space as shown in FIG. 4C, similar to the structure shown in FIGS. 4A and 4B. Therefore, it is possible to reduce the effective dielectric constant $\in_{\textit{eff}}$ of the CPW 7, while the occupation area necessary for the wirings is decreased. Consequently, the technical advantages of extending the adjustable range of the characteristic impedance $Z_0$ of the CPW 7, of having a low transmission loss, and of reducing the crosstalk are obtained.

Next, a sequence of manufacturing processes of the high frequency semiconductor device according to the first embodiment is explained with reference to the drawings. FIGS. 5A to 5I are sectional views explaining the fabrication method of the high frequency semiconductor device according to the first embodiment as shown in FIG. 4A. Among the drawings, FIGS. 5A to 5G are sectional views showing the details of the layered structure implementing the HEMT serving as the semiconductor active element.

Figure 5A:
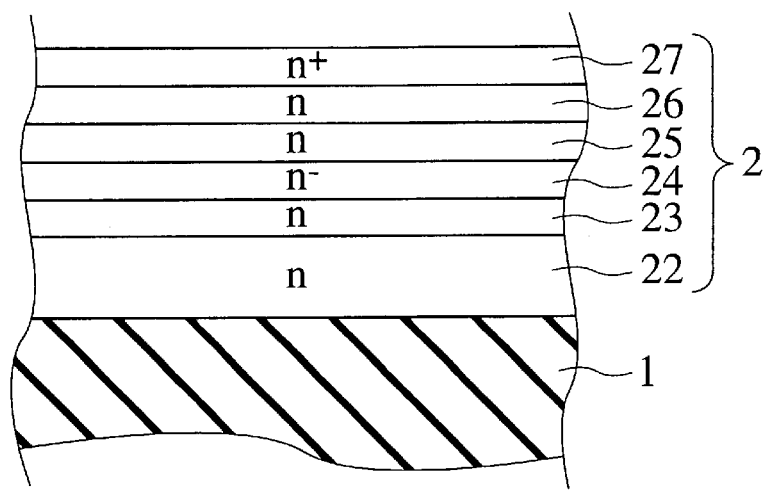
FIGS. 5A to 5I are process sectional views explaining a sequence of manufacturing processes of the high frequency semiconductor device shown in FIG. 4A.

(a) At first, an n type buffer layers of 22, an n type channel layer 23, an n type spacer layer 24, an n type donor layer 25, an n type Schottky contact layer 26, an $n^+$ ohmic contact layer 27 are epitaxially grown continuously in this order on a semiconductor substrate 1 of semi-insulating GaAs, etc. by a metalorganic chemical vapor deposition (MOCVD) method or a molecular beam epitaxy (MBE) method, etc. so as to form the multi-level stacked structure, as shown in FIG. 5A. The n type channel layer 23 and the n type spacer layer 24 are what are called "the undoped layers" to which the impurity is not intentionally being added. By transferring the electrons from donor layer 25, the two-dimensional electron gas (TEG) is generated at the interface between the n type channel layer 23 and the n type spacer layer 24.

Figure 5B:
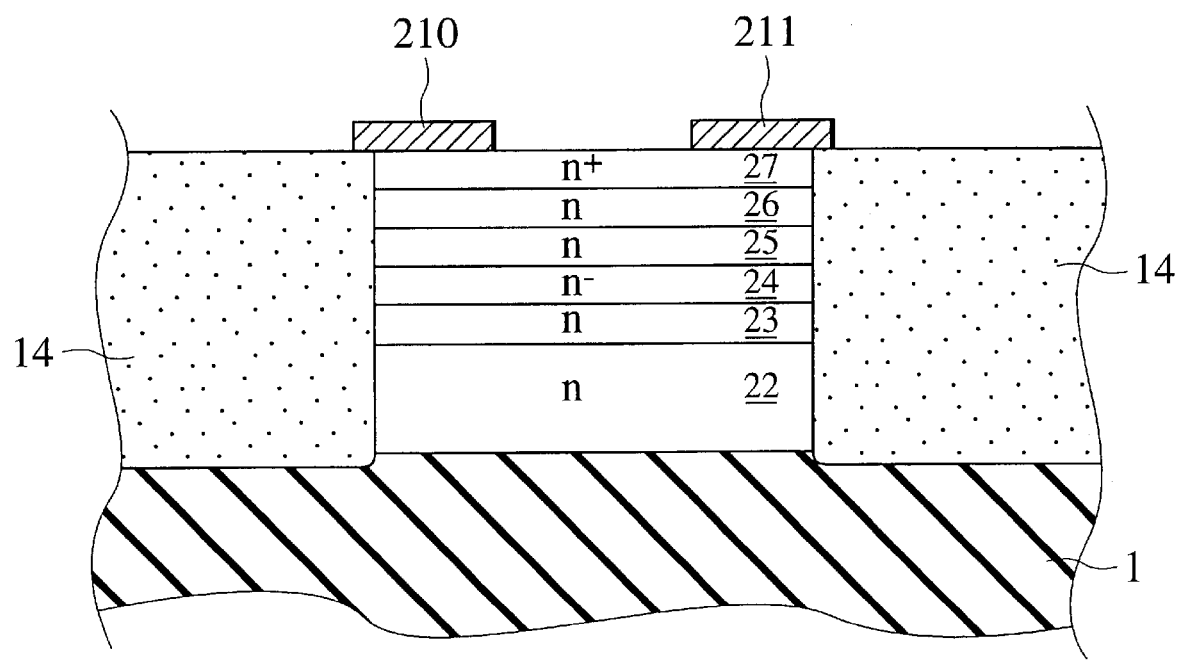

(b) Then, a predetermined portion of the multi-level stacked structure 22 to 27 is etched by reactive ion etching (RIE) method, until the semiconductor substrate 1 is exposed so as to form element isolation grooves. And in this element isolation grooves, an element isolation insulating film is embedded to form an element isolation region 14. The area surrounded by element isolation regions 14 becomes "the active area (the device region)". Still, by the selective proton ($H^+$) bombardment to the epitaxial growth layer 22 to 27 to form a high resistivity region, the element isolation region 14 can be formed. Then a photoresist film is spin coated on the $n^+$ ohmic contact layer 27. And by the photolithography, openings are formed in the photoresist film to expose the $n^+$ ohmic contact layer 27. Then, metal films such as Au—Ge/Ni/Au are deposited by vacuum evaporation or sputtering method, employing this photoresist film as a backing film. Afterwards, this photoresist film is removed. That is to say, a drain ohmic electrode 211 and a source ohmic electrode 210 are formed respectively, as shown in FIG. 5B, by what is called "lift-off process" on the drain region 27 and the source region 27, made from the $n^+$ ohmic contact layer 27.

Figure 5C:
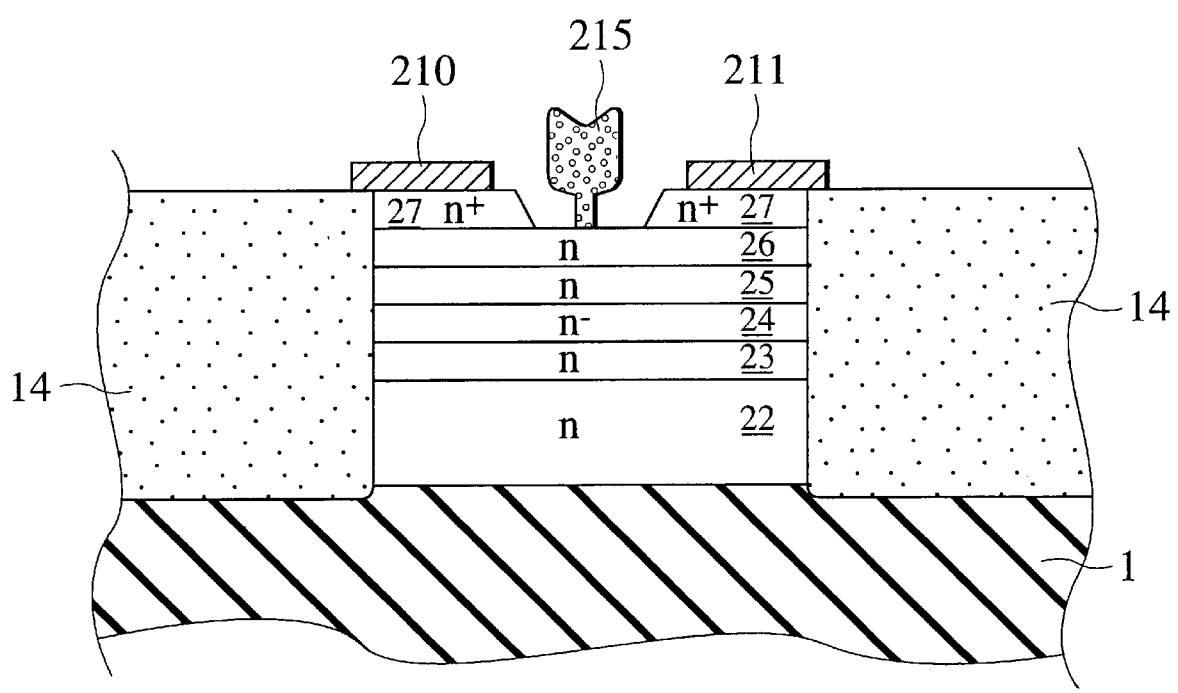

(c) Then, another photoresist pattern with a window in a predetermined portion is formed by the photolithography. The predetermined portion is the portion where the recessed gate region of the HEMT is scheduled to be formed. Successively, the ohmic contact layer 27 is etched by RIE method using this photoresist pattern as etching mask, and Schottky contact layer 26 is exposed. Then, another photoresist film is spin coated on the exposed Schottky contact layer 26, and another window is formed in the photoresist film by the photolithography. Then, gate electrode material such as Ti/Pt/Au or $WSi_2$ is deposited, using this photoresist film as a backing film, by vacuum evaporation, sputtering, or CVD method. Afterwards, by the lift-off process exfoliating this photoresist film, the gate electrode 215 having the T type cross-sectional shape, as shown in FIG. 5C, is formed. Although not shown, a gate electrode extraction wiring connected to the gate electrode 215 is simultaneously formed with the gate electrode 215.

Figure 5D:
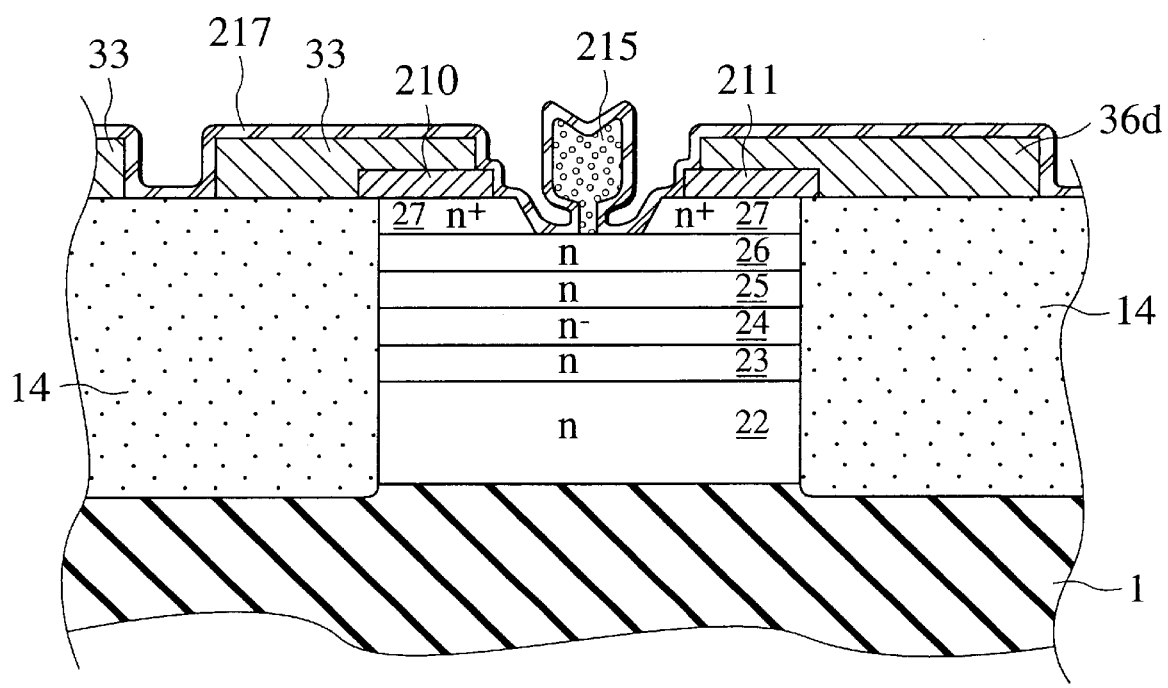

(d) Next, another photoresist film is spin-coated, and windows arranged at the corresponding locations for wirings for high frequency transmission lines and extraction wirings are formed by the photolithography. Employing this photoresist film as a backing film, metal materials such as gold (Au) is deposited by vacuum evaporation or sputtering method. And, by removing the backing film, the first ground metal plate 33 and the first metal strip 36d, etc. are patterned by the lift-off process, as shown in FIG. 5D. Still, the first metal strip 31 omitted in the illustration is simultaneously formed as the wiring pattern of the first metal layer (See FIG. 4A). Further simultaneously, an opening (a window portion) in the first ground metal plate 33 is formed, as shown at the left side of FIG. 5D. That is to say, at the left side of FIG. 5D, as if two first ground metal plates 33 are shown on cross-section, actually, it is an integrated metallic thin film which continues at back and front sides of the plane of the paper. Source ohmic electrode 210 is connected to the first ground metal plate 33 so as to allow the source grounded operation of the HEMT. Metal strip 36d is the first metal layer sandwiched by the first ground metal plate 33 and the second ground metal plate 32 omitted in the illustration, and it constitutes the part of the high frequency transmission line of the CPW structure. Also, gate electrode of 215 is, through the gate electrode extraction wiring, led to and connected to another metal strip (an input metal strip) sandwiched between the first ground metal plate 33 and the second ground metal plate 32. The first metal strip 31, omitted in the illustration, also constitutes a part of the high frequency transmission line of the CPW structure with the input metal strip connected to the gate electrode extraction wiring. Afterwards, $Si_3N_4$ film 217 as a passivation film is deposited by the CVD method on the first metal layer 33 and 36d, etc.

Figure 5E:
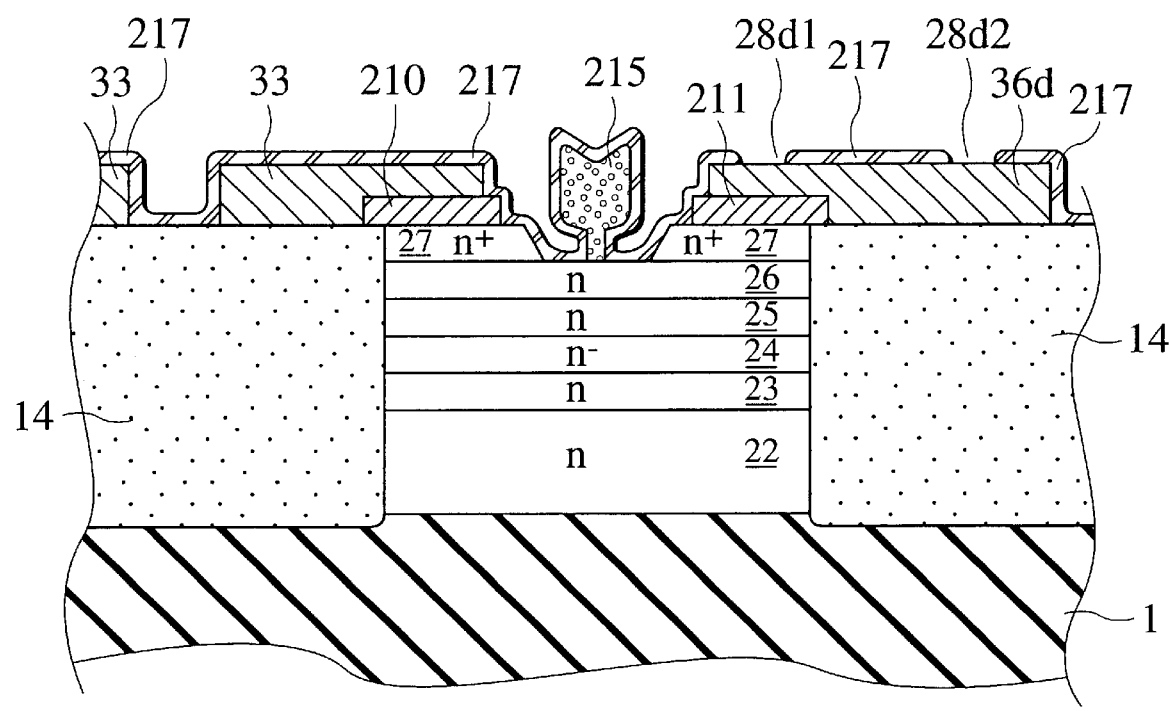
Figure 5F:
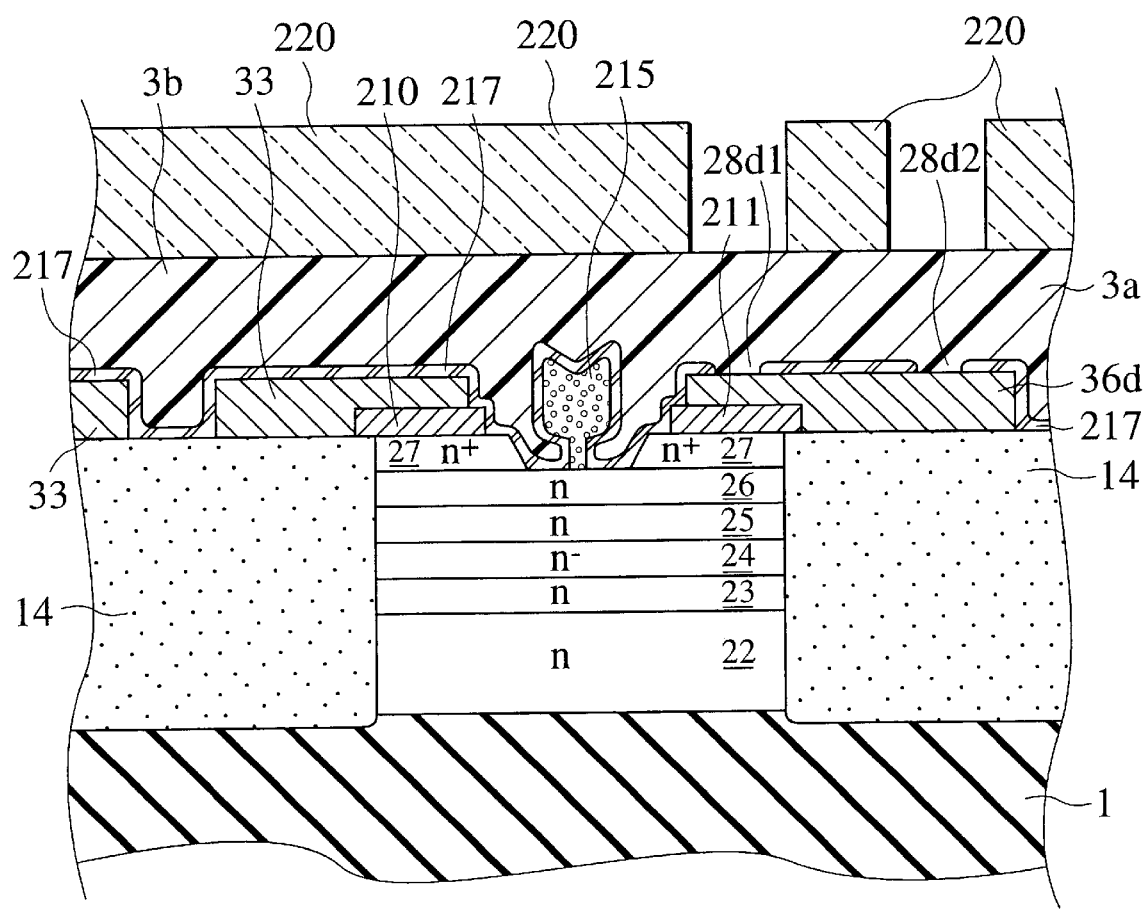
Figure 5G:
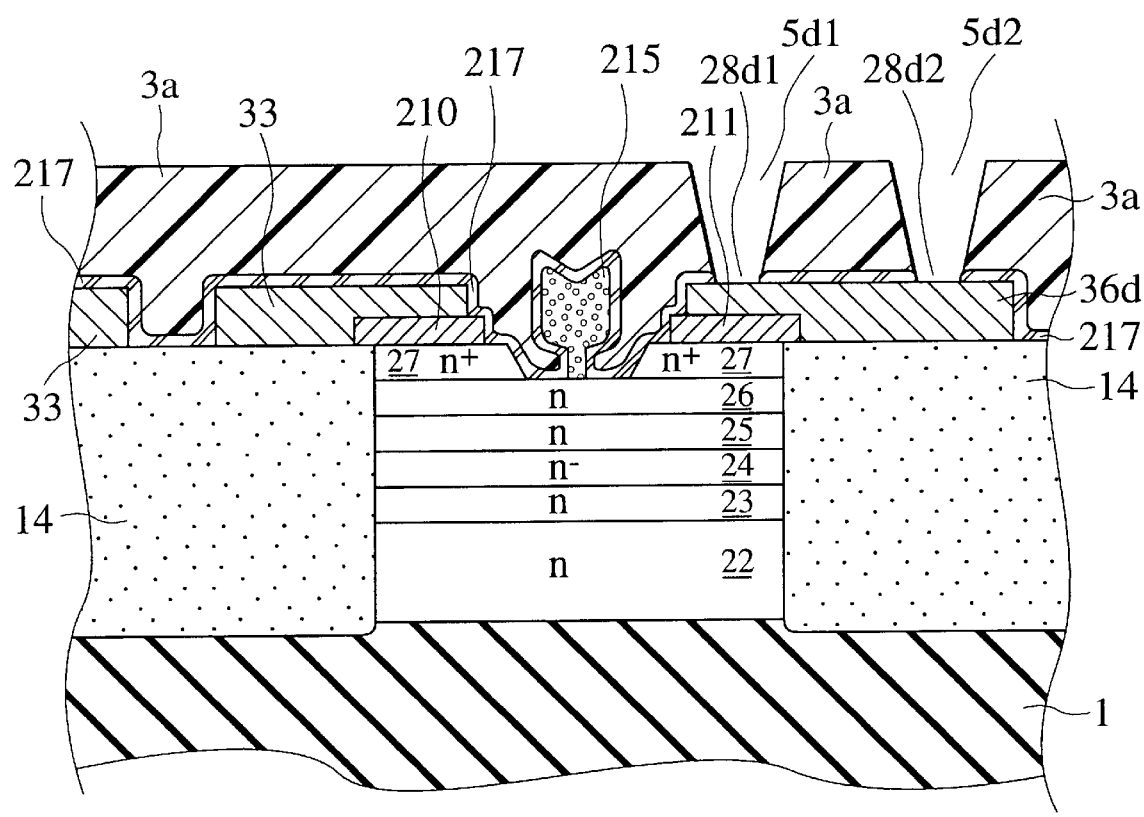

(e) In addition, contact holes 28d1 and 28d2 are opened using photolithography and RIE method at predetermined positions on metal strip 36d in the passivation film 217, as shown in FIG. 5E. Then, a resin film (a lower dielectric layer) 3a such as the BCB film is coated, as shown in FIG. 5F and then is hardened to have a thickness of, for example, 1 μm. Next, photoresist film 220 is coated further on the BCB resin film (the lower dielectric layer) 3a. A new photoresist pattern having windows over metal strip 36d in the photoresist film 220 is formed by the photolithography. Then, with the new photoresist pattern 220 as etching mask, the BCB resin film (the lower dielectric layer) 3a is etched by RIE to selectively open via holes 5d1 and 5d2, as shown in FIG. 5G. Afterwards, the photoresist film 220 is removed.

Figure 5H:
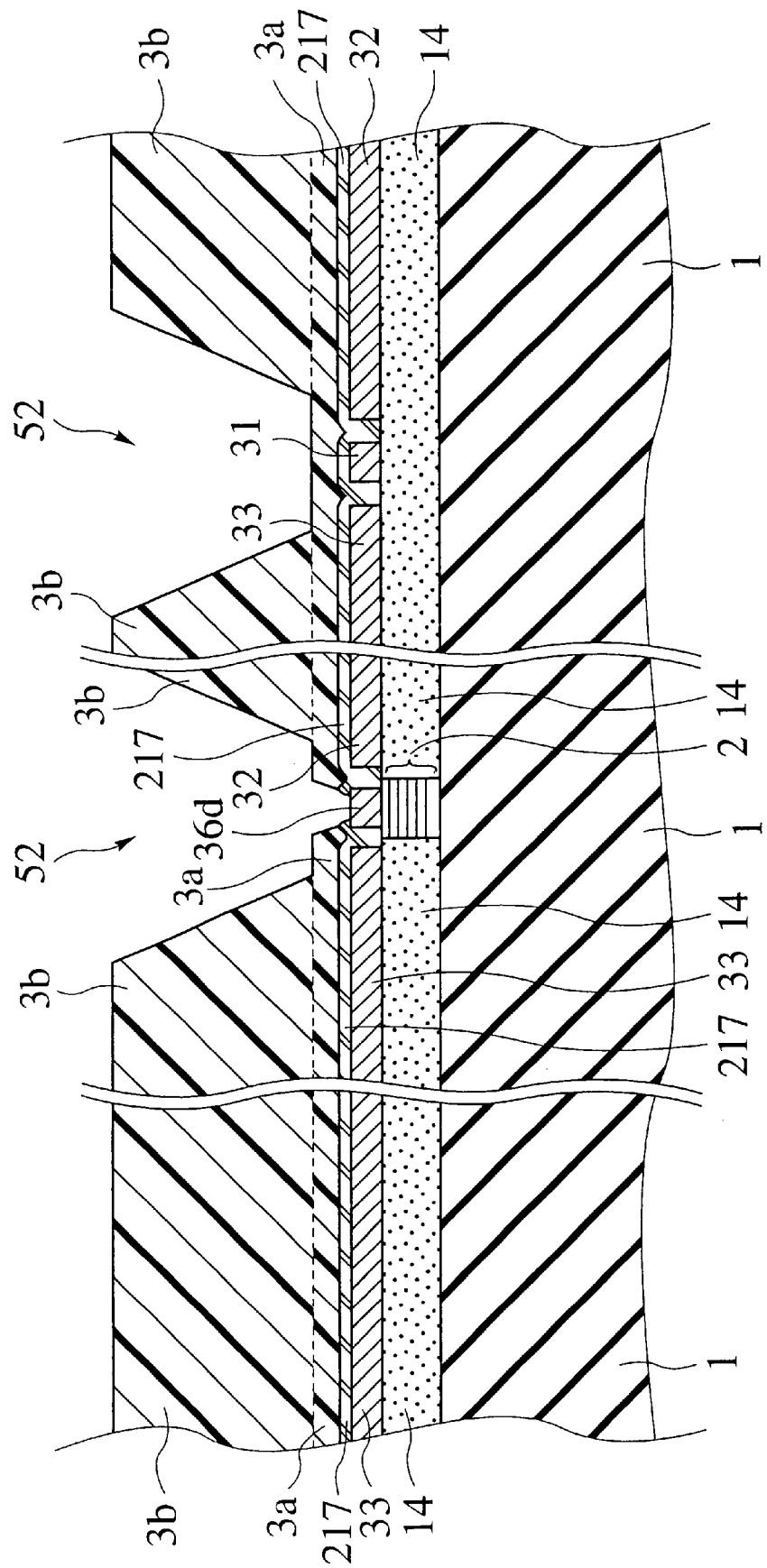

(f) Next, a photosensitive BCB film (an upper dielectric layer) 3b having a thickness of, for example, 9 μm is coated on the whole surface of the lower dielectric layer 3a. And, parts of the photosensitive BCB film (the upper dielectric layer) 3b are selectively removed, with a predetermined mask pattern, by exposing and developing the photosensitive BCB film (the upper dielectric layer) 3b. As the result, the concave 52 is formed along the upper region of a high frequency transmission line. The high frequency transmission line is composed of the metal strip 36d and the metal strip 31, the input metal strip and other metal strips aligned on a line. The metal strip 31 and the input metal strip, both omitted in the illustration in FIGS. 5D to 5G are the metal strips located at prescribed positions on the line extending perpendicularly from the plane of the paper. Three different sectional views are shown side by side in FIG. 5H, for convenience's sake. The sectional views of central and right sides of FIG. 5H are the sectional views in the different positions in parallel, along the direction perpendicular to the cross-section shown in FIGS. 5A to 5G, respectively. Therefore, the two concaves 52 shown in the sectional views of central and right sides of FIG. 5H respectively continue so as to form a single valley. The sectional view of left side of FIG. 5H is a sectional view along the directions perpendicular to the sectional views of central and right sides. At the bottom of the concave 52, contact portion of metal strip 36d is exposed again, because the photosensitive BCB film (the upper dielectric layer) 3b over the metal strip 36d are removed. That is to say, via holes 5d1 and 5d2 over the metal strip 36d are automatically formed again. Like this way, by exposure and development of the photosensitive BCB film (the upper dielectric layer) 3b, the BCB film (the upper dielectric layer) 3b remains except for the concave 52, and the valley 52 is formed on the high frequency transmission line of the CPW structure.

Figure 5I:
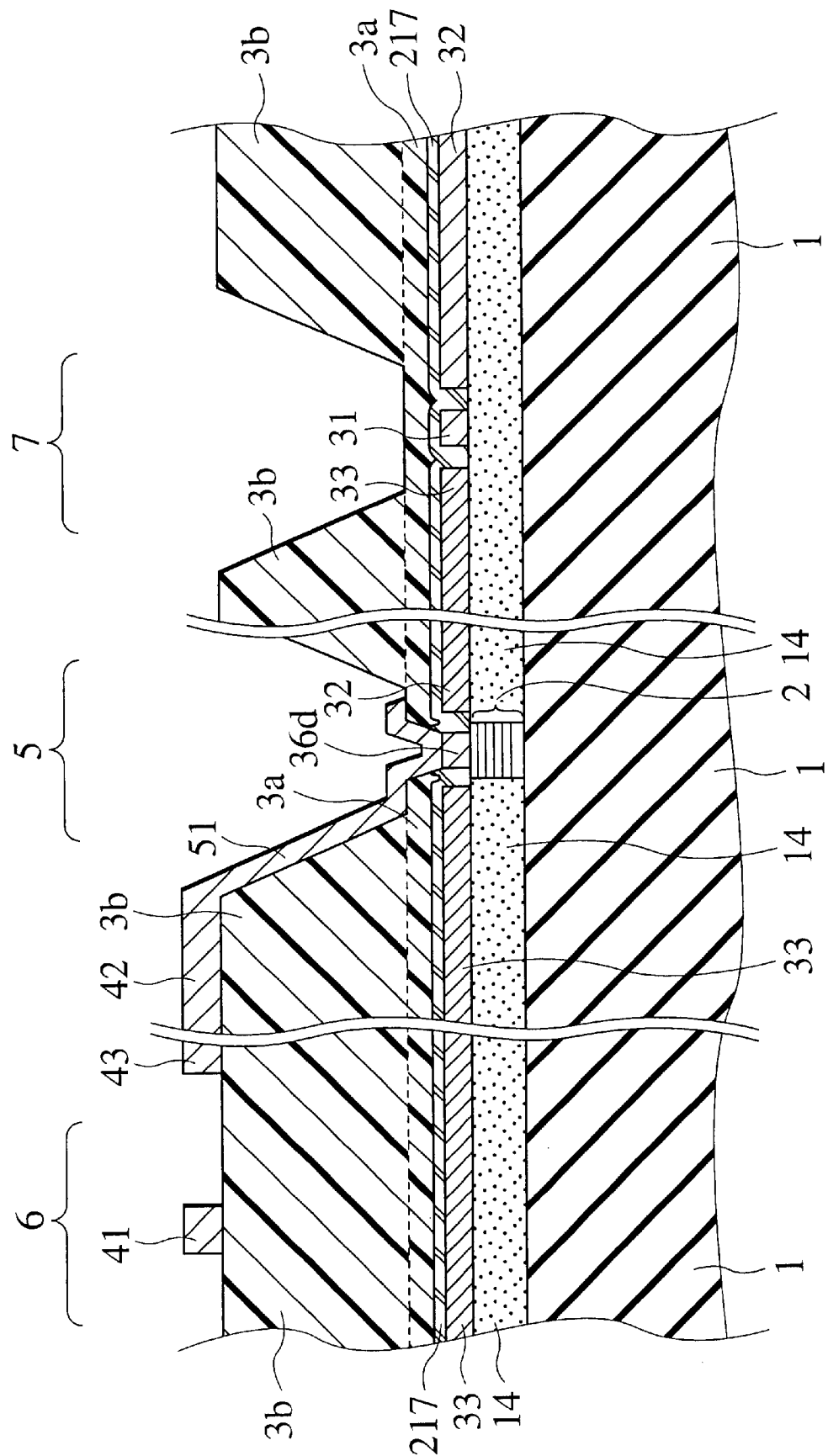

(g) Then another photoresist film is coated over the whole surface of BCB film (the upper dielectric layer) 3b having the concave (the valley) 52. At predetermined positions such as wiring pattern portions for second metal layer, or the portions just over the metal strip 36d, windows are opened in the photoresist film by photolithography so as to form a photoresist pattern. Then, over the photoresist pattern with these windows, metal materials such as Au are deposited by vacuum evaporation or sputtering method, and the photoresist pattern is removed afterwards. By this lift-off process, the second metal layer having the predetermined pattern such as the second metal strip 41, another wirings 42, 43 and sidewall metal of 51 extending to the via hole portion 5 are formed as shown in FIG. 5I. As well as FIG. 5H, for convenience's sake, in FIG. 5I, different three sectional views are shown adjacently. The sectional views of central and right sides of FIG. 5I are sectional views in parallel and different positions, and the concaves 52 continue between them. The sectional view of left side of FIG. 5I is a sectional view along the direction perpendicular to the sectional views of central and right sides. In this way, the second metal strip 41 and the first ground metal plate 33 constitute the TFMSL 6.

In this way, the sequence of manufacturing processes of the high frequency semiconductor device according to the first embodiment is accomplished.

In the manufacturing processes of the high frequency semiconductor device according to the first embodiment, on the resin film (the lower dielectric layer) 3 such as the BCB film, the photosensitive BCB film (the upper dielectric layer) 3b is coated, as shown in FIG. 5F and FIG. 5H. Hence, by this double coating method, the thickness of the dielectric thin film is precisely controlled to have predetermined different values, which are determined as the function of the spatial location. That is to say, at first, the lower dielectric layer 3a is made by the thin BCB resin 3a coated on the CPW 7 to define precisely the thin part of the dielectric thin layer. The thickness of the thin part of the dielectric thin layer may be, for example, 1 μm. And next, the upper dielectric layer 3b is coated on the lower dielectric layer 3a to define the thick part of the dielectric thin layer, or to define a total thickness of the BCB resins 3a and 3b for the TFMSL portion 6. The thickness of the upper dielectric layer 3b may be, for example, 9 μm, and the total thickness of the BCB resins 3a and 3b for the TFMSL portion 6 becomes 10 μm, for example. Then, the thin and thick parts of the dielectric thin layer are formed respectively with a good controllability of the thickness.

And, it is possible that the taper angle of the concave 52 can be adjusted to a desired value, by controlling the light exposure condition for the photosensitive BCB film (the upper dielectric layer) 3b. As the result, it is possible to loosen the taper angle at the boundary between the thick dielectric thin film (3a and 3b) and the thin dielectric thin film 3a as shown in FIG. 5I. Therefore, it is possible to reduce the open circuit failures at the connection part between the metal strip 41 of the TFMSL 6, formed by the second metal layer, and the metal strip 36d, formed by the first metal layer.

FIGS. 6A to 6E are process sectional views explaining another sequence of manufacturing processes of a modification of the high frequency semiconductor device according to the first embodiment. However, the first ground metal plate 33 is not connected to the source ohmic electrode as shown in FIGS. 5D to 5G in this modification. In short, in this modification of the high frequency semiconductor device according to the first embodiment, it is configured such that an independent potential can be applied to the source ohmic electrode. The sectional views of central and right sides of FIGS. 6A to 6E are the sectional views in parallel but at different positions. The sectional view of left side is perpendicular to the sectional views of the central and right sides.

(a) FIG. 6A is a sectional view corresponding to and approximately same as the sectional view shown in FIG. 5G. Namely, the sectional views of central and right sides of FIG. 6A are the sectional views along the direction perpendicular to the cross-section shown in FIG. 5G. The central view of FIG. 6A is a sectional view showing a concave 5s, disposed in a position perpendicularly shifted from the direction along the line on which the metal strip 31, shown at right side of FIG. 6A, is extending. The metal strip 31 is aligned along the line extending perpendicular to the plane of the paper. At first, a passivation film 217 is deposited on a metal strip 36s made of the first metal layer, connected to the source ohmic electrode. And a BCB resin film (a lower dielectric layer) 3a is coated on the passivation film 217, and then is hardened to have a thickness of, for example, 0.5 μm to 2 μm. Then, the BCB resin film 3a is selectively etched to expose the upper surface of metal strip 36s of the BCB resin film (the lower dielectric layer) 3a as shown in FIG. 6A.

Figure 6B:
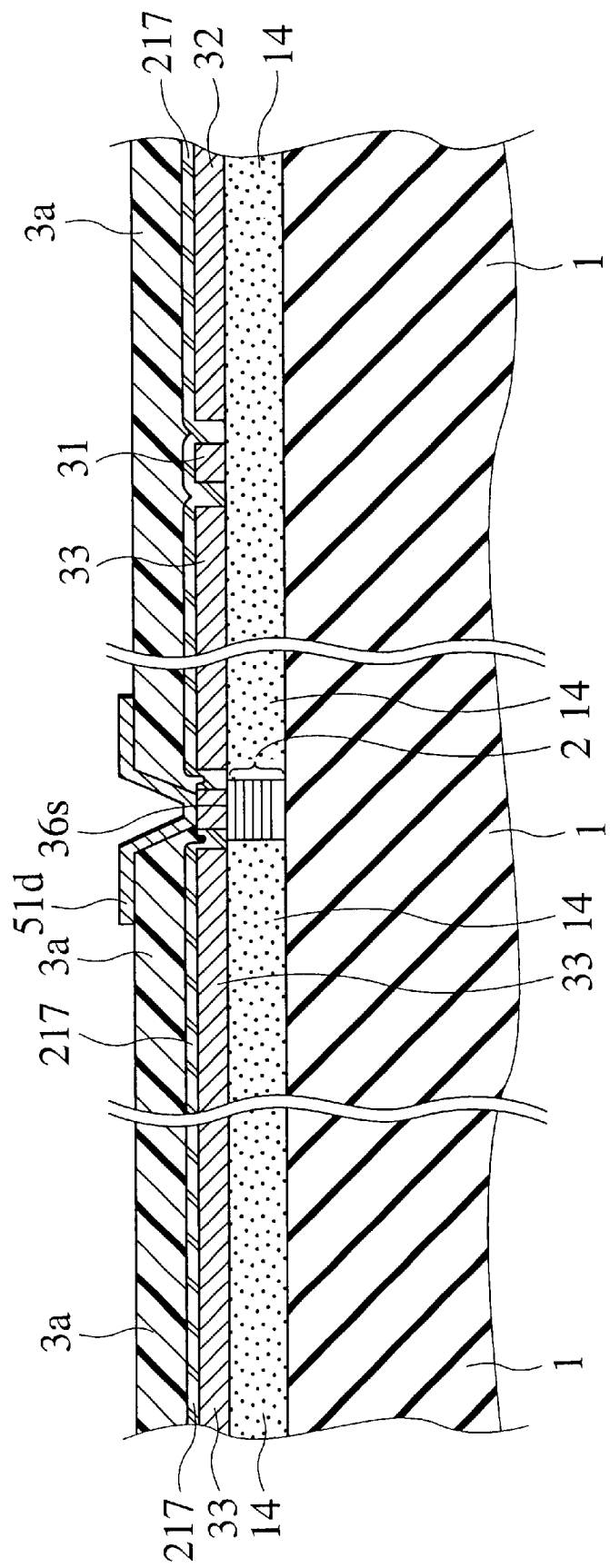

(b) Next, a photoresist film is coated on the BCB resin film (the lower dielectric layer) 3a, and the photoresist pattern having a window in the vicinity of the concave 5s is formed by the photolithography. And a metal material such as Au is deposited on the photoresist pattern serving as a backing film. Then, by the lift-off process, namely removing the backing film, a wiring pattern of a middle metal layer 51d is delineated as shown in FIG. 6B.

Figure 6C:
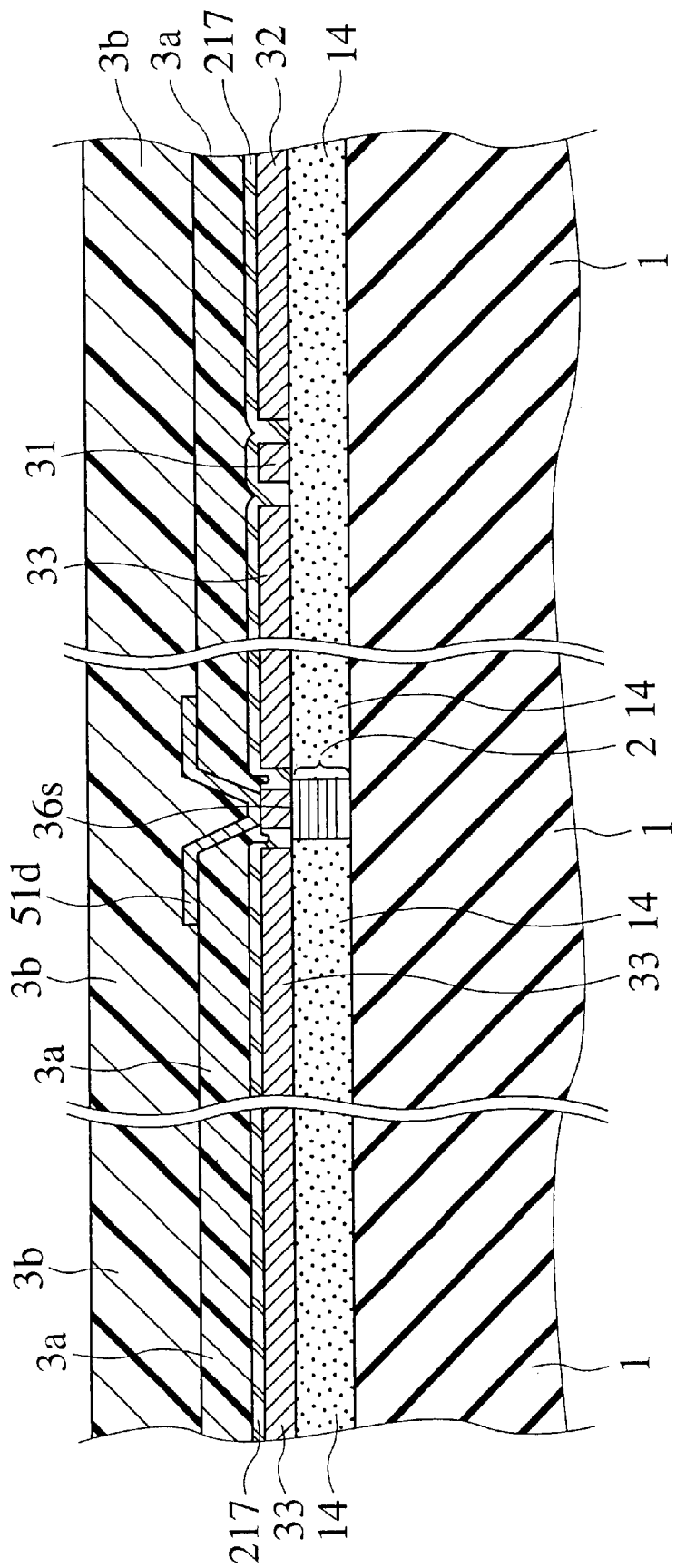
Figure 6D:
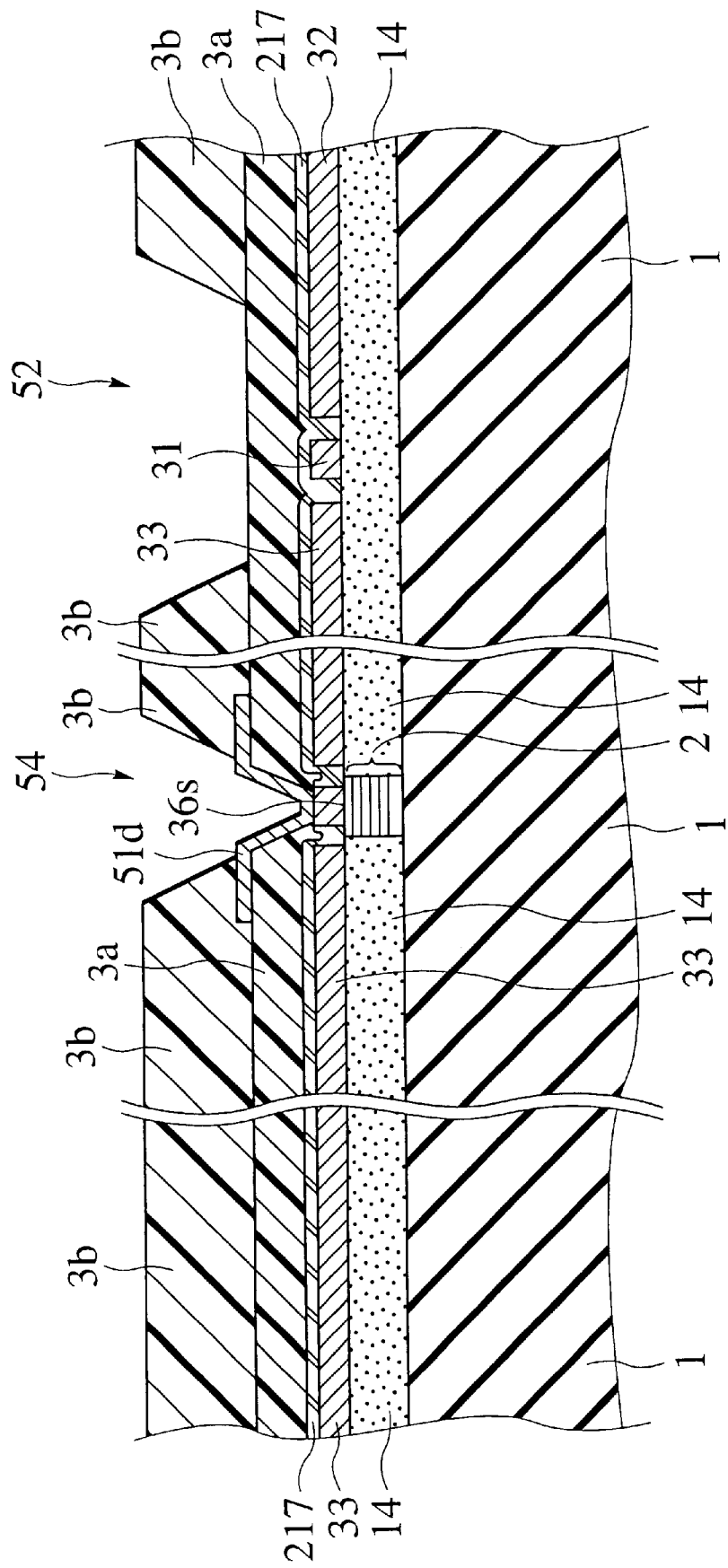

(c) Next, a photosensitive BCB film (an upper dielectric layer) 3b having a thickness of, for example, 6 μm to 15 μm is coated on the middle metal layer 51d and the BCB resin film (the lower dielectric layer) 3a as shown in FIG. 6C. Then, by exposing, with a predetermined mask pattern, and developing the photosensitive BCB film (the upper dielectric layer) 3b, a concave 52 over the metal strip 31 and another concave 54 over the middle metal layer 51d are formed as shown in FIG. 6D. The concave 52 at right side of the sectional view of FIG. 6D is a cross-section of a valley extending perpendicular to the plane of the paper. In the meantime, the concave 54 over the metal strip 36s shown at the center of FIG. 6D is separated from the valley 52, disposed in a position shifted perpendicularly from the direction of the valley 52.

(d) On the BCB film (the upper dielectric layer) 3b, a photoresist pattern having a window at a predetermined position is formed by photolithography. Then, a metal material such as Au is deposited on the photoresist pattern. By the lift-off process using the photoresist pattern, the pattern of the second metal layer, comprising metal patterns 41,42,43 and sidewall metal 51u on the sidewall of the via hole 5, is delineated, as shown in FIG. 6E.

Like this way, a sequence of manufacturing processes for the high frequency semiconductor device according to the first embodiment is accomplished. And a remarkable effectiveness is achieved so as to reduce the open circuit failure at the boundary portion between thick and thick dielectric thin films, or at the via hole portion 5, by connecting the sidewall metal 51u to the middle metal layer 51d formed between the BCB resins 3a and 3b as shown in FIG. 6E.

Though the wiring architectures of the high frequency transmission line according to the first embodiment can be applicable to both the first and second metal layers, it is the first metal layer that is fitted for finer processing and the accuracy of the metal pattern delineation is higher. Therefore, the structure using the first metal layer is most suitable for the CPW 7, requiring the finer and higher precision.

(Second Embodiment)

Figure 7A:
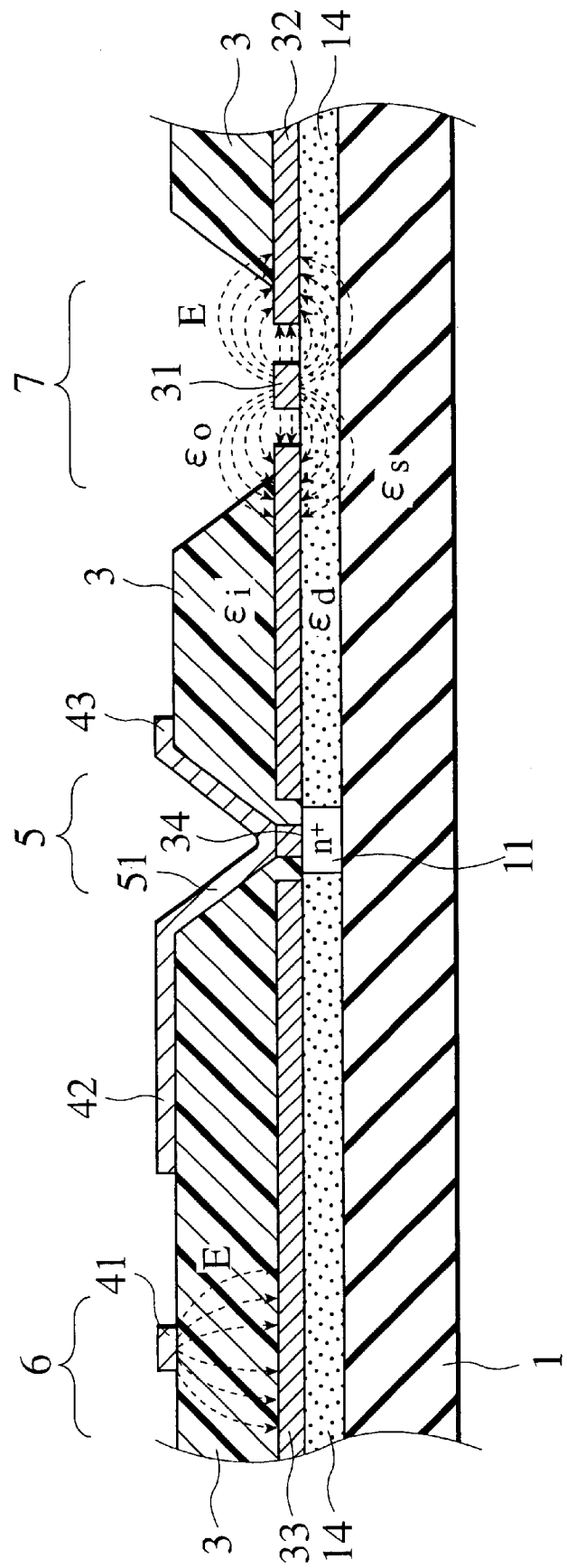
FIG. 7A is a sectional view showing a part of the structure of a high frequency semiconductor device according to a second embodiment of the present invention.

A high frequency semiconductor device according to a second embodiment of the present invention shown in FIG. 7A comprises a substrate (semiconductor substrate) 1; a first metal layer (31, 31, 34) disposed above the semiconductor substrate 1, a dielectric thin film 3 disposed, in a prescribed non-uniform way, on the first metal layer (31, 31, 34); and a second metal layer comprising a second metal strip 41, disposed on the dielectric thin film 3. Here, the first metal layer comprises a first metal strip 31, a first ground metal plate 33 and a second ground metal plate 32 sandwiching the first metal strip 31, each being isolated from the first metal strip 31. And dielectric thin film 3 is disposed at least on a part of the first ground metal plate 33 so that the dielectric structure on the first metal strip 31 differs from the dielectric structure under the second metal strip 41. Namely, the dielectric structure on the first metal strip 31 is configured such that it is different from the dielectric structure of the dielectric thin film 3 under the second metal strip 41, by a structure, not disposing the dielectric thin film 3 on the first metal strip 31.

Similar to the first embodiment, the first metal strip 31, the first ground metal plate 33 and the second ground metal plate 32 constitute a CPW 7, as shown in FIG. 7A. And the second metal strip 41, the dielectric thin film 3 and the first ground metal plate 33 constitute a TFMSL 6. In FIG. 7A broken lines between the first metal strip 31 and the first ground metal plate 33 or the second ground metal plate show the electric fields E. Also the broken lines between the second metal strip 41 and the first ground metal plate 33 show the electric fields E. The instantaneous direction of the electric fields E changes with time according to the operation frequency. However, it is different from the first embodiment, in respect of the dielectric aLg structure on the CPW 7, by making the thickness of the dielectric thin film 3 on the first metal strip 31 constituting the CPW 7 to be the zero. That is to say, it is configured such that the dielectric thin film 3 does not exist on the first metal strip 31. Therefore, the dielectric thin film 3 is selectively disposed so as to expose another part of the first ground metal plate 33 in vicinity of the first metal strip to air. Further, the surface of the first metal strip 31 and the surface of the second ground metal plate 32 are also exposed to the air. As the result, the concave is constituted as a valley extending perpendicular to the plane of the paper, disposed over the first metal strip 31, as shown at right side of FIG. 7A.

On a part of the surface of semiconductor substrate 1, n$^+$ semiconductor region 11 of high impurity concentration is stacked, as shown in FIG. 7A. An element isolation region 14 surrounds the periphery of n$^+$ semiconductor region 11. As the element isolation region 14, insulating films or a high resistivity semiconductor region generated by a proton bombardment against the GaAs substrate, etc. are usable. Then, the first metal layer (31, 32, 33, 34) consisting of the first metal strip 31, the first ground metal plate 33 and the second ground metal plate 32 and insular electrode 34 are disposed over the element isolation region 14. Insular electrode 34 is disposed in an opening (a window portion) of the first ground metal plate 33. That is to say, actually, in FIG. 7A, a couple of first ground metal plates 33 are on appearance shown in the sectional view, and it is an integrated metallic thin film which continues at back and front sides of the plane of the paper. Though the illustration is omitted, it is possible to stack a passivation film on the first metal layer (31, 32, 33, 34). Then, on the dielectric thin film 3, the second metal strip 41 and another metal patterns 42,43 are disposed so as to constitute the second metal layer (41,42,43). As a material of the dielectric thin film 3, polyimide, BCB, amorphous fluorocarbon resin explained in the first embodiment, etc. are usable.

That is to say, a via hole 5 is formed as a separated concave from the valley over metal strip 31. Then, the metal patterns 42,43 are connected to the insular electrode 34 by the sidewall metal 51 formed on the sidewall of via hole 5. It is possible to reduce the effective dielectric constant $\in_{\it{eff}}$ by using the structure of the high frequency semiconductor device according to the second embodiment, because it is the dielectric constant $\in_0$ of the air disposed on the surface side of the CPW 7 comprising the first metal layer(31, 32, 33). Therefore, the effectiveness, which can reduce the crosstalk drastically between adjacent CPWs, can be expected, while increasing the characteristic impedance $Z_0$ of the CPW 7.

In addition, the necessary occupation area for the wirings can be decreased, as a whole, while maintaining the high characteristic impedance $Z_0$, because it efficiently disposes both the TFMSL 6 and the CPW 7, similar to the first embodiment, on a limited area of the semiconductor chip as shown in FIG. 7. And, it is possible to extend the adjustable range of the characteristic impedance $Z_0$ of the CPW 7, to have a low transmission loss, and to reduce the crosstalk. By this, it is possible to improve the performance of the high frequency semiconductor integrated circuit, when the wiring structure shown in FIG. 7A is used for a high frequency semiconductor integrated circuit. And, similar to the high frequency semiconductor device according to the first embodiment, the open circuit failure of the sidewall metal 51 on the sidewall of the via hole 5 or another concave can be reduced, because it has the taper shape.

Figure 7B:
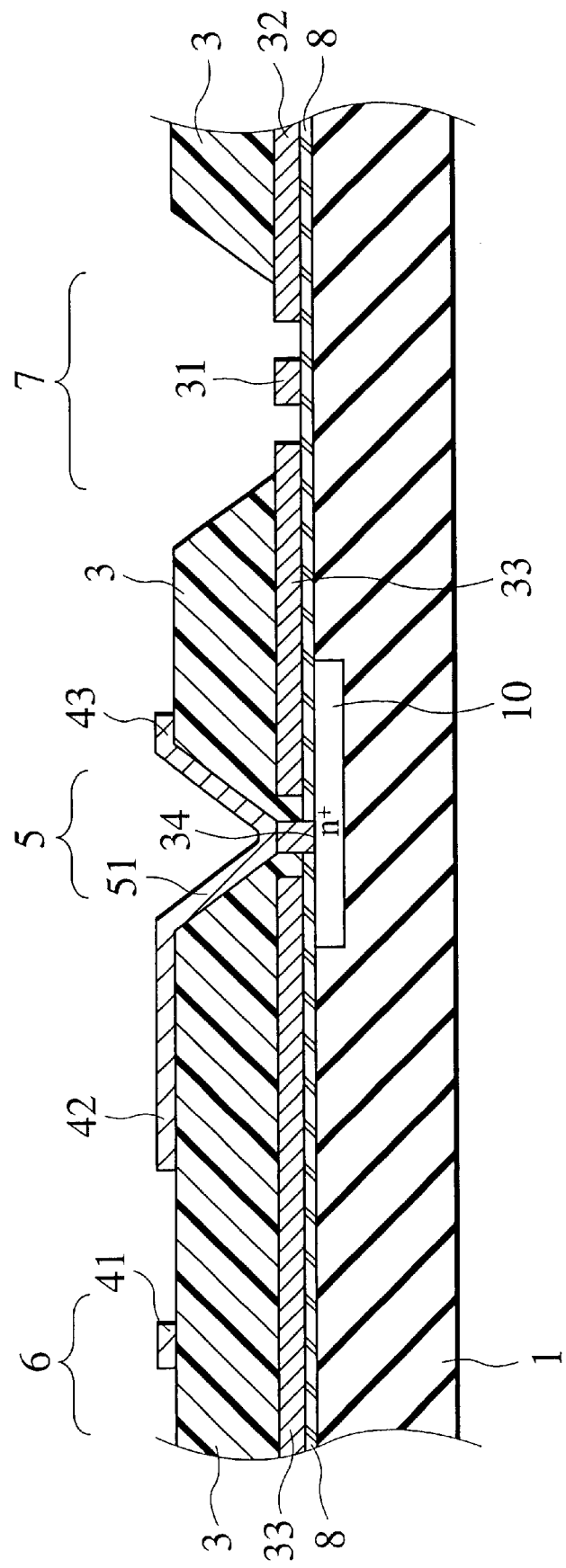
FIG. 7B is a sectional view showing a part of the structure of the high frequency semiconductor device according to a modification of the second embodiment of the present invention.

FIG. 7B is a sectional view showing a part of the structure of the high frequency semiconductor device according to a modification of the second embodiment. As well as FIG. 7A, the high frequency semiconductor device comprises a substrate (semiconductor substrate) 1; a first metal layer (31, 31, 34) disposed above the semiconductor substrate 1, a dielectric thin film 3 disposed at least on the first metal layer (31, 31, 34); and a second metal layer comprising a second metal strip 41, disposed on the dielectric thin film 3. Here, the first metal layer comprises a first metal strip 31, a first ground metal plate 33 and a second ground metal plate 32 sandwiching the first metal strip 31, each being isolated from the first metal strip. And dielectric thin film 3 is disposed at least on a part of the first ground metal plate 33. In addition, the dielectric structure on the first metal strip 31 is so configured that it is different from the dielectric structure under the second metal strip 41, by a structure, not disposing the dielectric thin film 3 on the first metal strip 31.

And, in FIG. 7B, a semiconductor region (ohmic contact region) 10 of high impurity concentration is formed at and in a part of the surface of semiconductor substrate 1. For example, the semiconductor region 10 may be implemented by an n+ diffusion region formed at and in a p type epitaxial growth layer grown on a p type GaAs substrate, or a semi-insulating GaAs substrate. Silicon nitride film ($Si_3N_4$ film) or silicon oxide film ($SiO_2$ film) as a field insulating film 8, etc. are disposed on the semiconductor region 10 and semiconductor substrate 1. Over the field insulating film (or the inter-layer insulation film) 8, the first metal layer (31, 32, 33, 34) consisting of the first metal strip 31, the first ground metal plate 33, the second ground metal plate 32 and insular electrode 34 is disposed. The insular electrode 34 is disposed in an opening of the first ground metal plate 33. That is to say, in FIG. 7B, a couple of first ground metal plates 33 are shown apparently on a sectional view, and it is an integrated metallic thin film continuing at back and front sides of the paper. The dielectric thin film 3 is stacked on the first metal layer (31, 32, 33, 34). Then, the second metal layer (41, 42, 43), comprising the second metal strip 41 and other wirings 42, 43, is arranged on this the dielectric thin film 3.

In the dielectric thin film 3, a concave constituting a via hole 5 is disposed. On the upper side of metal strip 31, as shown in the right side of FIG. 4B, is disposed a valley extending perpendicular to the plane of the paper. In the meantime, on the insular electrode 34, as shown in the center of FIG. 4B, shifted from the direction of the valley, the concave constituting via hole 5 is disposed. The concave 5 is a separated concave from the valley on the metal strip 31. Then, the metal patterns 42,43 are connected to the insular electrode 34 with a sidewall metal 51 in the via hole 5.

And the CPW 7 using the first metal strip 31, the first ground metal plate 33 and the second ground metal plate 32 is disposed in the region different from the position where the TFMSL 6 is disposed. The illustration of the electric fields E between the first metal strip 31, the first ground metal plate 33 or the second ground metal plate 32, and between the second metal strip 41 and the first ground metal plate 33 are omitted respectively to avoid the cluttering up the drawing. In FIG. 7B, the occupation area necessary for the wirings, can be decreased, because both the TFMSL 6 and the CPW 7 efficiently occupy the limited planar space. While the occupation area necessary for the wiring is decreased, it is configured such that the dielectric thin film 3 does not exist on the first metal strip 31. Namely, the dielectric thin film 3 is selectively disposed so as to expose another part of the first ground metal plate 33 in vicinity of the first metal strip to air. Further, the surface of the first metal strip 31 and the surface of the second ground metal plate 32 are also exposed to the air. As the result, the concave is constituted as a valley extending perpendicular to the plane of the paper. The valley is disposed along and over the surface of the first metal strip 31, as shown at right side of FIG. 7. And it is possible to reduce the effective dielectric constant $\in_{eff}$ of the CPW 7. Therefore, it is possible to extend the adjustable range of the characteristic impedance $Z_0$ of the CPW 7, to have a low transmission loss, and to reduce the crosstalk.

This methodology can improve the performance of the high frequency semiconductor integrated circuit, if the wiring structure shown in FIG. 7B is employed as the structure for a high frequency semiconductor integrated circuit operating at the microwave and millimeter wave bands. And further, the taper geometry from the thick to thin part of the dielectric thin film 3 can reduce the open circuit failure of the sidewall metal 51 in the via hole 5.

Figure 7C:
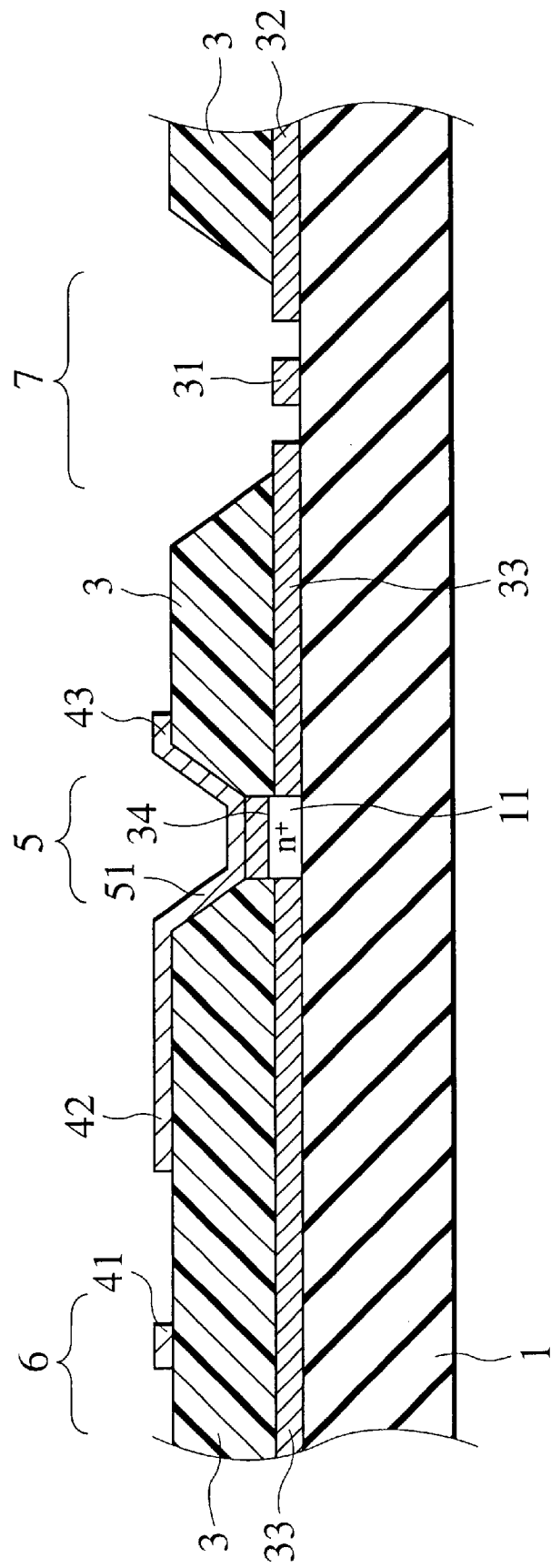
FIG. 7C is a sectional view showing a part of the structure of the high frequency semiconductor device according to another modification of the second embodiment of the present invention.

FIG. 7C is a sectional view showing a part of the structure of the high frequency semiconductor device according to another modification of the second embodiment. In FIG. 7C, a semiconductor region 11 of high impurity concentration is constituted as a convex portion at a part of the surface of semiconductor substrate 1. Other structure is similar to the structure shown in FIG. 7B, and the overlapped description or the redundant description may be omitted in this another modification of the second embodiment.

The occupation area necessary for the wirings can be decreased, because this another modification can efficiently dispose both the TFMSL 6 and the CPW 7 in a limited planar space as shown in FIG. 7C. And the dielectric thin film 3 does not exist on the first metal strip 31. Then, it is possible to reduce the effective dielectric constant $\in_{eff}$ of the CPW 7, while the occupation area necessary for the wirings is decreased. Therefore, the technical advantage, which makes possible to extend the adjustable range of the characteristic impedance $Z_0$ of the CPW 7, to have a low transmission loss, and to reduce the crosstalk are obtained.

Figure 8A:
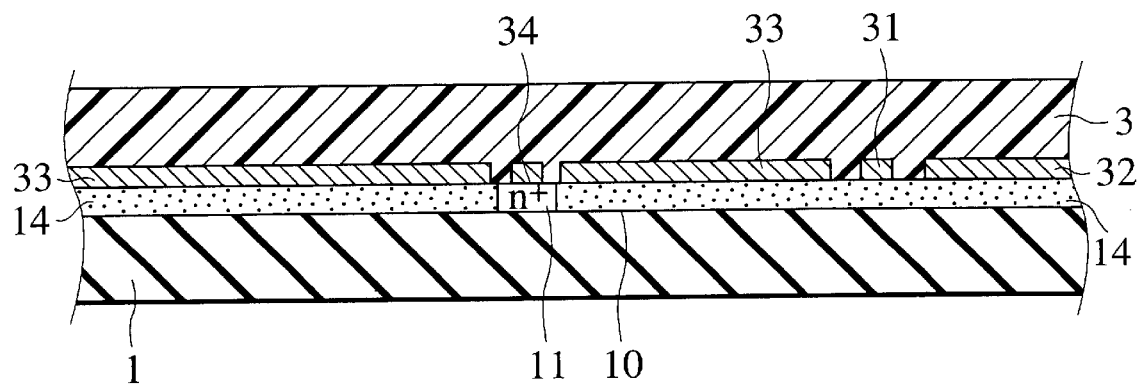
FIGS. 8A and 8B are process sectional views explaining a sequence of manufacturing processes of the high frequency semiconductor device shown in FIG. 7A.
Figure 8B:
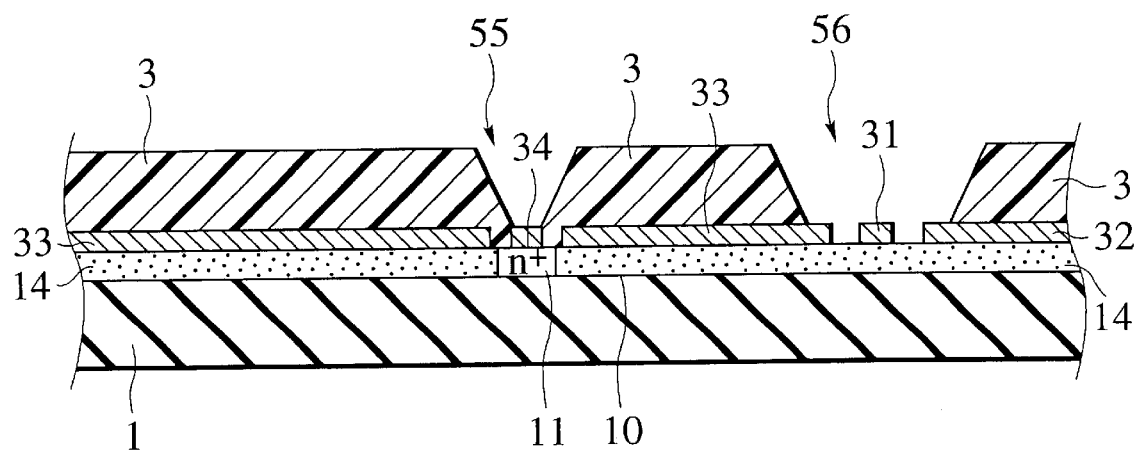

FIGS. 8A and 8B are process sectional views explaining a sequence of manufacturing processes of the high frequency semiconductor device according to the second embodiment shown in FIG. 7A.

(a) At first, an n$^+$ semiconductor region 11 is grown epitaxially on a semiconductor substrate 1 of semi-insulating GaAs, etc. by MOCVD or MBE method. Then, a predetermined portion of the n$^+$ semiconductor region 11 is selectively bombarded with proton (H$^+$) to form a high resistivity GaAs region, which will serve as an element region 14. Then a photoresist film is spin coated both on the n$^+$ semiconductor region 11 and the element region 14. And by the lift-off process, the first metal strip 31, the first ground metal plate 33 and the second ground metal plate 32 are delineated to form the CPW structure as shown in FIG. 8A. During the lift-off process, in the first ground metal plate 33, an opening is formed, and insular electrode 34 is disposed in the inside of this opening. In addition, the whole surface of wiring pattern of the first metal layer (31, 32, 33, 34) is coated with the photosensitive BCB film 3.

(b) Then, using a predetermined mask pattern, the photosensitive BCB film 3 is exposed and developed. And a valley-shaped concave 56 extending perpendicular to the plane of the paper is formed, as shown in FIG. 8B. The valley-shaped concave 56 exposes the surface of metal strip 31, the surface of the first ground metal plate 33 in the vicinity of metal strip 31 and the surface of the second ground metal plate 32 in the vicinity of metal strip 31. Simultaneously, a separated concave 55 is formed at another part of the photosensitive BCB film 3.

(c) And by the lift-off process, the second metal layer such as metal layer s 41,42,43 and sidewall metal of 51 in the via hole 5 are formed as shown in FIG. 7A. Thereby the sequence of manufacturing processes of the high frequency semiconductor device according to the second embodiment finishes.

Figure 9A:
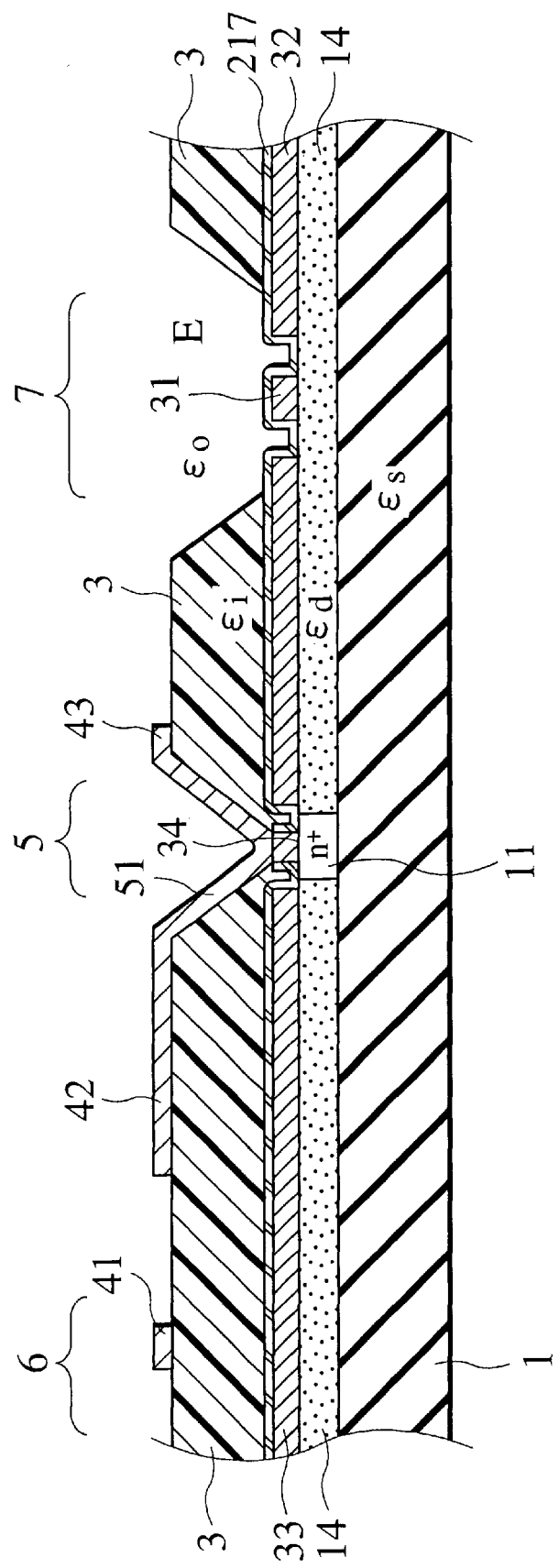
FIG. 9A is a sectional view showing a part of the structure of the high frequency semiconductor device according to a still another modification of the second embodiment of the present invention.
Figure 9B:
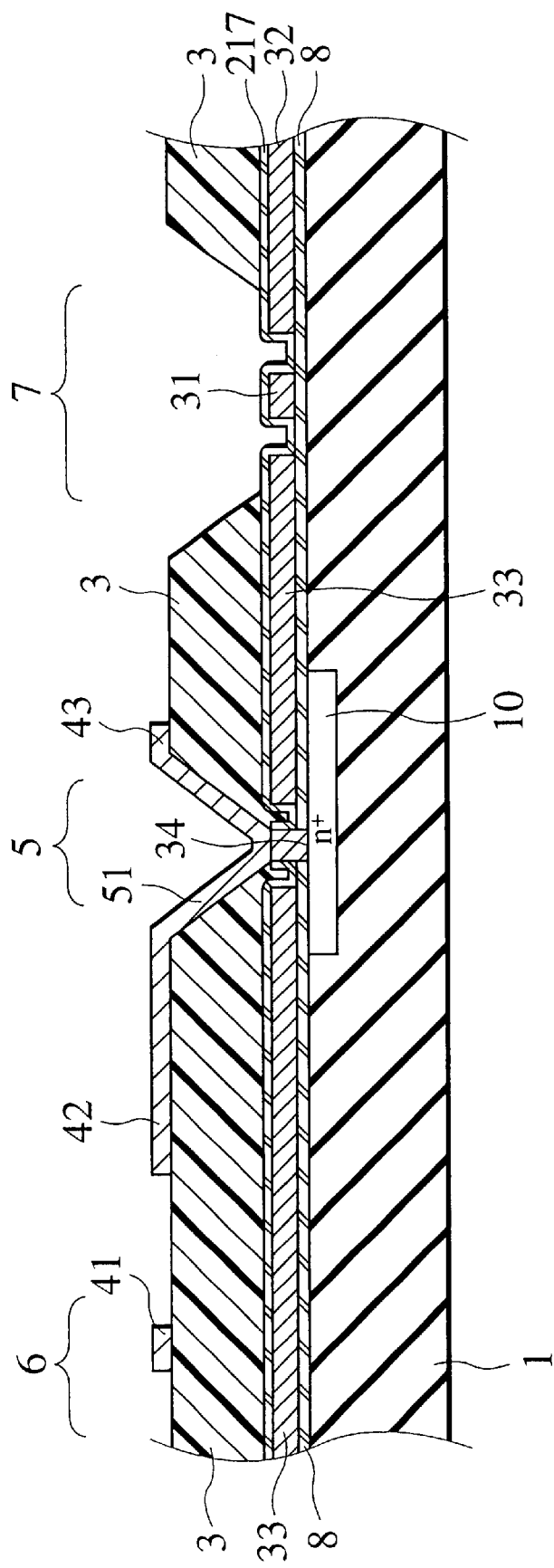
FIG. 9B is a sectional view showing a part of the structure of the high frequency semiconductor device according to a still another modification of the second embodiment of the present invention.
Figure 9C:
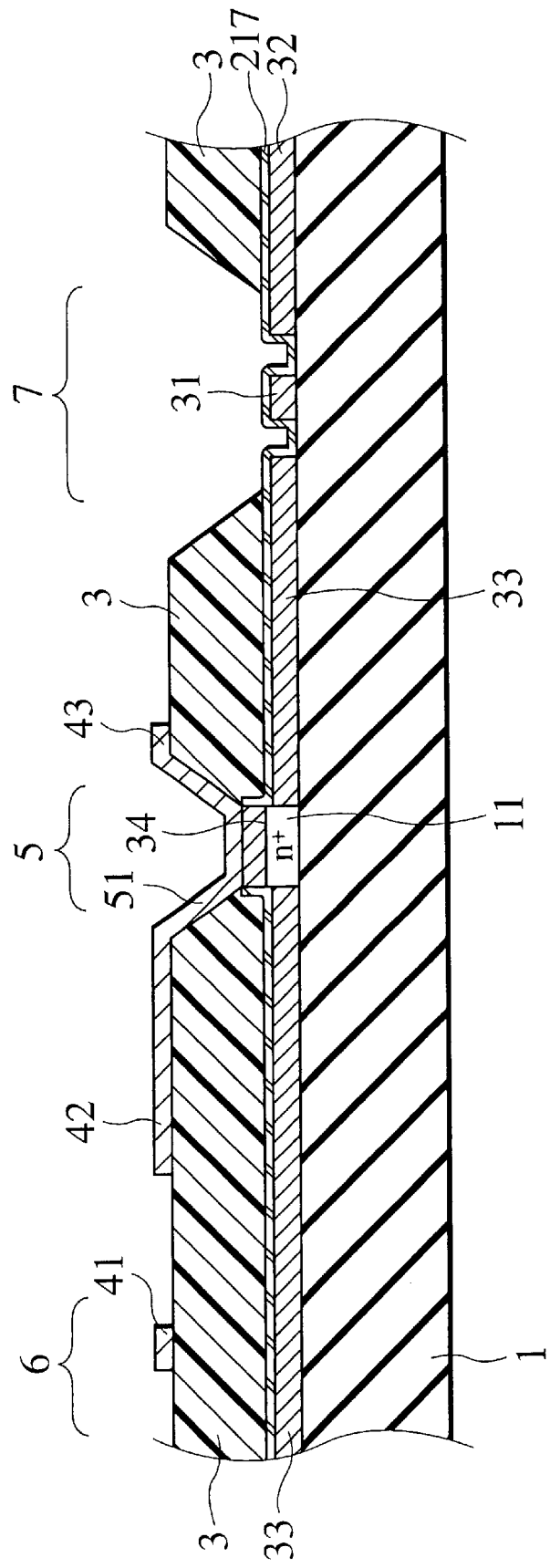
FIG. 9C is a sectional view showing a part of the structure of the high frequency semiconductor device according to a still another modification of the second embodiment of the present invention.

FIGS. 9A to 9C are sectional views showing parts of the structures of the high frequency semiconductor devices according to still another modifications of the second embodiment. In each structures of FIGS. 9A to 9C, a passivation film 217 is formed on first metal layer (31, 32, 33). And dielectric thin films 3 are selectively disposed on the passivation film 217 so as to form a concave, exposing a surface of the passivation film 217 above the first metal strip 31 and above a part of the first ground metal plate 33 in vicinity of the first metal strip 31. For the passivation film 217, silicon nitride films ($Si_3N_4$ film) or silicon oxide films ($SiO_2$ film), etc. having thickness of 100 nm to 2 $\mu$m may be used. Other structures are similar to the structures shown in FIGS. 7A to 7C, respectively, and the overlapped descriptions or the redundant descriptions may be omitted in these still another modifications of the second embodiment. In FIGS. 9A to 9C, the occupation areas necessary for the wirings, can be decreased, because these still another modifications can efficiently dispose both the TFMSL 6 and the CPW 7 in limited planar spaces, respectively. And the dielectric thin films 3 do not exist on the passivation film 217 above the first metal strip 31. Then, they are possible to reduce the effective dielectric constants $\in_{eff}$ of the CPWs 7, while the occupation areas necessary for the wirings are decreased. Therefore, the technical advantages, which make possible to extend the adjustable range of the characteristic impedance Z0 of the CPW 7, to have the low transmission loss, and to reduce the crosstalk are obtained. And further, since the passivation film 217 is covering on the first metal layer (31, 32, 33), the moisture immunity (the moisture resistance characteristic) is improved to achieve an excellent reliability.

Figure 10:
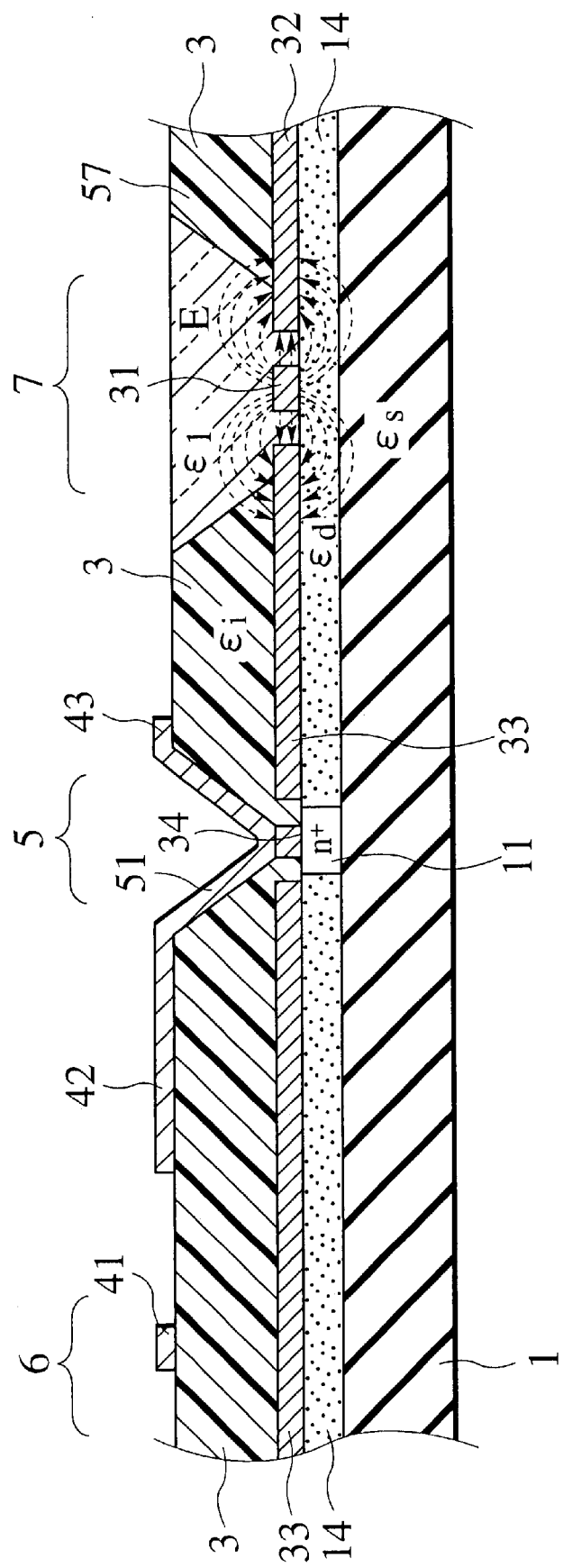
FIG. 10 is a sectional view showing a part of the structure of the high frequency semiconductor device according to a still another modification of the second embodiment of the present invention more and more.

In the high frequency semiconductor device according to the second embodiment shown in FIG. 7A, the thickness of the dielectric thin film 3 on the CPW 7 is set to be zero. It is possible to regard this fact as equivalent as a structure having a dielectric plug (air) having the dielectric constant $\in_0$ is placed on the CPW 7. Therefore, in respect of the dielectric structure on the CPW 7, to obtain a different dielectric structure from the TFMSL 6, the architecture which embeds the concave on the CPW 7 with a dielectric plug having a smaller dielectric constant $\in_1$ than dielectric constant $\in_i$ of the dielectric thin film 3 can be employed, as shown in FIG. 10. The example of the dielectric plug having the smaller dielectric constant $\in_1$ may be polytetrafluoroethylene (PTFE). In FIG. 10, the broken lines between the first metal strip 31 and the first ground metal plate 33 or the second ground metal plate show the electric fields E. The instantaneous direction of the electric fields E changes with time according to the operation frequency. However, in FIG. 10, the electric fields E between the second metal strip 41 and the first ground metal plate 33 are omitted to avoid the cluttering up the drawing. That is to say, it is possible to obtain the same effectiveness as the high frequency semiconductor device as shown in FIG. 7A, even if the surface of the dielectric thin film 3 is flattened by filling up the concave on the CPW 7 with the dielectric plug having a smaller dielectric constant $\in_1$. In addition, the metallization of the second metal layer becomes easy, because the surface of the dielectric thin film 3 is flattened, and especially, it is effective for the realization of the finer and finer structures with higher accuracy of geometrical dimensions.

(Third Embodiment)

Figure 11A:
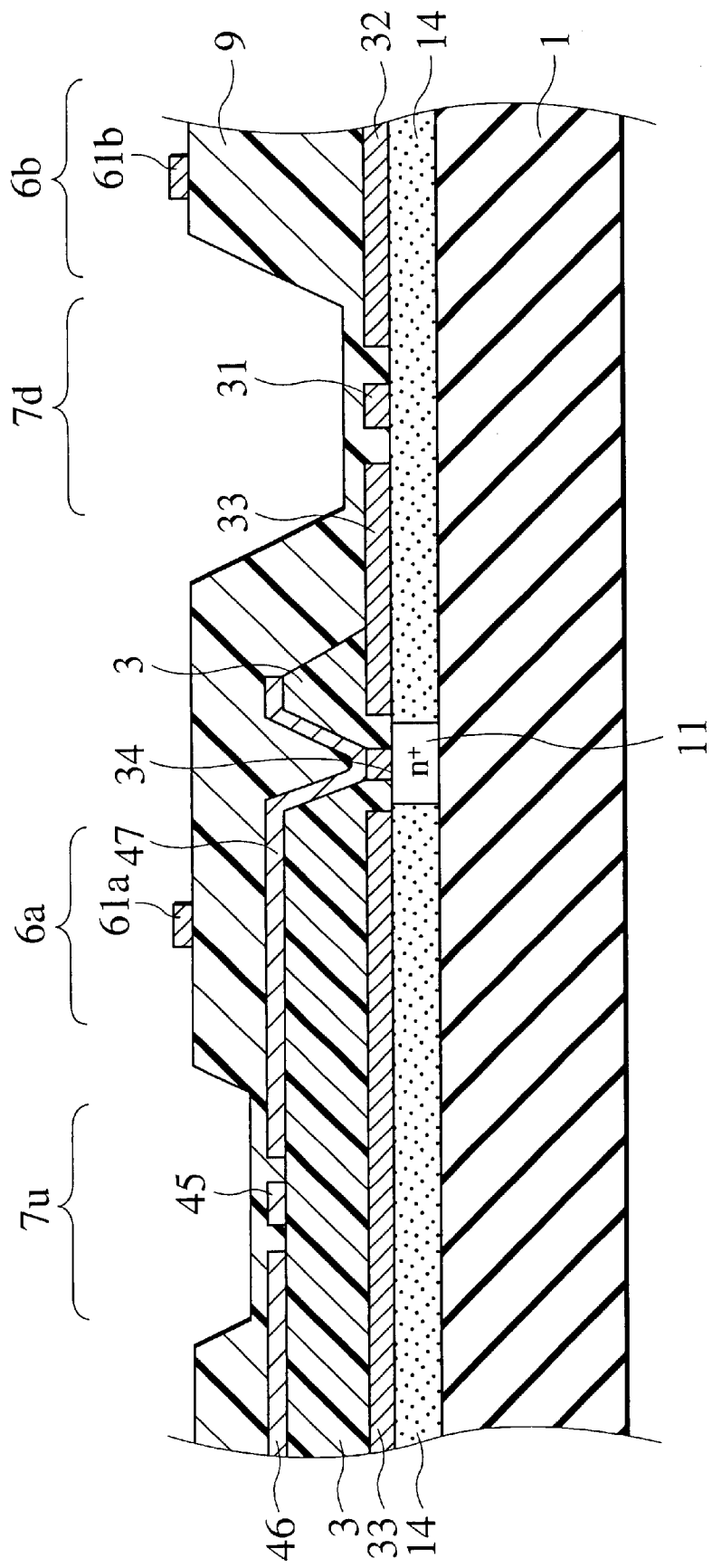
FIG. 11A is a sectional view showing a part of the structure of a high frequency semiconductor device according to a third embodiment of the present invention.

A high frequency semiconductor device according to a third embodiment of the present invention shown in FIG. 11A comprises a substrate (semiconductor substrate) 1; a first metal layer (31, 31, 34) disposed above the semiconductor substrate 1, a first dielectric thin film 3 disposed, in a prescribed non-uniform way, on the first metal layer (31, 31, 34); and a second metal layer comprising a second metal strip 45, disposed on the first dielectric thin film 3. Here, the first metal layer (31, 31, 34) comprises a first metal strip 31, a first ground metal plate 33 and a second ground metal plate 32 sandwiching the first metal strip 31, each being isolated from the first metal strip 31 so as to constitute a first CPW 7d. And the first dielectric thin film 3 is disposed at least on a part of the first ground metal plate 33. The high frequency semiconductor device according to the third embodiment further comprises a third ground metal plate 46 and a fourth ground metal plate 47 sandwiching the second metal strip 45, both disposed on the first dielectric thin film 3 so as to constitute a second CPW 7u. And the high frequency semiconductor device further comprises a second dielectric thin film 9 disposed at least on a part of the fourth ground pattern 47 and a third metal strip 61a disposed on the second dielectric thin film 9. The third metal strip 61a, the second dielectric thin film 9 and the fourth ground metal plate 47 constitute a first TFMSL 6a. The second dielectric thin film 9 is further disposed in a predetermined way on the surfaces of the first metal strip 31, the first ground metal plate 33 and the second ground metal plate 32. And a fourth metal strip 61b is disposed on the second dielectric thin film 9 so as to constitute a second TFMSL 6b, using the second ground metal plate 32.

In the high frequency semiconductor device according to the third embodiment, there is an extension part of the second dielectric thin film 9, having thickness thinner than the thickness of parts just under the third metal strips 61a and 61b. And the extension part is disposed on the first metal strip 31. Further, there is another extension part of the second dielectric thin film 9, having thickness thinner than the thickness of parts just under the third metal strips 61a and 61b. The another extension part is disposed on the second metal strip 45 as shown in FIG. 11A. Namely, at each top surface of the first metal strip 31 and the second metal strip 45, the thickness of the second dielectric thin film 9 is made thinner than the thickness of the parts constituting the first TFMSL 6a and the second TFMSL 6b so that the dielectric structures on the first metal strip 31 and the second metal strip 45 are different from the dielectric structure of the first TFMSL portions 6a.

As materials of the first dielectric thin film 3 and the second dielectric thin film 9, polyimide, BCB, amorphous fluorocarbon resin, which respectively explained in the first embodiment, etc., are usable.

On a part of the surface of semiconductor substrate 1, $n^+$ semiconductor region 11 of high impurity concentration is stacked, as shown in FIG. 11A. An element isolation region 14 surrounds the periphery of n⁺ semiconductor region 11. As the element isolation region 14, an insulating film or a proton bombarded high resistivity semiconductor region is usable. Then, the first metal layer (31, 32, 33, 34) consisting of the first metal strip 31, the first ground metal plate 33 and the second ground metal plate 32 and the insular electrode 34 is disposed over the element isolation region 14. The insular electrode 34 is disposed in an opening of the first ground metal plate 33. Then, on the first dielectric thin film 3, the second metal strip 45, the third and fourth ground metal plates 46, 47 are disposed so as to constitute the second metal layer (45,46,47). The third metal strips 61a and 61b serve as a third metal layer.

Unlike the first and second embodiments, the high frequency semiconductor device according to the third embodiment comprises the double dielectric layers consisting of the first dielectric thin film 3 and the second dielectric thin film 9, and the triple metal layers consisting of the first metal layer (31, 32, 33, 34), the second metal layer (45,46,47) and the third metal layer (61a, 61b). Then, the occupation area necessary for the wirings, can be decreased, because the first TFMSL 6a second TFMSL 6b, the first CPW 7d and the second CPW 7u are efficiently disposed as shown in FIG. 11A. As stated above, the thickness of the second dielectric thin film 9 is configured such that the thicknesses on the second CPW 7u and on the first CPW 7d are made thinner than the thickness associated with the first TFMSL 6a and the second TFMSL 6b. Therefore, it is possible to reduce the effective dielectric constants $\in_{eff}$ of the first CPW 7d and the second CPW 7u, while maintaining a small chip area. Therefore, it is possible to extend the adjustable range of the first CPW 7d and the second CPW 7u, increasing the characteristic impedance $Z_0$. And, according to the high frequency semiconductor device of the third embodiment, it is possible to reduce the transmission loss and the crosstalk. By this, it is possible to improve the performance of the high frequency semiconductor integrated circuit, when the wiring structure shown in FIG. 11A is used for a high frequency semiconductor integrated circuit operating in the microwave and millimeter wave bands.

Figure 11B:
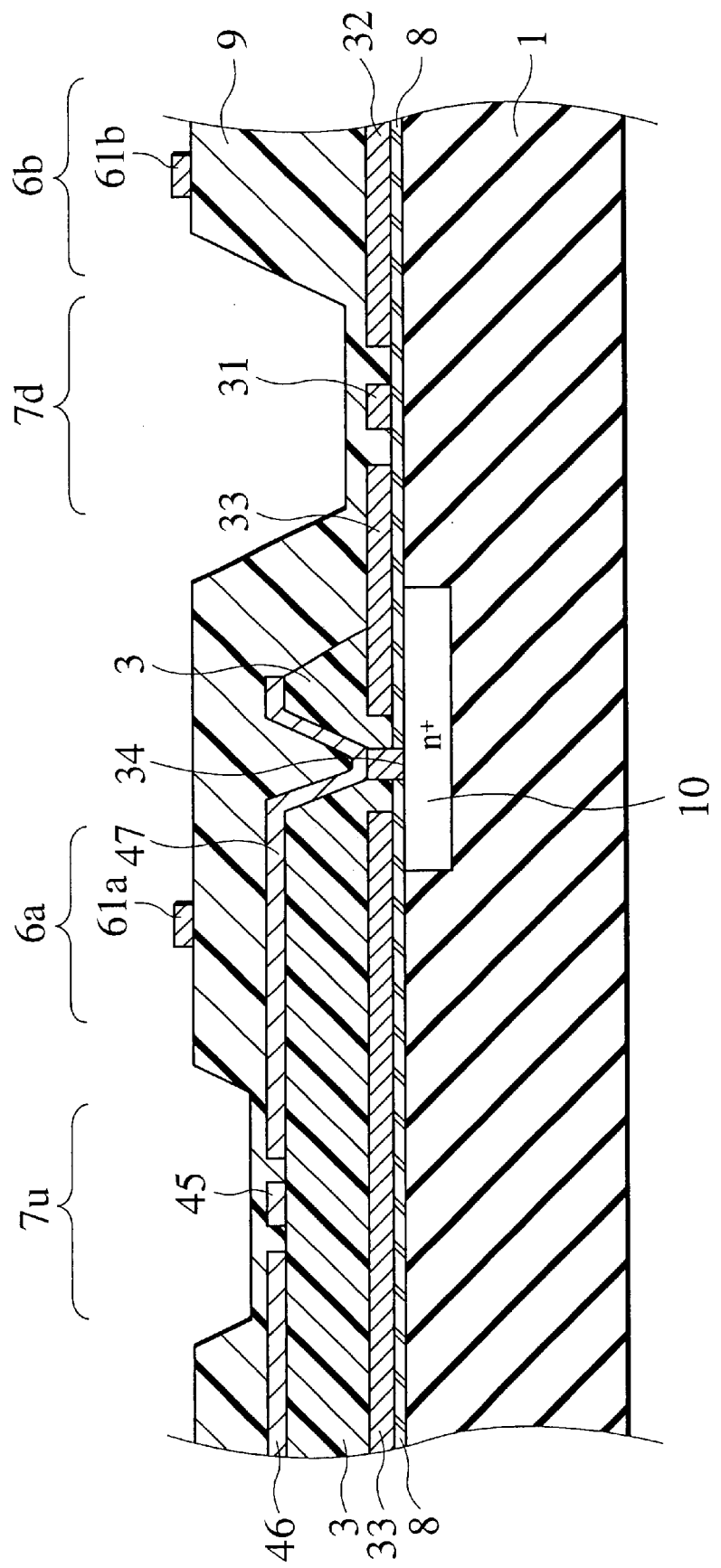
FIG. 11B is a sectional view showing a part of the structure of the high frequency semiconductor device according to a modification of the third embodiment of the present invention.

FIG. 11B is a sectional view showing a part of the structure of the high frequency semiconductor device according to a modification of the third embodiment of the present invention. As well as FIG. 11A high frequency semiconductor device comprises a substrate (semiconductor substrate) 1; a first metal layer (31, 31, 34) disposed above the semiconductor substrate 1, a first dielectric thin film 3 disposed, in a prescribed non-uniform way on the first metal layer (31, 31, 34); and a second metal layer (45, 46, 47) disposed on the first dielectric thin film 3; a second dielectric thin film 9 disposed, in a prescribed non-uniform way on the second metal layer (45, 46, 47); and a third metal layer (61a, 61b) disposed on the second dielectric thin film 9. Here, the first metal layer comprises a first metal strip 31, a first ground metal plate 33 and a second ground metal plate 32 sandwiching the first metal strip 31, each being isolated from the first metal strip so as to compose a first CPW 7d. And the second metal layer comprises a second metal strip 45, a third ground metal plate 46 and a fourth ground metal plate 47 sandwiching the second metal strip 45, each being isolated from the second metal strip 45 so as to compose a second CPW 7u.

The first dielectric thin film 3 is disposed at least on a part of the first ground metal plate 33, and the second dielectric thin film 9 is disposed at least on a part of the fourth ground metal plate 47, so that the dielectric structures on the first metal strip 31 and the second metal strip 45 are different from the dielectric structure under the third metal strips 61a and 61b, by the structure shown in FIG. 11B. There is an extension part of the second dielectric thin film 9, having thickness thinner than the thickness of parts just under the third metal strips 61a and 61b, and the extension part is disposed on the first metal strip 31. Further, there is another extension part of the second dielectric thin film 9, having thickness thinner than the thickness of parts just under the third metal strips 61a and 61b, the another extension part is disposed on the second metal strip 45 as shown in FIG. 11B. Namely, at each top surface of the first metal strip 31 and the second metal strip 45, the thickness of the second dielectric thin film 9 is made thinner than the thickness of the parts constituting the first TFMSL 6a and the second TFMSL 6b. Here, the first TFMSL 6a comprising the third metal strip 61a, the second dielectric thin film 9 and the fourth ground metal plate 47, and the second TFMSL 6b comprising the fourth metal strip 61b, the second dielectric thin film 9 and the second ground metal plate 32.

And, in FIG. 11B, a semiconductor region (ohmic contact region) 10 of high impurity concentration is formed at and in a part of the surface of semiconductor substrate 1. For example, the semiconductor region 10 may be implemented by an n+ diffusion region formed at and in a p type epitaxial growth layer grown on a p type GaAs substrate, or a semi-insulating GaAs substrate. Silicon nitride film ($Si_3N_4$ film) or silicon oxide film ($SiO_2$ film) as a field insulating film 8, etc. is disposed on the semiconductor region 10 and semiconductor substrate 1. Over the field insulating film 8, the first metal layer (31, 32, 33, 34) is disposed. The insular electrode 34 is disposed in an opening of the first ground metal plate 33. The first dielectric thin film 3 is stacked on the first metal layer (31, 32, 33, 34). Then, the second metal layer (45, 46, 47), comprising the second metal strip 45 and other wirings 46, 47 is arranged on this the first dielectric thin film 3. And the second dielectric thin film 9 is disposed on the second metal layer (45, 46, 47). Finally, the third metal layer (61a, 61b) is disposed on the second dielectric thin film 9.

Then, the chip area can be decreased similar to the structure shown in FIG. 11A, because the first TFMSL 6a second TFMSL 6b, the first CPW 7d and the second CPW 7u are efficiently disposed on a semiconductor chip. While maintaining the occupation area so small, the dielectric structures on the first CPW 7d and the second CPW 7u can be made to different from the dielectric structures of the first TFMSL 6a and the second TFMSL 6b, by thinning the thickness of the corresponding parts of the second dielectric thin film 9 so that the effective dielectric constant $\in_{eff}$ of the first CPW 7d and the second CPW 7u is reduced. Therefore, it is possible to extend the adjustable range of the characteristic impedance $Z_0$ associated with the first CPW 7d and the CPW 7u. And, it is possible to have a low transmission loss, reducing the crosstalk.

Figure 11C:
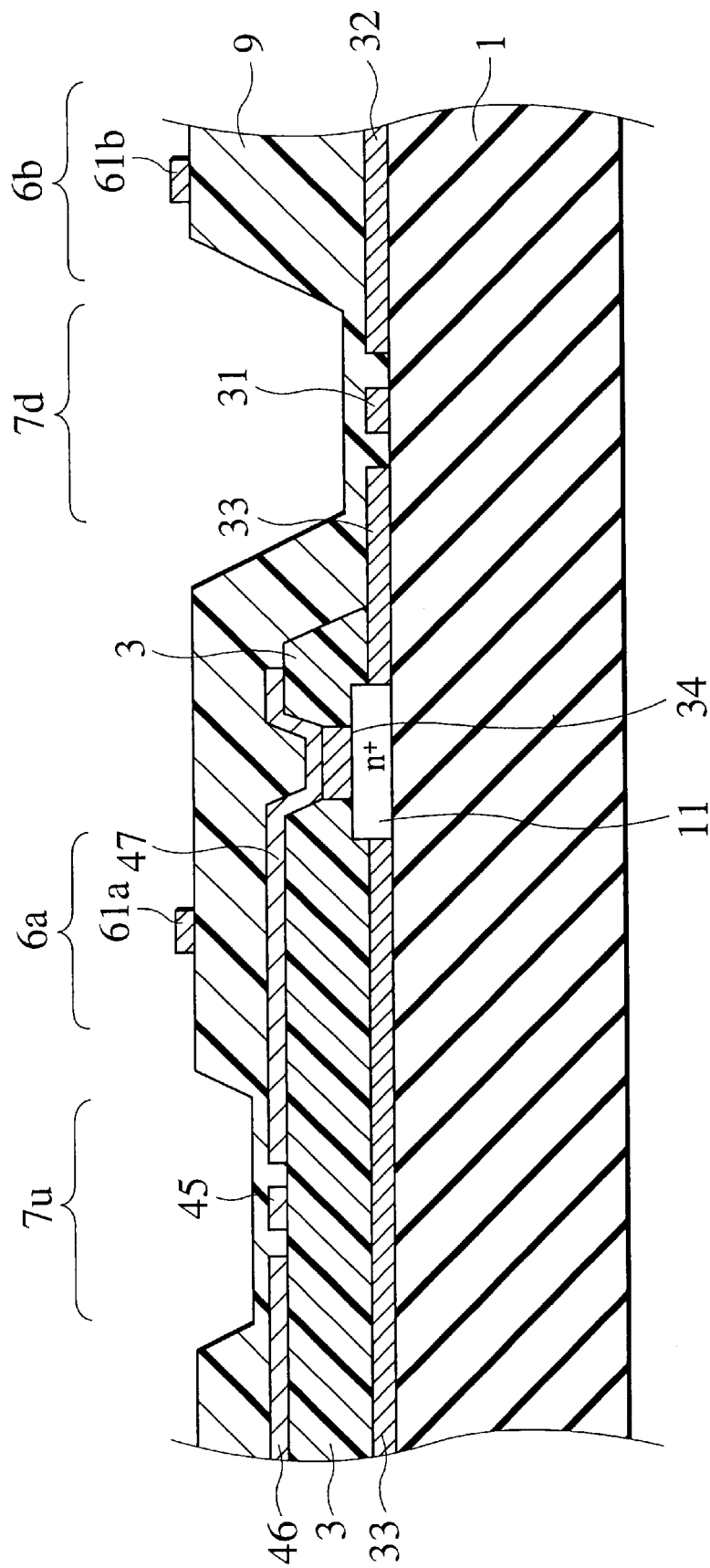
FIG. 11C is a sectional view showing a part of the structure of the high frequency semiconductor device according to another modification of the third embodiment of the present invention.

FIG. 11C is a sectional view showing a part of the structure of the high frequency semiconductor device according to another modification of the third embodiment of the present invention. In FIG. 11C, semiconductor region 11 of high impurity concentration is configured such that it constitutes the convex portion on a part of the surface of semiconductor substrate 1. Then, a field insulating film 8 is disposed on the semiconductor region 11. Overlapped description of the structure shown in FIG. 11C with already explained in FIG. 11B is omitted here. The thickness of dielectric thin film 9 over the first CPW 7d and the second CPW 7u is thinned so that the dielectric structures on the first CPW 7d and the second CPW 7u are different from the dielectric structures of the first TFMSL 6a and the second TFMSL 6b, even in the double dielectric thin film structure, and it is possible to obtain the similar effectiveness as the first and second embodiment.

Figure 12:
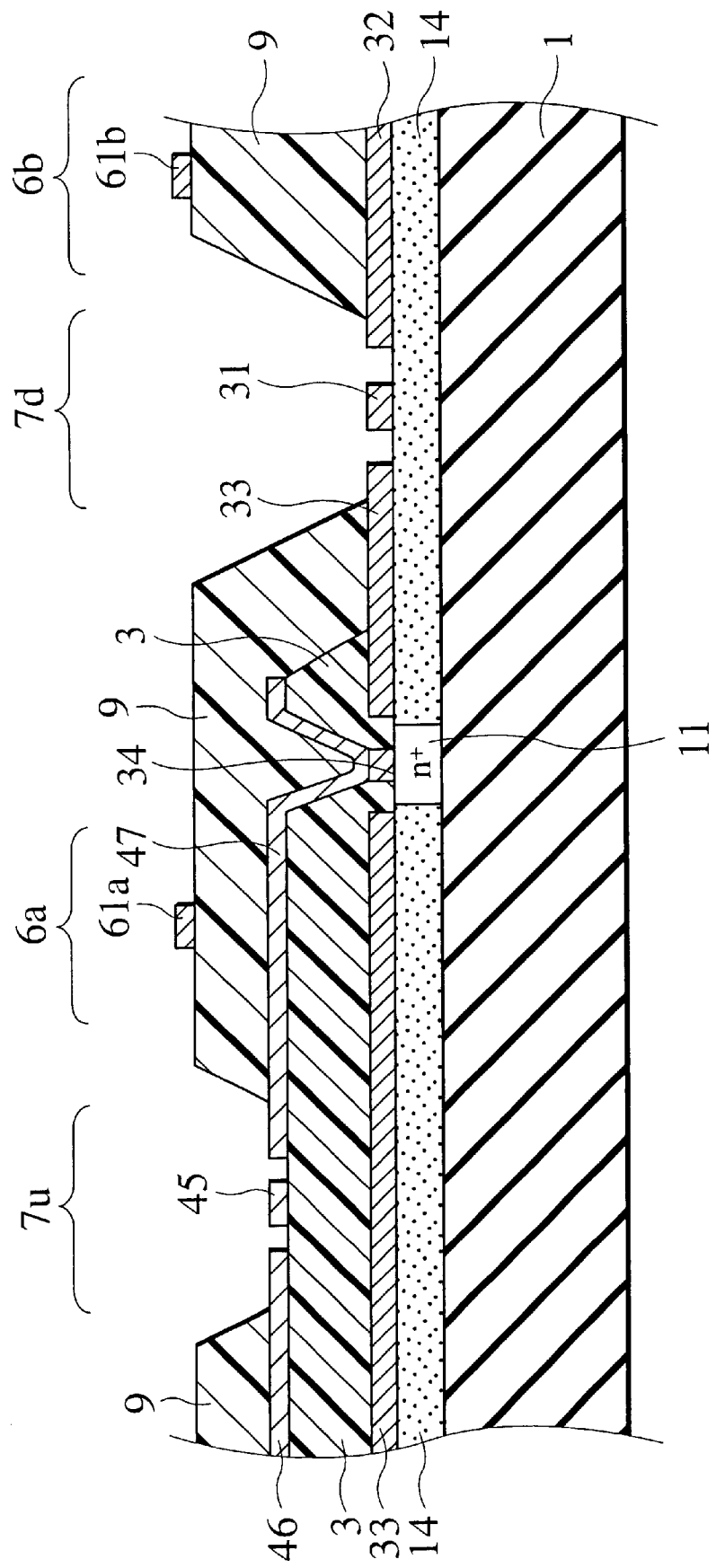
FIG. 12 is a sectional view showing a part of the structure of the high frequency semiconductor device according to a still another modification of the third embodiment of the present invention.

FIG. 12 shows a high frequency semiconductor device according to a still another modification of the third embodiment. In the high frequency semiconductor device shown in FIG. 12, the second dielectric thin film 9 is selectively disposed on the first ground metal plate 33 so as to expose a part of the surface of the first ground metal plate 33 in vicinity of the first metal strip 31. The second dielectric thin film 9 is further selectively disposed on the second ground metal plate 32 so as to expose a part of the surface of the second ground metal plate 32 in vicinity of the first metal strip 31. And the second dielectric thin film 9 is not disposed on the first metal strip 31 so that the dielectric structure on the first metal strip 31 is different from the dielectric structures under the third metal strips 61a and 61b. Further as shown in FIG. 12, the second dielectric thin film 9 is disposed on the fourth ground metal plate 47 so as to expose a part of the surface of the fourth ground metal plate 47 in vicinity of the second metal strip 45, a part of the surface of the third ground metal plate 46 in vicinity of the second metal strip 45, and the surface of the second metal strip 45 so that the dielectric structure on the second metal strip 45 is different from the dielectric structures under the third metal strips 61a and 61b. Here, the first CPW 7d and the second CPW 7u are constructed by the first metal layer (31, 31, 34) and the second metal layer (45,46,47), respectively. And the first TFMSL 6a is composed of the fourth ground metal plate 47, the second dielectric thin film 9 and the third metal strip 61a, and the second TFMSL 6b is composed of the second ground metal plate 32, the second dielectric thin film 9 and the fourth metal strip 61b. Overlapped description is omitted with the structure as shown in FIGS. 11A and 11B, here.

It is possible to reduce the effective dielectric constants $\in_{eff}$ of the first CPW 7d and the second CPW 7u, by the structure as shown in FIG. 12, the structure having the partly exposed first metal layer (31, 32, 33) and the partly exposed second metal layer (45,46,47), than those of the structure already shown in FIGS. 11A to 11C. Therefore, the structure shown in FIG. 12 can further reduce the crosstalk between the CPWs (the illustration of other CPWs are omitted), when they adjoin with the first CPW 7d and the second CPW 7u, increasing further the characteristic impedances $Z_0$ of the first CPW 7d and the second CPW 7u.

Figure 13:
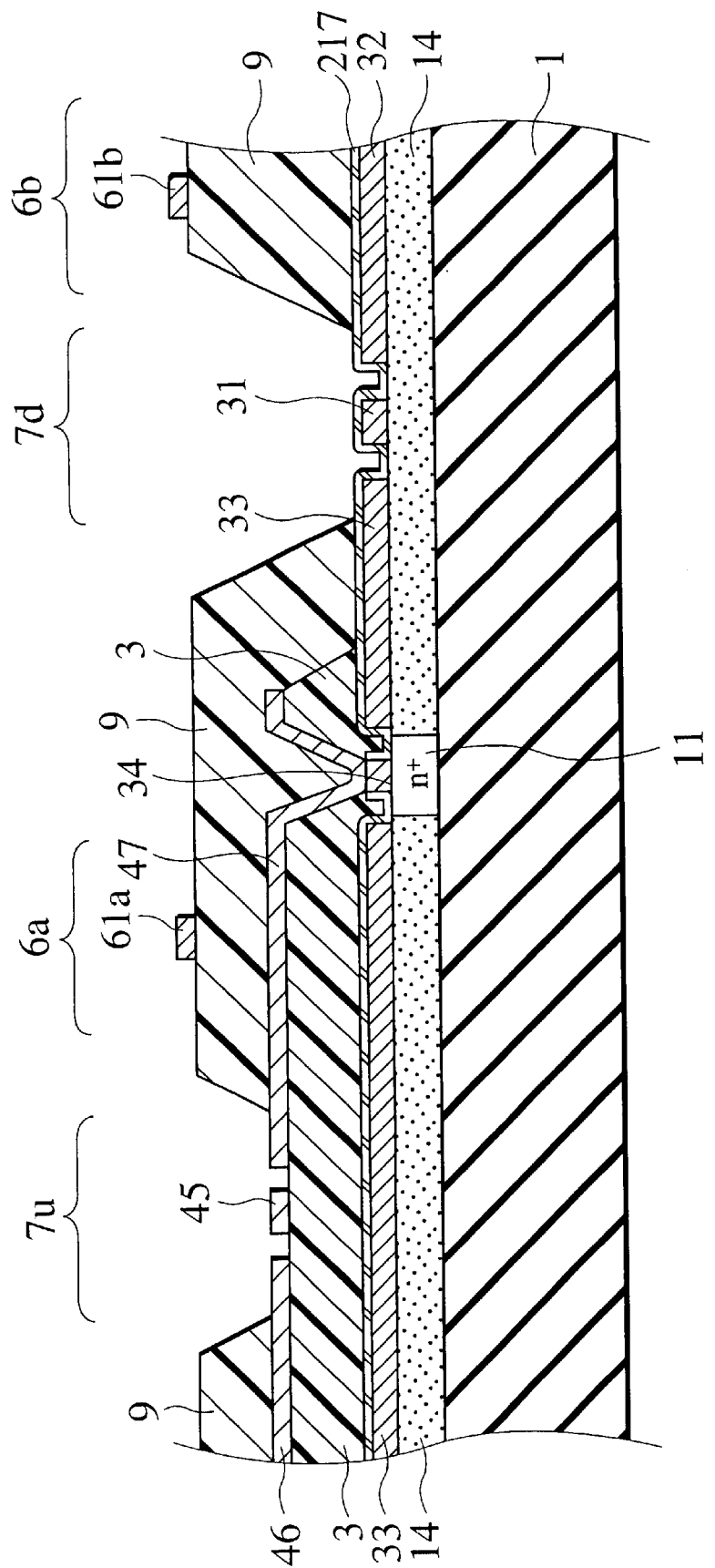
FIG. 13 is a sectional view showing a part of the structure of the high frequency semiconductor device according to a still another modification of the third embodiment of the present invention.

FIG. 13 is a sectional view showing a part of the structure of the high frequency semiconductor device according to a still another modification of the third embodiment of the present invention. In the structure shown in FIG. 13, a passivation film 217 is formed on first metal layer (31, 32, and 33). And first dielectric thin film 3 is selectively disposed on the passivation film 217. On the first dielectric thin film 3, third and fourth ground metal plates 46 and 47 and a second metal strip 45 are disposed on the first dielectric thin film 3. Further, a second dielectric thin film 9 is selectively disposed at least on a part of the fourth ground pattern 47 as well as on the passivation film 217, so as to form a concave, exposing a surface of the passivation film 217 above the first metal strip 31 and above parts of the first and second ground metal plates 33 and 32 in vicinity of the first metal strip 31. Other structures are similar to the structures shown in FIG. 12, and the overlapped descriptions or the redundant descriptions may be omitted here. And, it is possible to reduce the effective dielectric constants $\in_{eff}$ of the first CPW 7d and the second CPW 7u. Therefore, the structure shown in FIG. 13 can further reduce the crosstalk between the CPWs (the illustration of other CPWs are omitted), increasing further the characteristic impedances $Z_0$ of the first CPW 7d and the second CPW 7u. And further, since the passivation film 217 is covering on the first metal layer (31, 32, 33), the moisture immunity is improved to achieve an excellent reliability.

(Fourth Embodiment)

Figure 14A:
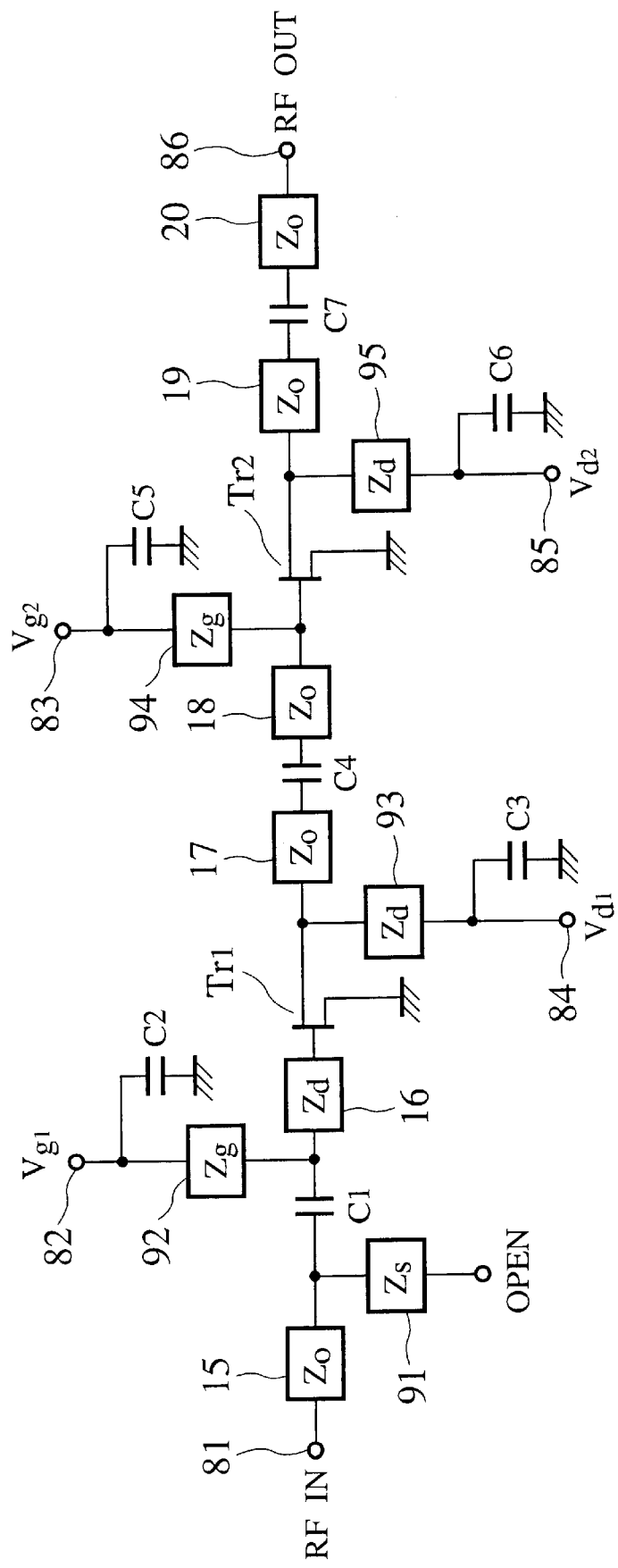
FIG. 14A is a circuit diagram of a MMIC according to a fourth embodiment of the present invention.
Figure 14B:
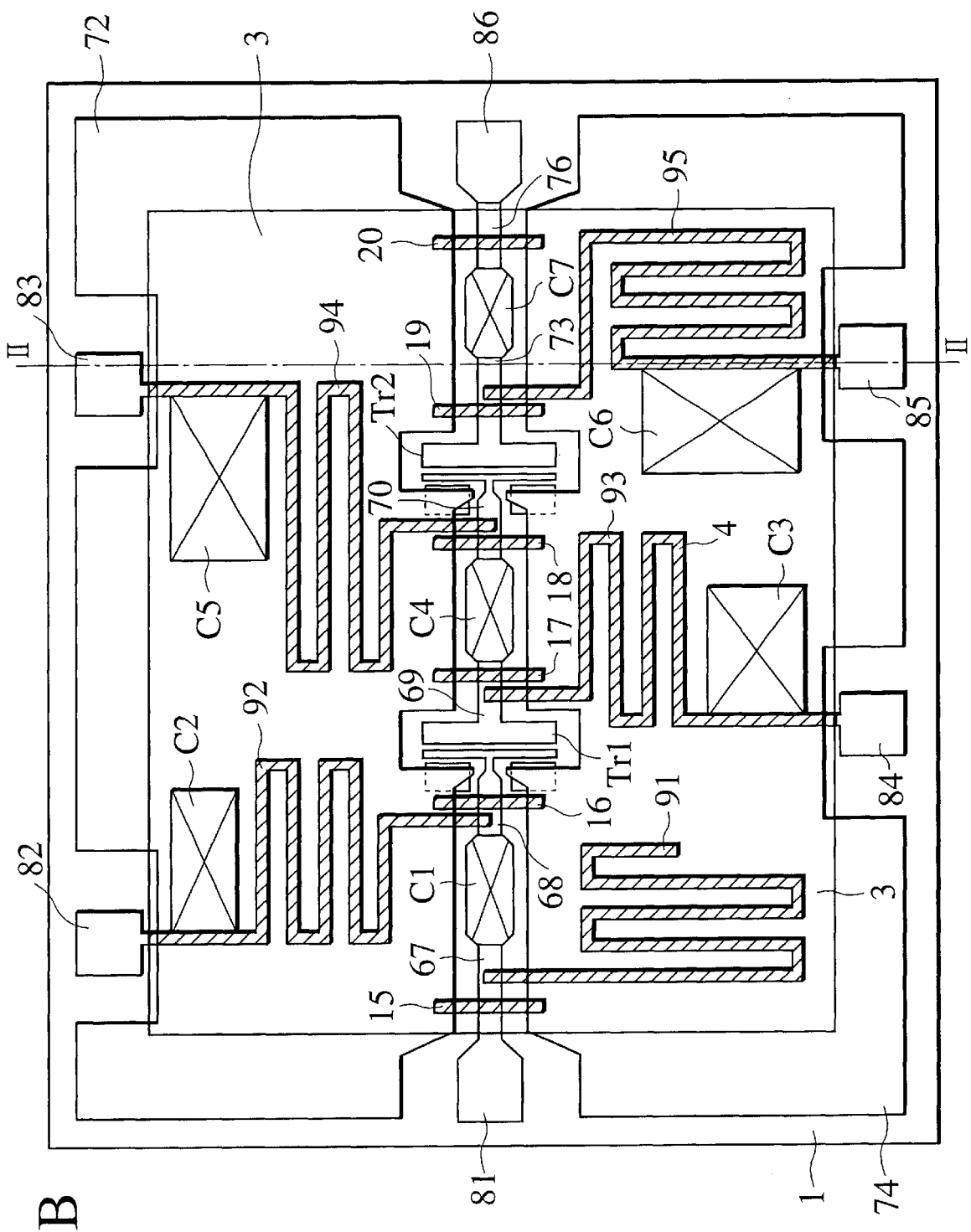
FIG. 14B is a plan view of the integrated circuit shown in FIG. 14A.
Figure 14C:
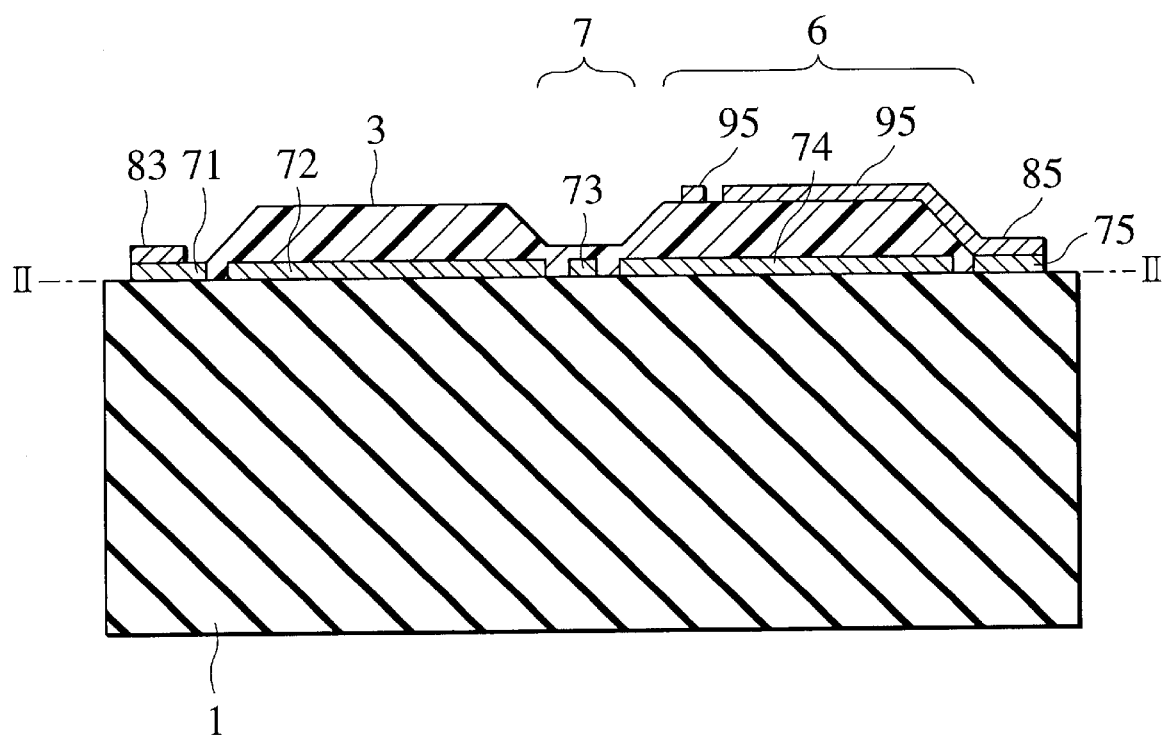
FIG. 14C is a sectional view along II—II direction of FIG. 14B.

The semiconductor integrated circuit according to a fourth embodiment of the present invention shown in FIGS. 14A to 14C is the MMIC, to which the wiring structure described in the first embodiment is applied. In this MMIC, a two stage high frequency amplifier, consisting of a first transistor (a first semiconductor active element) Tr 1 and a second transistors (a second semiconductor active element) Tr 2, is merged in a single semiconductor chip. Concretely, the high frequency transmission line includes a coupling capacitor C1, the first transistor Tr1, a coupling capacitor C4, the second transistor Tr2, a coupling capacitor C7. The high frequency transmission line is connected between an output terminal 86 ($RF_{out}$) and an input terminal 81 ($RF_{in}$), as shown in FIG. 14A. And RF signal is fed to the input terminal 81, and the RF signal is transmitted through this high frequency transmission line to the output terminal 86 so as to be outputted from the output terminal 86. Between the coupling capacitor C1 and the input terminal 81, an open stub having impedance element $Z_s$ 91 for adjusting the impedance of the high frequency transmission line is connected. The source electrode (the first electrode) of the first transistor Tr1 is grounded so as to operate with the common-source configuration. Gate voltage $V_{g1}$ is supplied to the DC bias-electrode 82. And through a by-pass capacitor C2 (a decoupling condenser), for separating the high frequency from the DC component, and the impedance element $Z_g$, the gate voltage $V_{g1}$ is applied to the gate electrode (the third electrode) of the first transistor Tr1. For the drain electrode (the second electrode) side of the first transistor Tr1, drain voltage $V_{d1}$ is supplied to the DC bias-electrode 84, and through a by-pass capacitor C3, for separating the high frequency from the DC component, and the impedance element $Z_d$, the drain voltage $V_{d1}$ is applied to the drain electrode of the first transistor Tr1. Similarly, gate voltage $V_{g2}$ is supplied to the DC bias-electrode 83. And through a by-pass capacitor C5 and the impedance element $Z_g$, the gate voltage $V_{g2}$ is applied to the gate electrode (third electrode) of the first transistor Tr2. And, drain voltage $V_{d2}$ is supplied to the DC bias-electrode 85, and through a by-pass capacitor C6 and the impedance element $Z_d$, the drain voltage $V_{d2}$ is applied to the drain electrode (second electrode) of the first transistor Tr2. The source electrode (first electrode) of the second transistor Tr2 is also grounded so as to operate with the common-source configuration.

In this way, the high frequency signal, fed to the input terminal 81, is transferred to the first transistor Tr1 through the coupling capacitor C1, and is amplified by the first transistor Tr1. The amplified high frequency signal is transferred to the second transistor Tr2, through the coupling capacitor C4. And the amplified high frequency signal is amplified by the second transistor Tr2, and is output from the output terminal 86 through the coupling capacitor C7. And, in FIG. 14A, impedance components $Z_0$ 15 to 20 may include the impedance components associated with the wiring, etc.

Typical plan view of the semiconductor integrated circuit according to the fourth embodiment, merging the first transistor Tr1, the second transistor Tr2, matching circuits, bias circuit, etc. in a single semiconductor substrate 1 of GaAs or InP, etc. is shown in FIG. 14B. As the first transistor Tr1 and the second transistor Tr2, the HEMTs described in the first embodiment are employed.

That is to say, if we focus on the second transistor Tr2, the semiconductor integrated circuit according to the fourth embodiment has the substrate (semiconductor substrate) 1; a first ground metal plate 72 and a second ground metal plate 74 disposed above the substrate 1, spatially isolated from and facing to each other; a semiconductor active element Tr2 sandwiched between the first ground metal plate 72 and the second ground metal plate 74, having first, second and third electrodes; an input metal strip 70 connected to the third electrode, sandwiched between the first ground metal plate 72 and the second ground metal plate 74; an output metal strip 73 connected to the second electrode, sandwiched between the first ground metal plate 72 and the second ground metal plate 74; a dielectric thin film 3 disposed at least on a part of the first ground metal plate 72 and the second ground metal plate 74; a first stub wiring 94 disposed on the dielectric thin film 3, connected to the input metal strip 70; and a second stub wiring 95 disposed on the dielectric thin film 3, connected to the output metal strip 73. And the dielectric structures on the input metal strip 70 and output metal strip 73 differ from those under the first stub wiring 94 and the second stub wiring 95.

FIG. 14C is a sectional view of FIG. 14B along II—II, which shows the dielectric thin film 3 disposed on the first ground metal plate 72 and on the surface of the second ground metal plate 74, where the dielectric thin film 3 is configured to be continuous by a thin layer, or "a connection part" over the output metal strip 73. The dielectric structures on the input metal strip 70 and output metal strip 73 are configure to be different from the dielectric structures under the first stub wiring 94 and the second stub wiring 95, by making the prescribed portion of the dielectric thin film 3 thinner than the thickness of the dielectric thin film 3 under the first stub wiring 94 and the second stub wiring 95.

Next, we will focus on the first transistor Tr1 as the semiconductor active element. The first transistor Tr1 is sandwiched between the first ground metal plate 72 and the second ground metal plate 74, and has first, second and third electrodes. An input metal strip 68 is connected to the third electrode, and is sandwiched between the first ground metal plate 72 and the second ground metal plate 74. An output metal strip 69 is connected to the second electrode, and is sandwiched between the first ground metal plate 72 and the second ground metal plate 74. A first stub wiring 92 is disposed on the dielectric thin film 3, and is connected to the input metal strip 68. A second stub wiring 93 connected to the output metal strip 69 is disposed on the dielectric thin film 3. And the dielectric structures on the input metal strip 68 and output metal strip 69 are configure to be different from that of the dielectric thin film 3 under the first stub wiring 92 and the second stub wiring 93, by making the prescribed portion of the dielectric thin film 3 thinner than the thickness of the dielectric thin film 3 under the first stub wiring 94 and the second stub wiring 95.

The coupling capacitors C1, C4 and C7 shown in FIG. 14A are implemented by the MIM capacitors, respectively. Similarly, the by-pass capacitors C2, C3, C5 and C6 are implemented by the MIM capacitors, respectively. The coupling capacitors C1, C4 and C7 also fulfil the function as the elements constituting the high frequency transmission line. The input metal strip 68 of the first transistor Tr1 is connected to an intermediate metal strip 67 through the MIM capacitor C1. And the input terminal 81 is connected to the intermediate metal strip 67. The first ground metal plate 72 and the second ground metal plate 74 are disposed with a predetermined spacing at both sides of the intermediate metal strip 67 and the input metal strip 68, and the first CPW (input CPW) of the first transistor Tr1 is constituted. A source ohmic electrode serving as the first electrode of the first transistor Tr1 are divided into two parts, and the two parts are sandwiching a gate electrode extraction wiring of the first transistor Tr1. The gate electrode extraction wiring has a T-shaped planar geometry. And the gate electrode extraction wiring is connected to a gate electrode of the first transistor Tr1, the gate electrode serves as the third electrode of the first transistor Tr1. Then, these two parts of the source ohmic electrode are respectively connected to and are grounded to the first ground metal plate 72 and the second ground metal plate 74, respectively, so that the first transistor Tr1 can operate with the common-source configuration. The second CPW (output CPW) of the first transistor Tr1 is implemented by the output metal strip 69 connected to the drain ohmic electrode, serving as the second electrode of the first transistor Tr1, the first ground metal plate 72 and the second ground metal plate 74 disposed at both sides of the output metal strip 69 with a predetermined spacing. And, the first CPW (input CPW) of the second transistor Tr2 is implemented by the input metal strip 70 connected to the gate of the second transistor Tr2 and the first ground metal plate 72 and the second ground metal plate 74, disposed with a predetermined spacing, at both sides of the input metal strip 70. With the second CPW (output CPW) of the first transistor Tr1 and the first CPW (input CPW) of the second transistor Tr2, an interconnection-CPW is constituted. The MIM capacitor C4 is inserted between the output metal strip 69 of the first transistor Tr1 and the input metal strip 70 of the second transistor Tr2.

A gate electrode extraction wiring of the second transistor Tr2 is delineated as the T-shaped planar geometry. The gate electrode extraction wiring is connected to a gate electrode of the second transistor Tr2, the gate electrode serves as the third electrode of the second transistor Tr2. Similar to the first transistor Tr1, a source ohmic electrode of the second transistor Tr2, serving as the first electrode of the second transistor Tr2, is divided into two parts, and the two parts sandwich the gate electrode extraction wiring of the second transistor Tr2. Further, the two parts of the source ohmic electrode respectively connected to the first ground metal plate 72 and the second ground metal plate 74, so that the source ohmic electrode is grounded and the second transistor Tr2 can operate with the common-source configuration. The output metal strip 73 is connected to the drain ohmic electrode of the second transistor Tr2, serving as the second electrode. At both sides of the output metal strip 73, the first ground metal plate 72 and the second ground metal plate 74 are disposed with a predetermined spacing, and the second CPW (output CPW) of the second transistor Tr2 are constituted by them. In addition, the intermediate metal strip 76 is connected to the output metal strip 73 connected to the drain ohmic electrode, through MIM capacitor C7. The output terminal 86 is connected to the intermediate metal strip 76. At both sides of the intermediate metal strip 76, the first ground metal plate 72 and the second ground metal plate 74 are also disposed with a predetermined spacing, and the CPW is constituted by them.

The width of metal strips 67 to 70, 73, 76, constituting the CPW may be chosen as about 20 $\mu$m. Then, the width of the first ground metal plate 72 and the second ground metal plate 74 may be chosen from about 250 $\mu$m to 500 $\mu$m, and they may be disposed at both sides of these metal strips 67 to 70, 73, 76, with the spacing of about 15 μm. The metal strips 67 to 70, 73, 76, the first ground metal plate 72 and the second ground metal plate 74 may be composed of a thin gold (Au) film having the thickness of 0.1 μm to 3 μm The thin gold (Au) film can be directly deposited on the semi-insulating substrate, if the semiconductor substrate 1 is the semi-insulating substrate. If the semiconductor substrate 1 is a low resistivity substrate, it is preferable to deposit an insulating film such as silicone oxide film ($SiO_2$ film) and silicon nitride film ($Si_3N_4$ film) on this low resistivity substrate. And then, the thin gold (Au) film, scheduled to constitute the metal strips 67 to 70, 73, 76, the first ground metal plate 72 and the second ground metal plate 74, can be deposited on this insulating film.

Stubs wiring 95 is connected to the drain ohmic electrode of the second transistor Tr2 with MIM capacitor C6, for short-circuiting the high frequency, from the DC bias-electrode 85 as shown in FIG. 14B, and the drain voltage $V_{d2}$ is supplied to the DC bias-electrode 85. With the first metal layer of 74 and the second metal layer 95 formed on the dielectric thin film 3, a second TFMSL of the second transistor Tr2 is constituted, as shown in FIG. 14C.

Turning now to FIG. 14B, the stub wiring 94 is connected to the gate electrode extraction wiring of the second transistor Tr2 through the MIM capacitor C5, for short circuiting the high frequency, and the gate voltage $V_{g2}$ is supplied to the DC bias-electrode 83. Stub wiring 94 is the first TFMSL of the second transistor Tr2 side, comprising the second metal layer 94 formed on the dielectric thin film 3 and the first metal layer 72, having a structure similar to FIG. 14C (the illustration of the cross-section is omitted). The stub wiring 93 is connected to the drain ohmic electrode of the first transistor Tr1 through the MIM capacitor C3, for short circuiting the high frequency, and the drain voltage $V_{d1}$ is supplied to the DC bias-electrode 84. Stub wiring 93 is the second TFMSL of the first transistor Tr1 side, comprising the second metal layer 93 formed on the dielectric thin film 3 and the first metal layer 74, having a structure similar to FIG. 14C (the cross-section is omitted). The stub wiring 92 is connected to the gate electrode extraction wiring of the first transistor Tr1 through the MIM capacitor C2, for short circuiting the high frequency, and the gate voltage $V_{g1}$ is supplied to the DC bias-electrode 82. Stub wiring 92 is the first TFMSL of the first transistor Tr1 side, comprising the second metal layer 92 formed on the dielectric thin film 3 and the first metal layer 72, having a structure similar to FIG. 14C (the cross-section is omitted).

The open stub wiring 91 as a stub wiring for impedance adjustment is connected to the intermediate metal strip 67. The open stub wiring 91 is the TFMSL comprising the second metal layer 91 formed on the dielectric thin film 3 and the first metal layer 74, having a structure similar to FIG. 14C (the cross-section is omitted). The intermediate metal strip 67, the input metal strip 68, the MIM capacitor C1 and the open stub wiring 91 constitute the input matching circuit of the first transistor Tr1. Simultaneously, the stub wirings 92 and 94 connected to the input side, composed of the TFMSL structures, also fulfil a part of the matching circuit. The input terminal 81, the DC bias-electrodes 82 to 85 and the output terminal 86 are configured to serve as bonding pads, and it is respectively connected to the corresponding pins of the package through gold (Au) or aluminum (Al) bonding wires, or bonding ribbons.

Then, bridges 15,16 using the gold (Au) metal patterns having 3 μm thickness and width of about 10 μm to 50 μm are respectively disposed at the surface of the intermediate metal strip 67 and the input metal strip 68 through dielectric thin film, which is omitted in the illustration. In addition, bridges 17,18 are formed through dielectric thin film, similarly omitted in the illustration, on the output metal strip 69 and on the input metal strip 70, respectively. Further, bridges 19,20 are formed through dielectric thin film, similarly omitted in the illustration, on the output metal strip 73 and the intermediate metal strip 76, respectively. Then, on the CPWs, bridges 15 to 20 are arranged on a line with an adequate interval using the second metal layer. Through these bridges 15 to 20, the first metal layer (72, 74) as the ground metal plates of both sides of the CPWs are made respectively to be the same potential. The coaxial line characteristic impedances of these bridge portions are also contained in the impedances $Z_0$ 15 to 20 shown in FIG. 14A.

According to the requirement for the dimensional accuracy and the margin of the occupation area, the MMIC of the fourth embodiment can elect one of the TFMSL and the CPW, as shown in FIG. 14B, properly so that it is easy to achieve the miniaturization, while improving the performance of the circuit. That is to say, for wirings associated with the impedance adjustment stubs and the DC bias supply circuits, in which the lengths are necessary long, while the high dimensional accuracy is not necessary required, the TFMSL architecture is adopted. It is the effective to employ the TFMSL architecture for the miniaturization of MMIC, because in the TFMSL architecture the metal strip is formed by the second metal layer (91 to 95), and because the ground metal plate is formed by the first metal layer (72, 74).

In the meantime, the CPW architecture is suited for the high frequency transmission line, to which the high dimensional accuracy and the low transmission loss are required, but not so long lengths are required. Since, the characteristic impedance $Z_0$ of the CPW is determined by the width of the metal strips 67 to 70, 73 and 76 and the spacing at both sides of the metal strips 67 to 70, 73 and 76 with respect to the first ground metal plate 72 and the second ground metal plate 74, it is easy to fabricate a low-loss CPW in accordance with the circuit specification. The high dimensional accuracy can be easily realized for the first metal layer (67 to 70, 73, 76, and 72, 74), because by the known lift-off processes or the photolithography technology, etc., it is easy to delineate patterns with high-accuracy. In this case, further miniaturization is possible, because the ground metal plate of the CPW can simultaneously serve as the ground metal of the TFMSL, using the first metal layer (72, 74).

The thickness of the dielectric thin film 3 is not uniform on the whole surface, but is configured to vary according to the spatial positions. Namely, the thick portion of the dielectric thin film 3 is selectively formed on the specified central area surrounded by the tapered peripheral portion. The input terminal 81, the DC bias-electrodes 82 to 85 and the output terminal 86 are disposed outside of the tapered peripheral portion, as shown in FIG. 14C. Further the thin portion, or the connection part is formed on the CPW. That is to say, the thickness of the dielectric thin film 3 of the connection part on the CPW, the first transistor Tr1 and the second transistor Tr2 is made to be almost 1 μm, and the thickness of the dielectric thin film 3 of the thick portion where the TFMSLs are formed is set to be almost 10 μm, so as to change spatially the dielectric structure. Hence, by partially thinning the thickness of the dielectric thin film 3, the dielectric structure selectively changes, and characteristic impedance $Z_0$ is well controlled, while making the transmission loss of the CPW small. And, the capacitances between the gate electrodes and the drain ohmic electrodes of the first transistor Tr1 and the second transistor Tr2, respectively can be reduced, and the performance of the MMIC in the high frequency range is improved.

By forming the taper geometry, avoiding the vertical wall structure, with an adequate angle, as shown in FIG. 14C, it is possible to reduce the open circuit failures between the second metal layer 95 and the first metal layer 75. The formation method of this taper geometry can be implemented by controlling the condition for the dielectric thin film fabrication process. And, though it is not illustrated, the taper geometry of the dielectric thin film can be achieved by another method, shifting the positions of the edges of the respective level, in a multi-level stacked structure of the dielectric thin film after stacking the multi-level stacked structure.

By the MMIC according to the fourth embodiment, the effective dielectric constant $\in_{eff}$ of the CPW can be reduced, while the necessary occupation area for the wirings, as a whole, by controlling the dielectric structure as a function of the spatial position, with the structure such that the thickness of the dielectric thin film on the CPW portion is thin (for example, 1 $\mu$m) and the thickness of the dielectric thin film associated with TFMSL portion is thick (for example, 10 $\mu$m). As a result the high frequency gain of 10 dB is obtained at an operation frequency of 60 GHz. Then it is possible to improve the high frequency gains by 3 dB in comparison with the high frequency amplifier, having the uniform thickness of the dielectric thin film of 10 $\mu$m. And the improvement of the performance of the high frequency amplifier is confirmed by the MMIC according to the fourth embodiment.

Figure 15A:
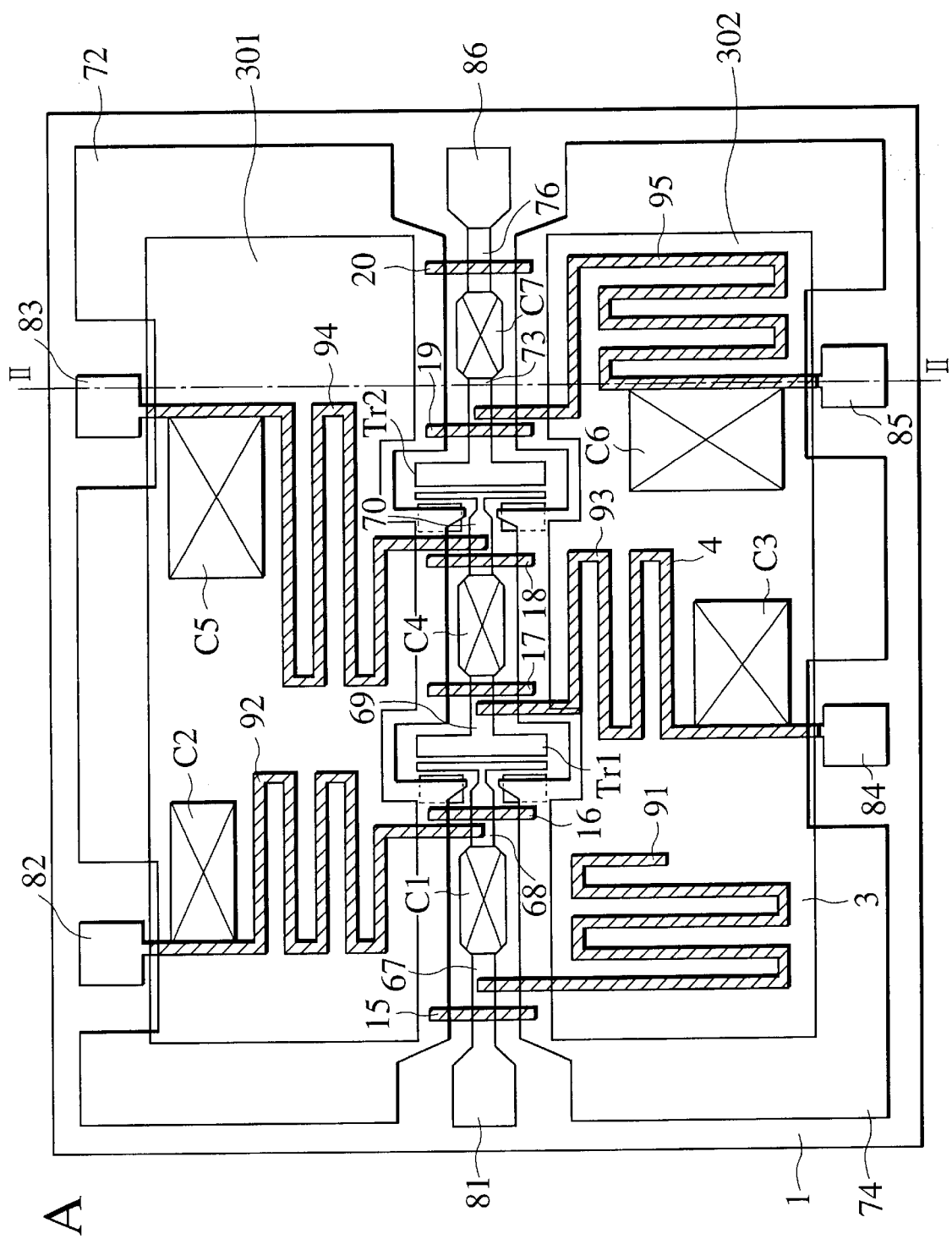
FIG. 15A is a plan view of a MMIC according to a modification of the fourth embodiment of the present invention.
Figure 15B:
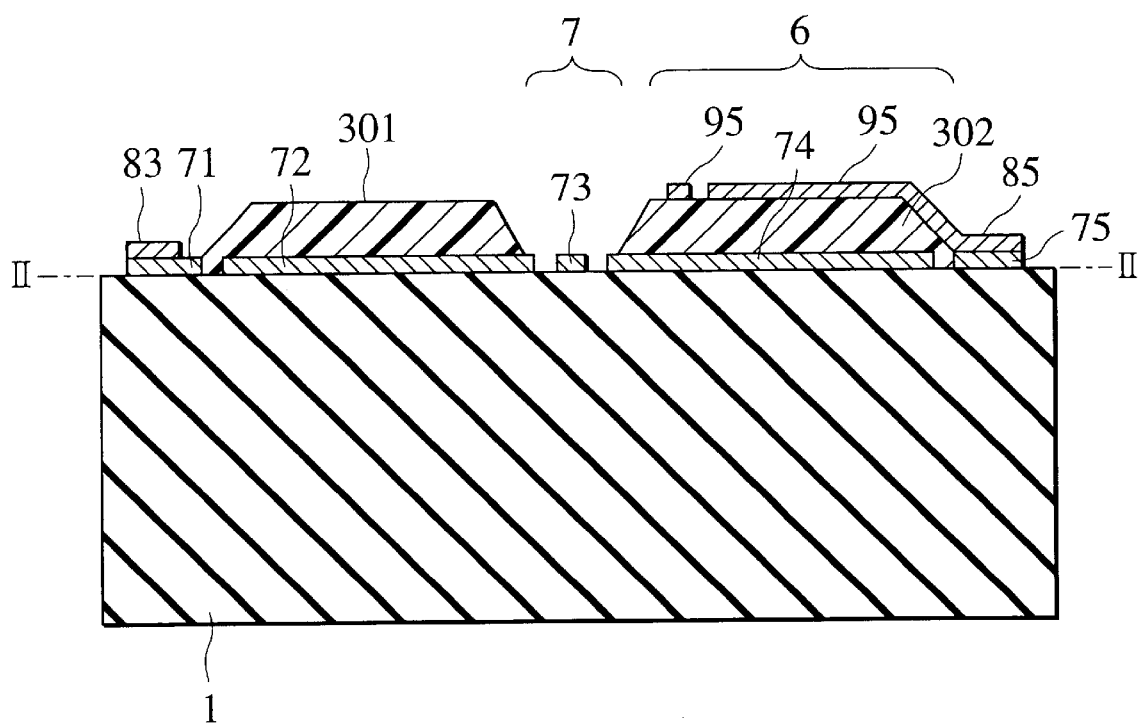
FIG. 15B is a sectional view along II—II direction of FIG. 15A.

FIG. 15A is a plan view of a MMIC according to a modification of the fourth embodiment of the present invention, and FIG. 15B is a sectional view along II—II direction of FIG. 15A. Similar to the plan view of the MMIC shown in FIG. 14B, the first transistor Tr1, the second transistor Tr2, matching circuits, bias circuit, etc. are merged in a single semiconductor substrate 1. And, if we focus on the second transistor Tr2, in the semiconductor integrated circuit according to the modification of the fourth embodiment, a first ground metal plate 72 and a second ground metal plate 74 is disposed above the substrate 1. And the semiconductor active element Tr2 is sandwiched between the first ground metal plate 72 and the second ground metal plate 74, and the semiconductor active element Tr2 has first, second and third electrodes. An input metal strip 70 is connected to the third electrode, and the input metal strip 70 is sandwiched between the first ground metal plate 72 and the second ground metal plate 74. An output metal strip 73 is connected to the second electrode, and the output metal strip 73 is sandwiched between the first ground metal plate 72 and the second ground metal plate 74. And a first dielectric thin film 301 is disposed selectively on a part of the first ground metal plate 72. A second dielectric thin film 302 is disposed selectively on a part of the second ground metal plate 74. A first stub wiring 94 connected to the input metal strip 70 is disposed on the first dielectric thin film 301. A second stub wiring 95 connected to the output metal strip 73 is disposed on the second dielectric thin film 302. And the dielectric structures on the input metal strip 70 and output metal strip 73 differ from those under the first stub wiring 94 and the second stub wiring 95, since there is no dielectric thin film is disposed on the input metal strip 70 and output metal strip 73. FIG. 15B is a sectional view of FIG. 15A along II—II. FIG. 15B shows the first dielectric thin film 301 disposed on the first ground metal plate 72 and the second dielectric thin film 302 disposed on the second ground metal plate 74. Namely, the dielectric structures on the input metal strip 70 and output metal strip 73 are configure to be different from the dielectric structure of the first dielectric thin film 301 under the first stub wiring 94 and the dielectric structure of the second dielectric thin film 302 under the second stub wiring 95.

On the side of the first transistor Tr1, the first transistor Tr1 is sandwiched between the first ground metal plate 72 and the second ground metal plate 74. The first transistor Tr1 also has second and third electrodes. An input metal strip 68 is connected to the third electrode, and is sandwiched between the first ground metal plate 72 and the second ground metal plate 74. An output metal strip 69 is connected to the second electrode, and is sandwiched between the first ground metal plate 72 and the second ground metal plate 74. A first stub wiring 92 is disposed on the first dielectric thin film 301, and is connected to the input metal strip 68. A second stub wiring 93 connected to the output metal strip 69 is disposed on the second dielectric thin film 302. And the dielectric structures on the input metal strip 68 and output metal strip 69 are configure to be different from that of the first and second dielectric thin films 301 and 302 under the first stub wiring 92 and the second stub wiring 93, by exposing the surfaces of the input metal strip 68 and output metal strip 69. Other structure is similar to the structure shown in FIGS. 14B and 14C, and the overlapped descriptions may be omitted here. Especially, if the structure shown in FIGS. 15A and 15B further comprise a connection part between the first dielectric thin film 301 and the second dielectric thin film 302, having thickness thinner than thickness between the first stub wirings 92, 94 and the first ground metal plate 72, or between the second stub wirings 93, 95 and the second ground metal plate 74, so that the connection part is disposed on the input metal strips 68, 70 and output metal strips 69, 73, it becomes the same structure shown in FIGS. 14B and 14C.

However, since there is no dielectric thin film on the CPW, the first transistor Tr1 and the second transistor Tr2 so that the dielectric structures are locally change, the characteristic impedance $Z_0$ is well controlled, while making the transmission loss of the CPW small. And, the performance of the MMIC in the high frequency range is improved.

Figure 16:
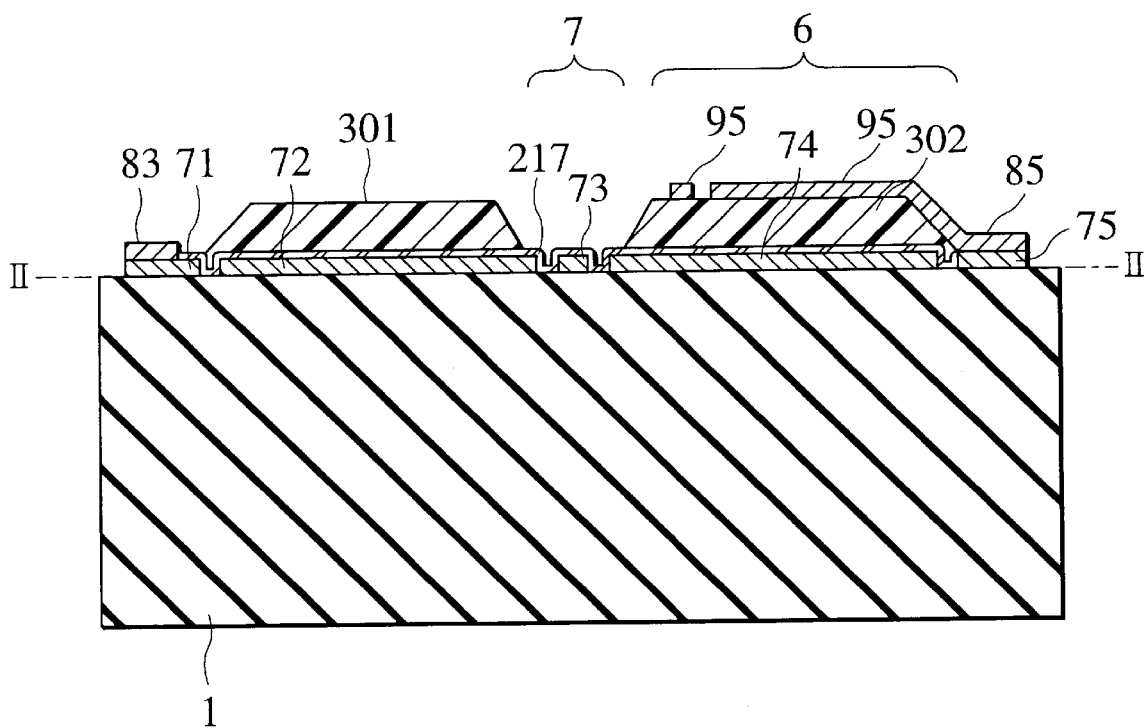
FIG. 16 is a sectional view of a MMIC according to another modification of the fourth embodiment of the present invention.

FIG. 16 is a sectional view of a MMIC according to another modification of the fourth embodiment, corresponding to the sectional view along II—II direction of FIG. 15A. In the structure of FIG. 16, a passivation film 217 is formed on the output metal strip 73, the first ground metal plate 72 and the second ground metal plate 74. And first dielectric thin film 301 and second dielectric thin film 302 are selectively disposed on the passivation film 217 so as to form a concave above the output metal strip 73, exposing a surface of the passivation film 217 above the output metal strip 73, above a part of the first ground metal plate 72 in vicinity of the output metal strip 73, and above a part of the second ground metal plate 74 in vicinity of the output metal strip 73. Although not shown in FIG. 16, the passivation film 217 is further covering over the intermediate metal strip 67, the coupling capacitor C1, the input metal strip 68, the first transistor Tr1, the output metal strip 69, the coupling capacitor C4, the input metal strip 70, the second transistor Tr2, the coupling capacitor C7 and the intermediate metal strip 76, which are shown in FIG. 15. And since other structures are similar to the structures shown in go FIGS. 15A and 15B, the overlapped descriptions are omitted here. In FIG. 16, it is so configured that the dielectric thin film is not existing on the passivation film 217 above the intermediate metal strip 67, the input metal strip 68, the output metal strip 69, the input metal strip 70, the output metal strip 73 and the intermediate metal strip 76. Then, it is possible to reduce the effective dielectric constants $\in_{eff}$ of the CPW 7, while the occupation areas necessary for the wirings are decreased. Therefore, the technical advantages, which make possible to extend the adjustable range of the characteristic impedance $Z_0$ of the CPW 7, to have the low transmission loss, and to reduce the crosstalk are obtained. And further, since the passivation film 217 is covering on the intermediate metal strip 67, the coupling capacitor C1, the input metal strip 68, the first transistor Tr1, the output metal strip 69, the coupling capacitor C4, the input metal strip 70, the second transistor Tr2, the output metal strip 73, the coupling capacitor C7 and the intermediate metal strip 76, the moisture immunity is improved to achieve an excellent reliability (Fifth Embodiment)

Figure 17A:
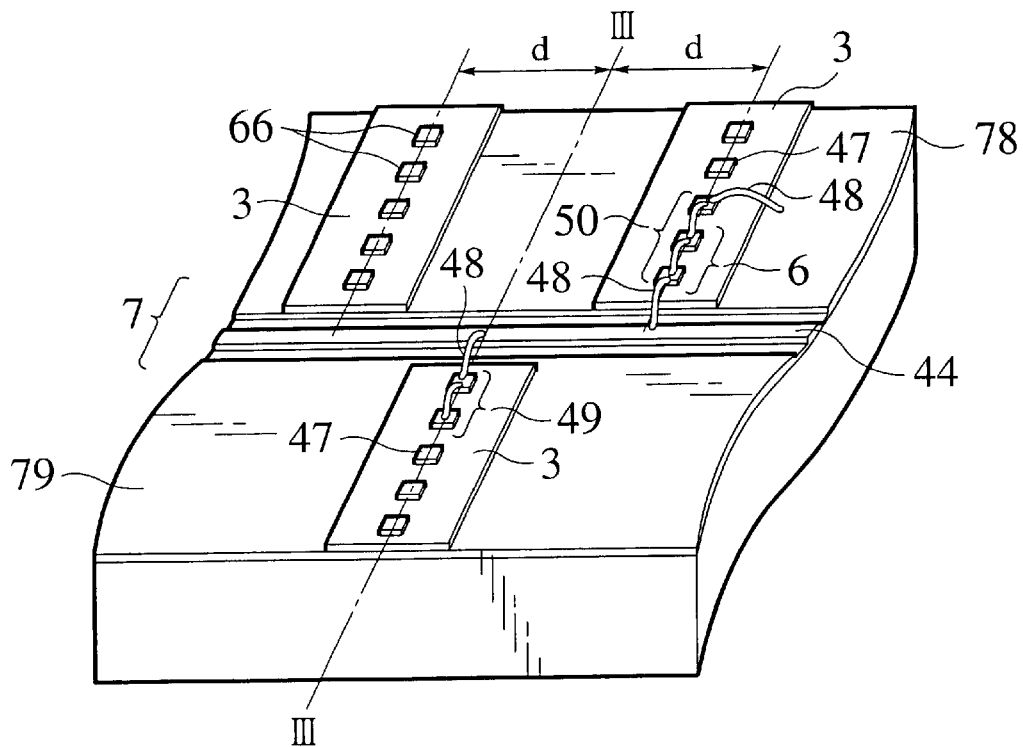
FIG. 17A is a typical bird's-eye view of the high frequency semiconductor device according to a fifth embodiment of the present invention.
Figure 17B:
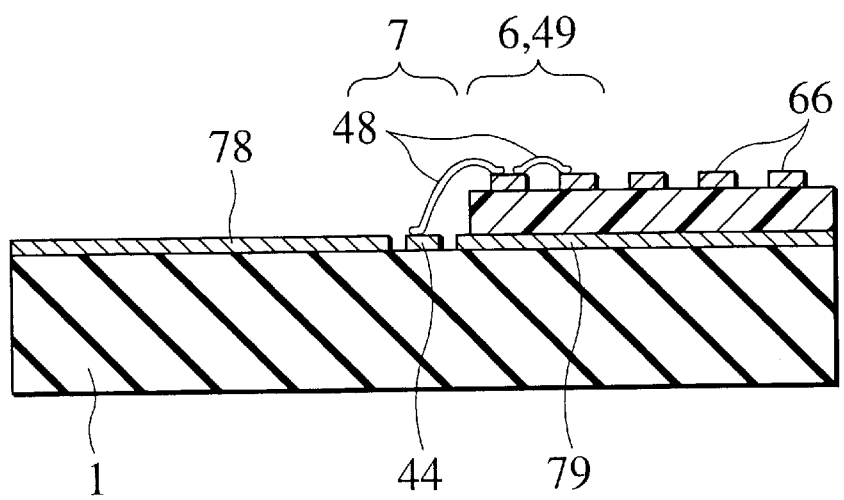
FIG. 17B is a sectional view along III—III direction of FIG. 17A.

A high frequency semiconductor device according to a fifth embodiment of the present invention shown in FIGS. 17A and 17B comprises a substrate (semiconductor substrate) 1 such as GaAs or InP substrate; a first metal layer (44, 78, 79) disposed above the semiconductor substrate 1, a first dielectric thin film 3 disposed in a prescribed non-uniform way on the first metal layer (44, 78, 79); and a second metal layer comprising a second metal strip 66, disposed on the first dielectric thin film 3. Here, the first metal layer comprises a first metal strip 44, a first ground metal plate 78 and a second ground metal plate 79 sandwiching the first metal strip 44, each being isolated from the first metal strip 44. And the first metal strip 44, the first ground metal plate 78 and the second ground metal plate 79 constitute a CPW structure.

For example, in 30 GHz to 100 GHz bands, the width of the first metal strip 44 may be set to be 20 µm. Then, the first ground metal plate 78 and the second ground metal plate 79 having width of about 150 µm to 300 µm may be disposed with a spacing of about 15 µm at both sides of the metal strip 44. The first metal strip 44, the first ground metal plate 78 and the second ground metal plate 79 are made of a thin gold (Au) film, having a thickness of 0.1 µm to 3 µm.

In the high frequency semiconductor device according to the fifth embodiment, the dielectric thin film 3 having a thickness of about 10 µm is disposed at least on a part of the first ground metal plate 78. Similarly, the dielectric thin film 3 having the thickness of about 10 µm is disposed at least on a part of the second of ground metal plate 79. As the dielectric thin film 3, silicon oxide film ($SiO_2$ film), silicon nitride film ($Si_3N_4$ film), alumina film ($Al_2O_3$ film), BCB film, polyimide film, etc. may be used. For example, the width of the dielectric thin film 3 may be set as 80 µm, while the length can be set approximately same as the length of the first ground metal plate 78 and the second ground metal plate 79, namely about 150 µm to 300 µm. An array of metal islands 66, each having a dimension of about 50 µm×50 µm, each serving as the second metal strip, are disposed periodically with an uniform spacing, or 5 µm interval, on the dielectric thin film 3.

Then, the adjustment stub is constituted by connecting the metal island 66, disposed at a head of the metal island array, to the first metal strip 44 by a connection conductor 48 such as a bonding wire or a bonding ribbon made of gold (Au) or aluminum (Al), etc. For example, the bonding wire having a diameter of 15 µm to 25 µm can be employed. The "head" means the position of the metal islands 66 disposed on the dielectric thin film 3, which has a shortest distance from the position of the first metal strip 44 among the array of the metal islands 66 arranged in one dimensional form. If the metal island 66, disposed at an end of the metal array, is connected to the first ground metal plate 78 with another connection conductor 48, a short stub 50 is constituted. And, if the metal island 66 disposed at an end of the metal array is not connected to the first ground metal plate 78 an open stub can be constituted. Here, the "end of the stub" means the position of the metal islands 66 disposed on the dielectric thin film 3, which has a longest distance from the position of the first metal strip 44 among the array of the metal islands 66 arranged one dimensionally. By connecting a plurality of the metal islands 66 mutually up to the end of the stub from the head by another connection conductor(s) 48, a predetermined length of the short stub 50 is defined.

As shown in FIG. 17A, connecting the first metal strip 44 to the head of the metal island array by another connection conductors 48, the open stub 49 having a predetermined length is constituted. Then, the dielectric structure on the first metal strip 44 is made to be different from that of under the metal islands 66 made by the second metal layer, by the structure, not disposing the dielectric thin film 3 over the first metal strip 44. The adoption of the open stub 49 or the short stub 50 is based on the design or the specification of the communication equipment, etc. And the number of the metal islands 66 in the array can be optionally selected, for example, from 1 to 10, and a predetermined number of the arrays can be disposed on the semiconductor substrate.

It is difficult to bond plural connection conductors (bonding wires) 48 to an identical position on the first metal strip 44, if the width of the first metal strip 44, made of the first metal layer, is selected as 20 µm. Therefore, to increase the integration density of the MMIC, it is preferable to alternately place the stubs at both sides of the first metal strip 44 of the CPW, so as to shift the bonding positions mutually along the direction of the first metal strip 44. That is, the arrangement of plural arrays of the metal islands 66 on both sides of the first metal strip 44, with the 1/2 pitch displacement is employed, as shown in FIGS. 17A and 17B. For example, suppose that the distance between two arrays of the metal islands 66 disposed at one side (for example, the upper portion in FIGS. 17A and 17B) of the first metal strip 44 is set to be 2d, measuring along the line in parallel with the first metal strip 44. In this case, it will be desirable that three arrays of the metal islands 66 are alternately disposed at the respective positions of both sides of the first metal strip 44. That is, it is desirable that the distance from one of the array disposed at the upper portion to the nearest another array located at opposite side (the lower portion in FIGS. 17A and 17B) of the first metal strip 44 is d. The distance is also measured along the direction of the first metal strip 44.

However, if the width of the first metal strip 44 is wide enough, such as from 60 µm to over 80 µm, it is possible to bond two wires to an approximately identical position on the first metal strip 44, and plural stubs can be symmetrically disposed with respect the first metal strip 44. In this symmetrical arrangement of plural stubs, the distance d measured along the first metal strip 44 between a stub located at upper portion and the nearest stub located at lower portion of the first metal strip 44 becomes 0 (d=0).

In the high frequency semiconductor device according to the fifth embodiment, it is effective to selectively employ the TFMSL structure or the CPW structure for miniaturization and performance improvement of the high frequency circuit. That is, the TFMSL structures to which the high dimensional accuracy is not necessary required, implemented by the metal island 66, are employed as the structures for the open stub 49 and short stub 50 for impedance adjustment as shown in FIG. 17A. In the meantime, the CPW structure is employed as the high frequency transmission line, to which the high dimensional accuracy is necessary. Because the patterns for the CPW structure comprising the first metal strip 44, the first ground metal plate 78 and the second ground metal plate 79 can be delineated precisely by the known lift-off process or other photolithography technology. In this case, with the metal island 66 disposed on the first dielectric thin film 3 and the first ground metal plate 78 or the second ground metal plate 79, the TFMSL structure is constituted, while with the first metal strip 44, the first ground metal plate 78 and the second ground metal plate 79, the CPW structure is constituted so that the first ground metal plate 78 or the second ground metal plate 79 can serve for both CPW and TFMSL structures. Then, further miniaturization of the MMIC becomes possible by the teaching of the high frequency semiconductor device according to the fifth embodiment.

Figure 18A:
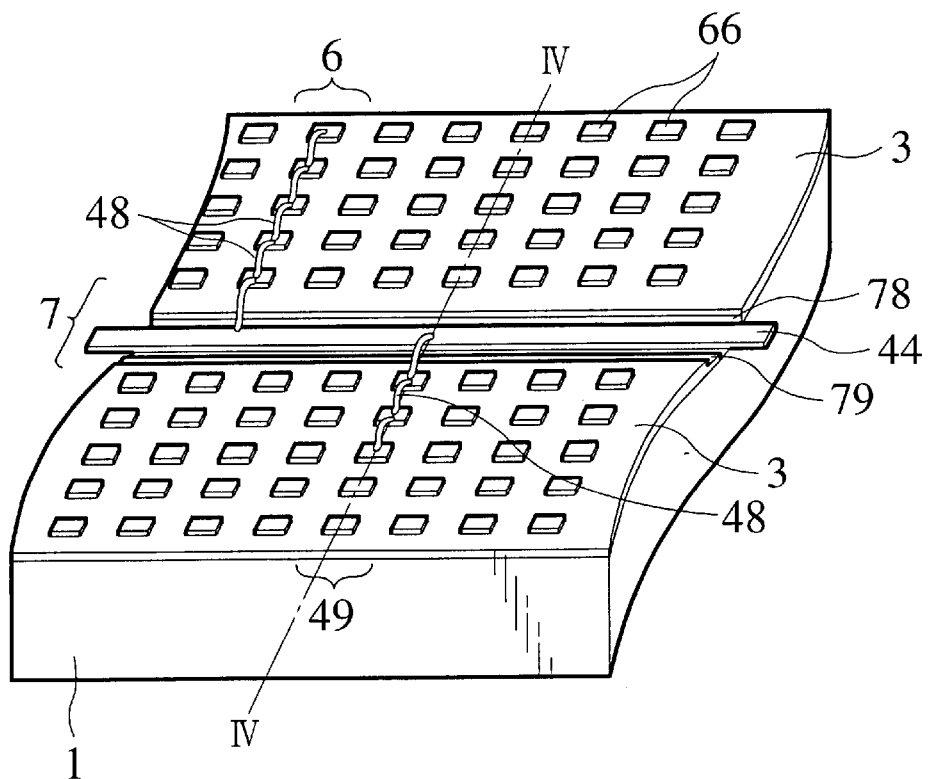
FIG. 18A is a typical bird's-eye view of the high frequency semiconductor device according to a modification of the fifth embodiment of the present invention.
Figure 18B:
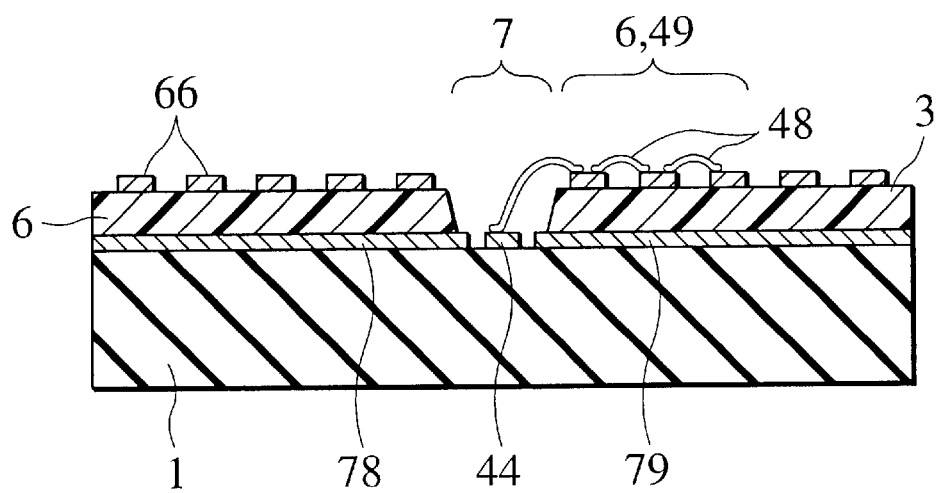
FIG. 18B is a sectional view along IV—IV direction of FIG. 18A.

FIG. 18A shows a bird's-eye view of the high frequency semiconductor device according to a modification of the fifth embodiment of the present invention. FIG. 18B is a sectional view along IV—IV direction of FIG. 18A. In the high frequency semiconductor device according to the modification of the fifth embodiment, a couple of dielectric thin films 3 are disposed on the whole surface of the first ground metal plate 78 or the second ground metal plate 79 so as to expose the surface of the first metal strip 44 unlike the fifth embodiment shown in FIGS. 17A and 17B, in which the plural belts of dielectric thin film 3 having a limited area were selectively disposed on the prescribed parts of the first ground metal plate 78 or the second ground metal plate 79. Further, plural metal islands 66 are disposed on the whole surface of the dielectric thin film 3, which is another point differing from the fifth embodiment. Therefore, it is possible to arrange the plural stubs on the optimal positions on the first ground metal plate 78 or the second ground metal plate 79, in the high frequency semiconductor device according to the modification of the fifth embodiment shown in FIGS. 18A and 18B.

In the high frequency semiconductor device according to the modification of the fifth embodiment, the TFMSL structure or the CPW structure is selectively adopted. Namely, the TFMSL structures, using plurality of the metal islands 66, to which the high dimensional accuracy is not necessary required, are employed as the structures for the stubs as shown in FIGS. 18A and 18B. In the meantime, the CPW structure is employed as the high frequency transmission line, to which the high dimensional accuracy is required. Because the patterns for the CPW structure comprising the first metal strip 44, the first ground metal plate 78 and the second ground metal plate 79 can be delineated precisely by the known technology. And, the dielectric structure on the first metal strip 44 is made to be different from that of under the metal islands 66 made by the second metal layer by not disposing the dielectric thin film 3 over the first metal strip 44. Then, the effective dielectric constant $\in_{eff}$ of the CPW is reduced, while the occupation area necessary for the stubs is decreased. Therefore, it is effective for the miniaturization and the performance improvement of the high frequency circuits, while the excellent high frequency characteristics of the CPW composed of the first metal strip 44, the first ground metal plate 78 and the second ground metal plate 79 are maintained.

(Other Embodiments)

Various modifications will become possible for those skilled in the art after receiving the teachings of the present disclosure without departing from the scope thereof.

For example, though in the above-mentioned embodiment, the high frequency semiconductor device using the HEMT as the semiconductor active elements is described, the present invention is applicable to another kinds of semiconductor active elements. Namely, MESFET, HBT and SIT may be used as the semiconductor active element. And, these semiconductor active elements are not limited to the lateral structure, namely the structure having the first and second electrode regions at the surface of the semiconductor substrate as shown in FIGS. 5C to 5G, but also applicable to a vertical structure having a buried semiconductor region serving as one of the first, second and third electrode regions.

Further, in the forth embodiment the common-source configuration is explained as an example, but the common-gate configuration or the common-drain configuration can be employed for HEMT, MESFET, or SIT circuit. And the common-emitter, common-base or common-collector figuration can be employed for BJT circuit. Then the first electrode of the present invention must be elected in accordance with these circuit configurations.

Furthermore, it is applicable to the high frequency semiconductor device composed only of the passive elements.

Still further, in the high frequency semiconductor devices shown in FIGS. 4A–4C, 7B–7C, 9A–9C, 11A–11C, 12 and 13, it is possible to planarize the surface of the dielectric thin film 3 by filling up the concaves on the CPWs 7, 7u and 7d with the dielectric plugs having smaller dielectric constant as similar to the structure as shown in FIG. 9. By these embedded and planarized structures, it is possible to achieve approximately same advantages of the high frequency semiconductor devices shown in FIGS. 4A–4C, 7B–7C, 9A–9C, 11A–11C, 12 and 13, since the effective dielectric constant $\in_{eff}$ of the CPWs 7, 7u and 7d can also be reduced similarly. In addition, the metallization of the second metal layer or the third metal layer becomes easy, because the surface of the dielectric thin film 3 or 9 is flattened. That is, especially, the planarized structure is effective for the realization of the finer structures with higher accuracy of geometrical dimensions. And also the open circuit failure can be reduced by the planarized structure.

Thus, the present invention of course includes various embodiments and modifications and the like, which are not detailed above. Therefore, the scope of the present invention will be defined in the following claims.

What is claimed is:

1. A high frequency semiconductor device comprising:
   a substrate;
   a first metal layer configured to form a high frequency transmission line and disposed above the substrate, the first metal layer including:
   1) a first metal strip; and
   2) first and second ground metal plates sandwiching the first metal strip, each being isolated from the first metal strip;
   a first dielectric thin film disposed at least above a part of said first ground metal plate so that a thin extension part of the first dielectric thin film covers a surface of the first metal strip; and
   a second metal layer comprising a second metal strip, disposed on said first dielectric thin film,
   wherein a thickness of the first dielectric thin film above said first metal strip is smaller than the thickness of the first dielectric thin film between the second metal strip and the first ground metal plate.

2. The semiconductor device of claim 1, wherein the first metal strip, the first and second ground metal plates constitute a coplanar wave guide; and the second metal strip, the first dielectric thin film and the first ground metal plate constitute a thin film microstrip line.

3. The semiconductor device of claim 2, further comprising a passivation film formed on said first metal layer.

4. The semiconductor device of claim 3, wherein said first dielectric thin film is selectively disposed on said passivation film so as to form a concave, exposing a surface of said passivation film above said first metal strip and above another part of said first ground metal plate in vicinity of said first metal strip.

5. The semiconductor device of claim 2, wherein said first dielectric thin film has a flat surface portion in vicinity of said second metal strip, and thickness of the first dielectric thin film gradually decreases from the flat surface portion to vicinity of the first metal strip so as to shape a taper geometry.

6. The semiconductor device of claim 1, wherein said first dielectric thin film comprises lower and upper dielectric layers, and said extension part consists of the lower dielectric layer.

7. The semiconductor device of claim 1, further comprising third and fourth ground metal plates sandwiching said second metal strip, both disposed on the first dielectric thin film so as to constitute a coplanar wave guide.

8. The semiconductor device of claim 7, further comprising:
 a second dielectric thin film disposed at least on a part of said fourth ground pattern; and
 a third metal strip disposed on the second dielectric thin film so as to constitute a thin film microstrip line, using said fourth ground metal plate.

9. The semiconductor device of claim 8, further comprising a passivation film formed on said first metal layer.

10. The semiconductor device of claim 9, wherein said second dielectric thin film is selectively disposed on said passivation film so as to form a concave, exposing a surface of said passivation film above said first metal strip and above another part of said first ground metal plate in vicinity of said first metal strip.

11. The semiconductor device of claim 1, further comprising a connection conductor which connects the first metal strip with the second metal strip.

12. The semiconductor device of claim 1, wherein said second metal strip is a metal island.

13. The semiconductor device of claim 12, further comprising another metal island disposed on the first dielectric thin film, arranged adjacently to the metal island.

14. A high frequency semiconductor device comprising:
 a substrate;
 a first metal layer disposed above the substrate and including:
  1) a first metal strip; and
  2) first and second ground metal plates sandwiching the first metal strip, each being isolated from the first metal strip;
 a first dielectric thin film that is selectively disposed on said first ground metal plate so as to form a concave, exposing surfaces of said first metal strip and another part of said first ground metal plate in a vicinity of said first metal strip; and
 a second metal layer including a second metal strip and disposed on said first dielectric thin film.

15. The semiconductor device of claim 14, further comprising a dielectric plug disposed on said first metal strip so as to fill up said concave, the dielectric plug having a dielectric constant smaller than that of said first dielectric thin film.

16. A semiconductor integrated circuit comprising:
 a substrate;
 first and second ground metal plates disposed above the substrate, spatially isolated from and facing to each other;
 a semiconductor active element sandwiched between said first and second ground metal plates, having first, second and third electrodes;
 an input metal strip configured to transmit a high frequency signal to the third electrode, sandwiched between said first and second ground metal plates;
 an output metal strip configured to receive the high frequency signal from the second electrode, sandwiched between said first and second ground metal plates;
 a first dielectric thin film disposed at least on a part of said first ground metal plate;
 a second dielectric thin film disposed at least on a part of said second ground metal plate;
 a first stub wiring disposed on said first dielectric thin film, connected to the input metal strip; and
 a second stub wiring disposed on said second dielectric thin film, connected to the output metal strip,
 wherein surfaces of the input and output metal strips are exposed so as to form a concave between the first and second dielectric thin films.

17. The semiconductor integrated circuit of claim 16, wherein said input metal strip, said first and second ground metal plates constitute a first coplanar wave guide, said output metal strip, said first and second ground metal plates constitute a second coplanar wave guide, said first stub wiring, said first dielectric thin film and said first ground metal plate constitute a first thin film microstrip line, and said second stub wiring, said second dielectric thin film and said second ground metal plate constitute a second thin film microstrip line.

18. The semiconductor integrated circuit of claim 16, further comprising a connection part of said first and second dielectric thin films, having thickness thinner than thickness between said first stub wiring and said first ground metal plate, or between said second stub wiring and said second ground metal plate, the connection part is disposed on said input and output metal strips.

19. A semiconductor integrated circuit comprising:
 a substrate;
 first and second ground metal plates disposed above the substrate, spatially isolated from and facing each other;
 a semiconductor active element sandwiched between said first and second ground metal plates, having first, second and third electrodes;
 an input metal strip configured to transmit a high frequency signal to the third electrode, sandwiched between said first and second ground metal plates;
 an output metal strip configured to receive the high frequency signal from the second electrode, sandwiched between said first and second ground metal plates;
 a dielectric thin film unevenly disposed on said first ground metal plate, said input metal strip, said output metal strip and said second ground metal plate, the dielectric thin film having a thin layer formed on said input and output metal strips so as to form a concave above said input and output metal strips;
 a first stub wiring disposed on said dielectric thin film, connected to the input metal strip; and
 a second stub wiring disposed on said dielectric thin film, connected to the output metal strip,
 wherein a thickness of the dielectric thin film above the input and output metal strips differs from the thickness of the dielectric thin film under the first and second stub wirings.

* * * * *